United States Patent
Parto

(10) Patent No.: US 10,924,011 B2
(45) Date of Patent: Feb. 16, 2021

(54) CHIP EMBEDDED POWER CONVERTERS

(71) Applicant: Faraday Semi, Inc., Irvine, CA (US)

(72) Inventor: Parviz Parto, Laguna Niguel, CA (US)

(73) Assignee: Faraday Semi, Inc., Irvine, CA (US)

( * ) Notice: Subject to any disclaimer, the term of this patent is extended or adjusted under 35 U.S.C. 154(b) by 0 days.

(21) Appl. No.: 16/258,254

(22) Filed: Jan. 25, 2019

(65) Prior Publication Data
US 2019/0229618 A1   Jul. 25, 2019

Related U.S. Application Data

(63) Continuation of application No. 15/669,838, filed on Aug. 4, 2017, now Pat. No. 10,193,442, which is a
(Continued)

(51) Int. Cl.
*H02M 3/156* (2006.01)
*H02M 3/335* (2006.01)
(Continued)

(52) U.S. Cl.
CPC ............ *H02M 3/156* (2013.01); *G05F 1/46* (2013.01); *G06F 1/26* (2013.01); *H01L 29/772* (2013.01);
(Continued)

(58) Field of Classification Search
None
See application file for complete search history.

(56) References Cited

U.S. PATENT DOCUMENTS 3,327,202 A   6/1967   Mills
3,329,887 A   7/1967   Schaeve
(Continued)

FOREIGN PATENT DOCUMENTS

CN   104143547   11/2014
CN   104158392   11/2014
(Continued)

OTHER PUBLICATIONS

Jun. 8, 2018 Int'l Search Report & Written Opinion from related PCT/US2018/017109 (16 pgs).
(Continued)

*Primary Examiner* — Jeffrey A Gblende
(74) *Attorney, Agent, or Firm* — Knobbe, Martens, Olson & Bear, LLP

(57) ABSTRACT

A direct current to direct current (DC-DC) converter can include a chip embedded integrated circuit (IC), one or more switches, and an inductor. The IC can be embedded in a PCB. The IC can include driver, switches, and PWM controller. The IC and/or switches can include eGaN. The inductor can be stacked above the IC and/or switches, reducing an overall footprint. One or more capacitors can also be stacked above the IC and/or switches. Vias can couple the inductor and/or capacitors to the IC (e.g., to the switches). The DC-DC converter can offer better transient performance, have lower ripples, or use fewer capacitors. Parasitic effects that prevent efficient, higher switching speeds are reduced. The inductor size and overall footprint can be reduced. Multiple inductor arrangements can improve performance. Various feedback systems can be used, such as a ripple generator in a constant on or off time modulation circuit.

27 Claims, 35 Drawing Sheets

Related U.S. Application Data continuation-in-part of application No. 15/428,019, filed on Feb. 8, 2017, now Pat. No. 9,729,059.

(60) Provisional application No. 62/293,241, filed on Feb. 9, 2016.

(51) Int. Cl.

| | | |
|---|---|---|
| *G06F 1/26* | (2006.01) | |
| *H01L 29/772* | (2006.01) | |
| *G05F 1/46* | (2006.01) | |
| *H02M 7/00* | (2006.01) | |
| *H02M 3/00* | (2006.01) | |
| *H02M 3/158* | (2006.01) | |

(52) U.S. Cl.
CPC ............ *H02M 3/00* (2013.01); *H02M 3/158* (2013.01); *H02M 3/1584* (2013.01); *H02M 3/33561* (2013.01); *H02M 7/003* (2013.01)

(56) References Cited

U.S. PATENT DOCUMENTS

| | | |
|---|---|---|
| 3,474,289 A | 10/1969 | Stone |
| 3,678,937 A | 7/1972 | Cole et al. |
| 3,795,247 A | 3/1974 | Thaler |
| 3,888,260 A | 6/1975 | Fischell |
| 3,978,838 A | 9/1976 | Oister |
| 4,163,968 A | 8/1979 | Davis |
| 4,412,212 A | 10/1983 | Kolegraff et al. |
| 4,471,283 A | 9/1984 | Presley |
| 5,747,976 A | 5/1998 | Wong |
| 5,773,966 A | 6/1998 | Steigerwald |
| 5,949,264 A | 9/1999 | Lo |
| 6,278,264 B1 | 8/2001 | Burstein et al. |
| 6,342,822 B1 | 1/2002 | So |
| 6,366,070 B1 | 4/2002 | Cooke et al. |
| 6,377,032 B1 | 4/2002 | Andruzzi et al. |
| 6,381,159 B2 | 4/2002 | Oknaian et al. |
| 6,445,233 B1 | 9/2002 | Pinai et al. |
| 6,583,610 B2 | 6/2003 | Groom |
| 6,642,698 B2 | 11/2003 | Pohlman |
| 6,713,995 B2 | 3/2004 | Chen |
| 6,737,843 B2 | 5/2004 | Kanakubo et al. |
| 6,815,936 B2 | 11/2004 | Wiktor et al. |
| RE38,940 E | 1/2006 | Isham et al. |
| 7,002,328 B2 | 2/2006 | Kernahan et al. |
| 7,019,504 B2 | 3/2006 | Pullen et al. |
| 7,026,795 B2 | 4/2006 | So |
| 7,045,992 B1 | 5/2006 | Silva et al. |
| 7,057,380 B2 | 6/2006 | Kuo et al. |
| 7,058,373 B2 | 6/2006 | Grigore |
| 7,102,340 B1 | 9/2006 | Ferguson |
| 7,135,841 B1 | 11/2006 | Tomiyoshi et al. |
| 7,148,442 B2 | 12/2006 | Murai et al. |
| 7,157,889 B2 | 1/2007 | Kernahan |
| 7,173,403 B1 | 2/2007 | Chen et al. |
| 7,180,757 B2 | 2/2007 | Chen et al. |
| 7,196,503 B2 | 3/2007 | Wood et al. |
| 7,205,821 B2 | 4/2007 | Rutter |
| 7,230,405 B2 | 6/2007 | Jang et al. |
| 7,288,924 B2 | 10/2007 | Trandafir et al. |
| 7,298,122 B2 | 11/2007 | Bernacchia et al. |
| 7,342,385 B2 | 3/2008 | Capodivacca et al. |
| 7,372,241 B1 | 5/2008 | Tomiyoshi |
| 7,391,190 B1 | 6/2008 | Rajagopaian |
| 7,436,233 B2 | 10/2008 | Yee et al. |
| 7,439,721 B2 | 10/2008 | Weng et al. |
| 7,446,513 B2 | 11/2008 | Dikken et al. |
| 7,474,086 B2 | 1/2009 | Chen et al. |
| 7,482,791 B2 | 1/2009 | Stoichita et al. |
| 7,482,795 B2 | 1/2009 | Parto et al. |
| 7,508,181 B2 | 3/2009 | Chen et al. |
| 7,554,310 B2 | 6/2009 | Chapuis et al. |
| 7,567,067 B2 | 7/2009 | Lee et al. |
| 7,595,624 B2 | 9/2009 | Tateishi et al. |
| 7,638,987 B2 | 12/2009 | Sugiyama |
| 7,649,346 B2 | 1/2010 | Sohma |
| 7,710,084 B1 | 5/2010 | Guo |
| 7,714,547 B2 | 5/2010 | Fogg et al. |
| 7,764,057 B2 | 7/2010 | Groom |
| 7,777,587 B2 | 8/2010 | Stevenson et al. |
| 7,778,064 B2 | 8/2010 | Parkinson et al. |
| 7,834,606 B2 | 11/2010 | Liu et al. |
| 7,859,324 B2 | 12/2010 | Yamashita et al. |
| 7,868,599 B2 | 1/2011 | Rahman et al. |
| 7,902,803 B2 | 3/2011 | Peng et al. |
| 7,906,942 B2 | 3/2011 | Sugahara et al. |
| 7,919,952 B1 | 4/2011 | Fahrenbruch |
| 7,936,160 B1 | 5/2011 | Sheehan |
| 7,944,153 B2 | 5/2011 | Greenfeld et al. |
| 7,986,135 B2 | 7/2011 | Kenly et al. |
| 8,004,070 B1 | 8/2011 | Chen |
| 8,040,121 B2 | 10/2011 | Ishida et al. |
| 8,054,639 B2 * | 11/2011 | Hsu .................. H05K 1/189 174/254 |
| 8,093,878 B2 | 1/2012 | Katsuya et al. |
| 8,120,345 B2 | 2/2012 | Akiyama et al. |
| 8,148,815 B2 | 4/2012 | Girdhar et al. |
| 8,154,268 B2 | 4/2012 | Philbrick et al. |
| 8,164,320 B2 | 4/2012 | Latham et al. |
| RE43,414 E | 5/2012 | Walters et al. |
| 8,198,880 B2 | 6/2012 | Ouyang |
| 8,248,046 B2 | 8/2012 | Hasegawa |
| 8,253,398 B2 | 8/2012 | Nakamura et al. |
| 8,278,898 B2 | 10/2012 | Davoudi et al. |
| 8,283,905 B2 | 10/2012 | Chang et al. |
| 8,330,435 B2 | 12/2012 | Qiu et al. |
| 8,344,709 B2 | 1/2013 | Zhang et al. |
| 8,400,129 B2 | 3/2013 | Ouyang |
| 8,410,765 B2 | 4/2013 | Hung et al. |
| 8,427,853 B2 | 4/2013 | Uno |
| 8,441,235 B2 | 5/2013 | Shi et al. |
| 8,446,135 B2 | 5/2013 | Chen et al. |
| 8,450,989 B2 | 5/2013 | Wiktor et al. |
| 8,476,882 B2 | 7/2013 | Luo et al. |
| 8,487,599 B2 | 7/2013 | Lee et al. |
| 8,508,206 B2 | 8/2013 | Wan et al. |
| 8,524,532 B1 | 9/2013 | Joshi |
| 8,570,020 B2 | 10/2013 | Tang et al. |
| 8,575,911 B2 | 11/2013 | Cheng et al. |
| 8,582,333 B2 | 11/2013 | Oraw et al. |
| 8,618,779 B2 | 12/2013 | Garrett et al. |
| 8,629,666 B2 | 1/2014 | Carroll et al. |
| 8,659,282 B2 | 2/2014 | Chen |
| 8,676,525 B2 | 3/2014 | Holmberg et al. |
| 8,679,896 B2 | 3/2014 | Joshi et al. |
| 8,698,475 B2 | 4/2014 | Dong et al. |
| 8,717,002 B2 | 5/2014 | Xi |
| 8,749,216 B2 | 6/2014 | Li et al. |
| 8,773,090 B2 | 7/2014 | Ouyang et al. |
| 8,786,267 B2 | 7/2014 | Lu et al. |
| 8,803,495 B2 | 8/2014 | Nguyen et al. |
| 8,810,294 B2 | 8/2014 | Lynch et al. |
| 8,860,387 B2 | 10/2014 | Kobayashi |
| 8,860,396 B2 | 10/2014 | Giuliano |
| 8,890,501 B2 | 11/2014 | Evans et al. |
| 8,901,911 B2 | 12/2014 | Wen et al. |
| 8,912,773 B2 | 12/2014 | Parto et al. |
| 8,941,367 B2 | 1/2015 | Li et al. |
| 8,957,653 B2 | 2/2015 | Yang et al. |
| 8,975,885 B2 | 3/2015 | Philbrick et al. |
| 8,994,346 B2 | 3/2015 | Rahardjo et al. |
| 9,030,177 B2 | 5/2015 | Nakashima |
| 9,035,624 B1 | 5/2015 | Rahimi et al. |
| 9,058,043 B2 | 6/2015 | Lin et al. |
| 9,065,337 B2 | 6/2015 | Tanabe et al. |
| 9,071,125 B2 | 6/2015 | Michishita |
| 9,077,260 B2 | 7/2015 | Zhao et al. |
| 9,088,202 B2 | 7/2015 | Mizutani et al. |
| 9,110,489 B2 | 8/2015 | Svorc |
| 9,190,383 B2 | 11/2015 | Cho et al. |
| 9,214,415 B2 | 12/2015 | Denison et al. |
| 9,231,471 B2 | 1/2016 | Cuk |

(56) References Cited

U.S. PATENT DOCUMENTS

| | | |
|---|---|---|
| 9,252,661 B2 | 2/2016 | Grbo et al. |
| 9,337,735 B2 | 5/2016 | Odaohhara |
| 9,389,625 B2 | 7/2016 | Hu et al. |
| 9,406,674 B2 | 8/2016 | Briere |
| 9,437,570 B2 | 9/2016 | Cho et al. |
| 9,502,980 B2 | 11/2016 | Rahimi et al. |
| 9,563,263 B2 | 2/2017 | Maiyuran et al. |
| 9,575,096 B2 | 2/2017 | Wang et al. |
| 9,577,522 B2 | 2/2017 | Jayawant et al. |
| 9,584,006 B2 | 2/2017 | McDonald et al. |
| 9,588,532 B2 | 3/2017 | Rahimi et al. |
| 9,653,996 B2 | 5/2017 | Parto et al. |
| 9,711,279 B2 | 7/2017 | Dodorov et al. |
| 9,729,059 B1 | 8/2017 | Parto |
| 9,767,947 B1 | 9/2017 | Ikriannikov |
| 10,193,442 B2 | 1/2019 | Parto |
| 10,234,930 B2 | 3/2019 | Lee et al. |
| 10,504,848 B1 | 12/2019 | Parto |
| 2005/0245001 A1 | 11/2005 | Hyvonen et al. |
| 2005/0280404 A1 | 12/2005 | LeFevre et al. |
| 2006/0220629 A1 | 10/2006 | Saito et al. |
| 2008/0067666 A1 | 3/2008 | Hsu |
| 2008/0273314 A1* | 11/2008 | Cho ............ H01L 21/568 361/764 |
| 2010/0001699 A1 | 1/2010 | Dragojevic |
| 2010/0033261 A1 | 2/2010 | Stevenson et al. |
| 2010/0134985 A1 | 6/2010 | Hsu |
| 2011/0058285 A1* | 3/2011 | Wibben ............ H02M 1/32 361/18 |
| 2011/0227546 A1 | 9/2011 | Nishijima et al. |
| 2012/0049826 A1 | 3/2012 | Hsu et al. |
| 2012/0187928 A1 | 7/2012 | Parto et al. |
| 2012/0274296 A1 | 11/2012 | Higuchi et al. |
| 2012/0302012 A1 | 11/2012 | Zeng |
| 2013/0074907 A1* | 3/2013 | Saunders ............ H01L 27/142 136/249 |
| 2013/0249508 A1 | 9/2013 | Rahimi et al. |
| 2014/0084884 A1 | 3/2014 | Lee |
| 2014/0159689 A1 | 6/2014 | Chen |
| 2015/0062989 A1* | 3/2015 | Su ............ H05K 1/0373 363/123 |
| 2015/0077074 A1 | 3/2015 | Rahimi et al. |
| 2015/0115911 A1 | 4/2015 | Parto et al. |
| 2015/0116972 A1 | 4/2015 | Dodorov et al. |
| 2015/0162297 A1 | 6/2015 | Cho et al. |
| 2015/0180355 A1* | 6/2015 | Freeman ............ H02M 1/08 363/21.04 |
| 2016/0118325 A1 | 4/2016 | Wang et al. |
| 2016/0218559 A1* | 7/2016 | Mehas ............ H02J 50/60 |
| 2016/0261182 A1 | 9/2016 | Jayawant et al. |
| 2017/0231094 A1 | 8/2017 | Blackshear et al. |
| 2018/0204665 A1 | 7/2018 | Peng et al. |

FOREIGN PATENT DOCUMENTS

| | | |
|---|---|---|
| JP | 2006-223088 | 8/2006 |
| JP | 2008-235773 | 10/2008 |
| JP | 4427667 | 3/2010 |
| JP | 5433880 | 3/2014 |
| JP | 5474488 | 4/2014 |
| WO | WO 2008/013871 | 1/2008 |
| WO | WO 2010/139358 | 12/2010 |
| WO | WO 2018/148218 | 8/2018 |

OTHER PUBLICATIONS

TPS54A20 8-V to 14-V Input, 10-A, up to 10-MHz Swift™ Step Down Converter, Texas Instruments, data sheet, Apr. 2016 (43 pgs).

Enhancement-Mode Gallium Nitride Technology, Efficient Power Conversion, product brief, 2016 (5 pgs).

TPS8268x 1600-mA High Efficiency MicroSIP™ Step-Down Converter Module, Texas Instruments, data sheet, Oct. 2014 (32 pgs).

Bryson, "Using auto-zero comparator techniques to improve PWM performance" (Part 1 of 2) Jun. 23, 2008, www.eetimes.com (4 pgs).

Bryson, "Using auto-zero comparator techniques to improve PWM performance" (Part 2 of 2) Jun. 23, 2008, www.eetimes.com (4 pgs).

Nakanishi, "A two-stage converter with a coupled-inductor," Power Elec & Drive Sys, PEDS (2007) $7^{th}$ Int'l Conf of IEEE, pp. 653-657.

Burton, Intel Corp. APEC 2015, Package and Platform View of Inters Fully Integrated Voltage Regulators (FIVR) (23 pgs).

Intel, Dual Intel, Xeon, Processor Voltage Regulator Down (VRD) Design Guidelines, Jul. 2003, 22 pages.

Intel, Voltage Regulator-Down (VRD) 11.0, Processor Power Delivery Design Guidelines For Desktop LGA775 Socket, Nov. 2006 (88 pgs).

"Bootstrap Circuit in the Buck Converter," ROHM Semiconductor, Switching Regulartor IC Series, dated Nov. 2018, in 5 pages.

Aug. 13, 2019, International Preliminary Report on Patentability from PCT/US2018/017109 (13 pgs).

Sep. 15, 2020, International Search Report and Written Opinion from PCT/US2020/028585 (12 pgs.).

* cited by examiner

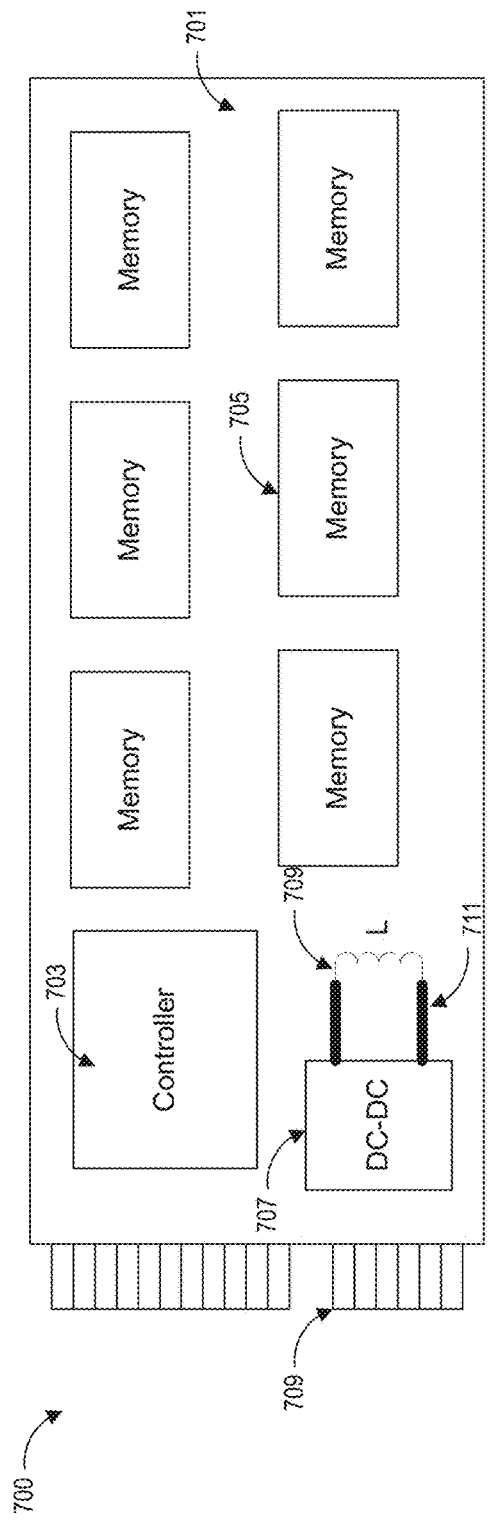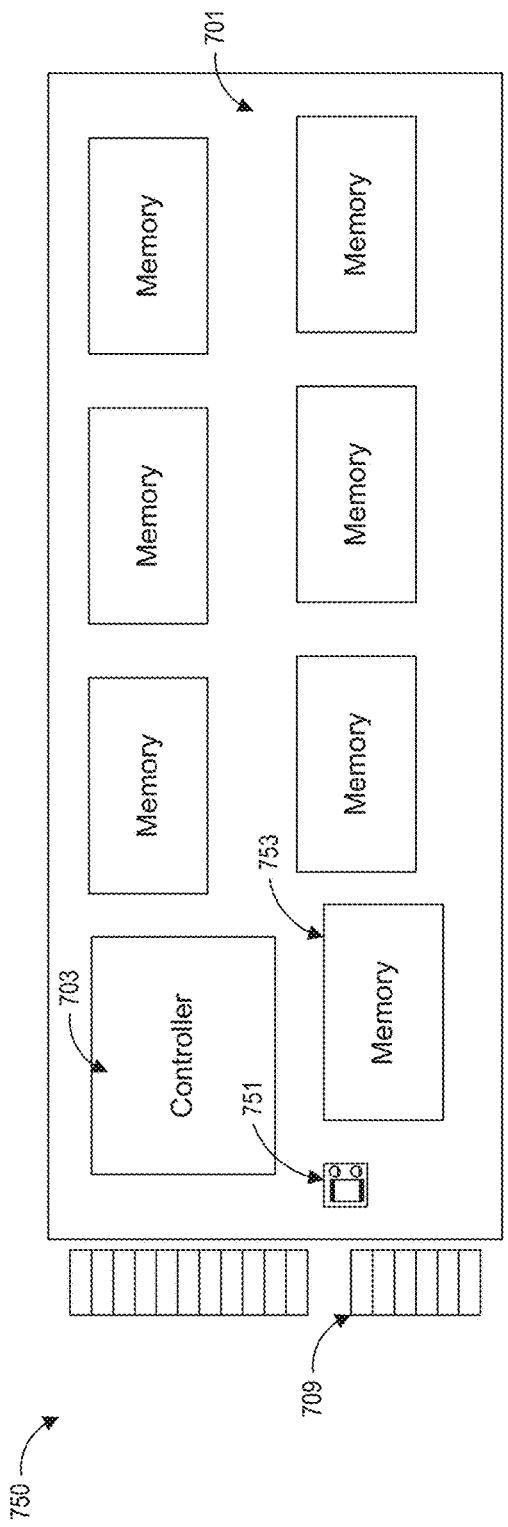

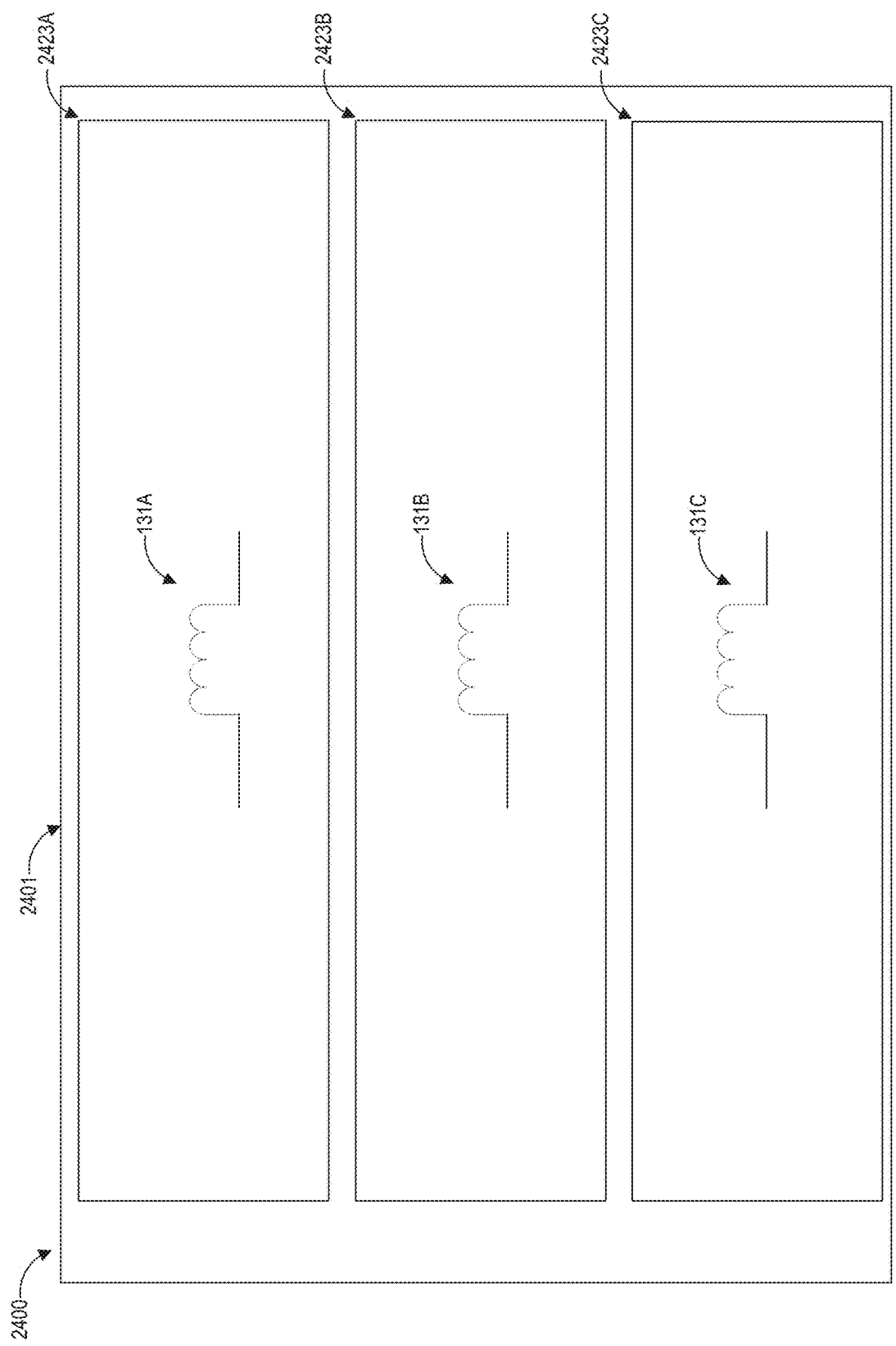

CHIP EMBEDDED POWER CONVERTERS

CROSS REFERENCE TO RELATED APPLICATIONS

Any and all applications for which a foreign or domestic priority claim is identified in the Application Data Sheet as filed with the present application are hereby incorporated by reference under 37 C.F.R. § 1.57 in their entirety for all purposes. This application is a continuation of U.S. application Ser. No. 15/669,838 filed on Aug. 4, 2017 titled "CHIP EMBEDDED POWER CONVERTERS", which is a continuation-in-part of U.S. patent application Ser. No. 15/428,019, filed on Feb. 8, 2017 (issued on Aug. 8, 2017 as U.S. Pat. No. 9,729,059) titled "CHIP EMBEDDED DC-DC CONVERTER," which claims the benefit of U.S. Provisional Patent Application No. 62/293,241, filed Feb. 9, 2016. The entireties of these applications are hereby incorporated by reference for all purposes.

BACKGROUND

Field

This disclosure relates to electronic systems, direct current to direct current (DC-DC) converters, electronic device design, and electronic device production technology.

Description of the Related Art

Although various DC-DC converters are known, these DC-DC converters are made of non-ideal components and/or arrangements that suffer from parasitic losses and inefficiencies. There exists a need for improved power converters.

SUMMARY

Some embodiments are disclosed for a direct current to direct current (DC-DC) power converter, comprising: a lower printed circuit board (PCB) part having a bottom side and a top side; an upper printed circuit board (PCB) part having a bottom side and a top side; embedded circuitry that is between the top side of the lower PCB part and the bottom side of the upper PCB part, the embedded circuitry comprising: a pulse width modulator; and at least one switch; one or more vias extending through the upper PCB part; an inductor positioned over the top side of the upper PCB part, wherein the one or more vias are electrically coupled to the inductor and to the embedded circuitry. The embodiments can feature any combination of: wherein the embedded circuitry includes an integrated circuit (IC); wherein a footprint of the inductor at least partially overlaps a footprint of the integrated circuit; wherein no wire-bonds electrically interconnect the inductor and the embedded circuitry; wherein the circuitry has a switching rate of at least 1 MHz; wherein the circuitry has a switching rate of at least 3 MHz; wherein the circuitry has a switching rate of at least 5 MHz; wherein the circuitry has a switching rate of up to 7 MHz; wherein the at least one switch comprises an enhanced gallium nitride field effect transistor (eGaN FET); further comprising one or more capacitors disposed over the top side of the upper PCB part; further comprising a core disposed between the top side of the lower PCB part and the bottom side of the upper PCB part, wherein the core has one or more pockets formed therein, and wherein the embedded circuitry is disposed in the one or more pockets; wherein the DC-DC power converter has a footprint that is smaller than 25 $mm^2$; wherein the DC-DC power converter has a footprint that is smaller than 10 $mm^2$; wherein the DC-DC power converter has a footprint that is smaller than 5 $mm^2$; wherein the DC-DC power converter has a footprint that is as small as 2 $mm^2$; wherein the DC-DC power converter has a footprint area that is between 0.5 and 10 $mm^2$ per amperage of current.

Some embodiments are disclosed for a direct current to direct current (DC-DC) power converter package comprising: an integrated circuit (IC) chip embedded in at least one printed circuit board (PCB), the IC chip comprising a driver; an inductor positioned outside of the chip embedded package and coupled to a surface of the chip embedded package; and a via electrically coupling the inductor to the IC chip; wherein a footprint of the inductor overlaps, at least partially, with a footprint of the IC chip. The embodiments can feature any of: wherein a transistor is embedded in the at least one PCB, and wherein the inductor is electrically coupled to the transistor; wherein the IC chip comprises: a pulse width modulator (PWM) controller coupled to the driver, and a switching transistor coupled to an output of the driver; further comprising a switch comprising enhanced gallium nitride (eGaN); wherein the switch is configured to switch at 4 MHz or faster; wherein the switch is configured to switch at 5 MHz or faster; further comprising a switch comprising at least one of silicon or gallium arsenide.

Some embodiments are disclosed for a direct current to direct current (DC-DC) power converter in a single package comprising: an enhanced gallium nitride (eGaN) component embedded, at least partially, inside of a mounting substrate; an inductor mounted outside of the mounting substrate; and a via coupling the inductor to the eGaN component; wherein a footprint of the inductor overlaps, at least partially, with a footprint of the eGaN component. The embodiments can feature any combination of: wherein the mounting substrate is a multi-layer PCB; wherein the eGaN component is a switch comprising eGaN, the DC-DC power converter further comprising a driver circuit configured to drive the switch; wherein the driver and the switch are part of an IC chip; wherein the IC chip further comprises a pulse width modulator (PWM) controller.

Some embodiments are disclosed for a direct current to direct current (DC-DC) power converter utilizing a chip embedded package, the DC-DC converter comprising: an enhanced gallium nitride (eGaN) switch inside of a printed circuit board (PCB); a pulse width modulator (PWM) controller; a driver embedded inside of the PCB, wherein the PWM controller and the driver are configured to drive the eGaN switch at a frequency of 1 MHz or higher; an inductor positioned outside of the chip embedded package and coupled to a surface of the PCB; and a via electrically coupling the inductor to the eGaN switch. The embodiments can feature wherein the driver is configured to drive the eGaN switch at a frequency of 5 MHz or higher.

Some embodiments are disclosed for a direct current to direct current (DC-DC) power converter comprising: a printed circuit board; and an integrated circuit inside of the printed circuit board, the integrated circuit comprising a driver. The embodiments can feature any combination of: further comprising an inductor electrically coupled to the integrated circuit by one or more vias that extend through the printed circuit board; wherein the inductor has a footprint that at least partially overlaps a footprint of the integrated circuit.

Some embodiments are disclosed for a direct current to direct current (DC-DC) power converter comprising: an integrated circuit comprising a driver; and an inductor vertically stacked above the integrated circuit such that a footprint of the inductor overlaps, at least partially, with a footprint of the integrated circuit, wherein the inductor is electrically coupled to the integrated circuit. The embodiments can feature any combination of: further comprising a printed circuit board (PCB) having a first side and a second side that is opposite the first side, wherein the integrated circuit is mounted on the first side of the PCB, and wherein the inductor is mounted on the second side of the PCB; wherein the inductor is electrically coupled to the integrated circuit by one or more vias that extend through the printed circuit board.

Some embodiments are disclosed for a direct current to direct current (DC-DC) buck converter comprising: one or more switches; a driver configured to drive the one or more switches; and an inductor electrically coupled to the switches; wherein the footprint of the DC-DC buck converter is less than 65 $mm^2$; wherein the DC-DC buck converter is configured to receive at least 20 amps of current; and wherein the DC-DC buck converter is configured to output at least 20 amps of current.

Some embodiments are disclosed for a direct current to direct current (DC-DC) power converter comprising: one or more switches; a driver configured to drive the one or more switches at a frequency, the frequency being between 1 and 5 MHz inclusive; and an inductor electrically coupled to the one or more switches; wherein the footprint of the DC-DC converter is less than or equal to 10 $mm^2$; wherein the DC-DC converter is configured to receive at least 5 amps of current; wherein the DC-DC converter is configured to output at least 5 amps of current.

Some embodiments are disclosed for a direct current to direct current (DC-DC) power converter comprising: a first switch coupled to a first inductor; a second switch coupled to a second inductor; and an integrated circuit chip embedded in a printed circuit board; wherein the first switch and the second switch are coupled to a modulator; and wherein the first inductor and the second inductor are coupled to a voltage output node. The embodiments can feature any combination of: wherein the modulator is included in the integrated circuit chip; wherein the modulator is configured to cause the first switch and the second switch to operate output of phase with a synchronous period; wherein an output signal at the output node is a superposition of a first signal through the first inductor and a second signal through the second inductor.

Some embodiments are disclosed for a direct current to direct current (DC-DC) power converter comprising: an integrated circuit chip embedded in a printed circuit board, the integrated circuit chip comprising a driver; a first switch coupled to the driver; an inductor coupled to the first switch; and a feedback path from an output node to a modulator circuit. The embodiments can feature any combination of: wherein the modulator circuit is a voltage mode modulator circuit: wherein the modulator circuit is a constant on time or constant off time modulator circuit: wherein the modulator circuit is included in the integrated circuit chip: wherein the modulator circuit and the inductor are included in a package with the integrated circuit chip.

Some embodiments are disclosed for a direct current to direct current (DC-DC) power converter comprising: an integrated circuit chip embedded in a printed circuit board, the integrated circuit chip comprising a driver; a first switch coupled to the driver; an inductor coupled to the first switch; a feedback path from an output node to a modulator circuit; and a ramp generator. The embodiments can feature any combination of: wherein the feedback path and an output from the ramp generator are coupled to a comparator; further comprising a reference voltage source coupled to the comparator; wherein the ramp generator is configured to emulate a ripple current through the inductor; wherein the ramp generator comprises; a first current source, a second current source, and a capacitor; wherein the first current source and the second current source are configured to be trimmed based, at least in part, on an inductance of the inductor; wherein the ramp generator and the inductor are included in the same DC-DC power converter package; wherein the ramp generator is configured to generate an output signal that is unaffected by an output capacitor coupled to the inductor; wherein the ramp generator is configured to generate an output signal that is independent from the equivalent series resistance (ESR) of an output capacitor coupled to the inductor; further comprising an output capacitor having a sufficiently low ESR such that a ripple voltage across the output capacitor is too small to reliably provide to a modulation circuit.

Some embodiments are disclosed for a ramp generator comprising: a first current source coupled to a supply voltage; a second current source coupled to ground; and a capacitor coupled between the first current source and the second current source. The embodiments can feature any combination of: wherein the ramp generator is configured to emulate a ripple current through an inductor in a DC-DC converter; wherein the output of the first current source is based, at least in part, on an input voltage to a DC-DC converter; wherein the output of the first current source is based, at least in part, on an inductance of an inductor in a DC-DC converter; wherein the output of the second current source is based, at least in part, on an inductance of an inductor in a DC-DC converter; wherein the output of the second current source is based, at least in part, on an inductance of an inductor in a DC-DC converter; wherein the first current source is configured to be trimmed based, at least in part, on an inductance of an inductor in a DC-DC converter; wherein the second current source is configured to be trimmed based, at least in part, on an inductance of an inductor in a DC-DC converter.

Some embodiments are disclosed for a method for making a chip embedded direct current to direct current converter comprising: embedding an integrated circuit chip in a printed circuit board; coupling a first inductor to the printed circuit board; and coupling a second inductor to the printed circuit board, the first inductor and the second inductor both coupled to an output node.

Some embodiments are disclosed for a method for converting first direct current voltage to a second direct current voltage comprising: driving a first switch coupled to a first inductor; driving a second switch coupled to a second inductor, wherein the first switch and the second switch are coupled to an output node; and modulating the driving of the first switch and the second switch out of phase; wherein at least one of a driver or a modulator is included in a chip embedded in a printed circuit board.

Some embodiments are disclosed for a method for making a chip embedded direct current to direct current converter comprising: embedding an integrated circuit chip in a printed circuit board; coupling an inductor between the integrated circuit chip and an output node; and providing a feedback path from the output node to a modulator circuit, wherein the modulator circuit includes a ramp generator. The embodiments can feature any combination of: wherein the modulator circuit is included in the printed circuit board; wherein the modulator circuit is a constant on time or constant off time modulator circuit; wherein the ramp generator is included in the integrated circuit; further comprising trimming the ramp generator based at least in part on the property of the inductor; wherein the ramp generator is the ramp generator of any previous embodiment.

Some embodiments are disclosed for a method for using a direct current to direct current converter comprising: receiving input power at an input node; providing power through a switch to an inductor; storing energy in an output capacitor such that an output voltage forms across the output capacitor; providing output power at the output voltage to an output node; providing the output voltage to a modulator circuit; generating a ripple voltage that is independent of an output capacitor; providing the ripple voltage to the modulator circuit; modulating the switch based at least in part on an output of the modulator circuit. The embodiments can feature any combination of: further comprising comparing at least two of: the ripple voltage, a reference voltage, and the output voltage; further comprising trimming a current source based at least in part on an inductance of the inductor; wherein the ripple voltage is generated by a ramp generator configured to emulate a current through the inductor.

Some embodiments are disclosed for a direct current to direct current (DC-DC) power converter package comprising: an integrated circuit (IC) chip embedded in at least one printed circuit board (PCB), the IC chip comprising a driver; an inductor positioned outside of the chip embedded package and coupled to a surface of the chip embedded package; and an overcurrent protection circuit configured to detect when a current provided to the inductor exceeds a limit. The embodiments can feature any combination of: the overcurrent protection circuit comprises a current source configured to be adjusted or trimmed based at least in part on an Inter-Integrated Circuit or Power Management Bus command; a saturation inductance of the inductor exceeds the limit and exceeds the limit by less than 50%; the limit exceeds a maximum specified DC current specification plus maximum alternating current ripple specification by less than 50%.

Some embodiments disclosed herein can relate to a direct current to direct current (DC-DC) power converter package comprising: an integrated circuit (IC) chip embedded in at least one printed circuit board (PCB), the IC chip comprising a driver; an inductor positioned outside of the chip embedded package and coupled to a surface of the chip embedded package; and an Inter-Integrated Circuit or Power Management Bus. The embodiments can have any combination of: wherein the Inter-Integrated Circuit or Power Management Bus is coupled to at least one current source and configured to provide a protocol command to adjust or trim the current source; wherein the Inter-Integrated Circuit or Power Management Bus is coupled to at least one current source and configured to provide a protocol command to set or adjust a reference value provided to a comparator; wherein the Inter-Integrated Circuit or Power Management Bus is configured to communicate protocols comprising instructions to perform at least one of: turn on or off the DC-DC power converter package, change a low power or sleep mode of the DC-DC power converter package, read out information about current settings of the DC-DC power converter package, read out diagnostic and/or technical information about the DC-DC power converter package, set or change an output voltage provided by the DC-DC power converter package; wherein a Power Management Protocol is implemented as an interconnect layer on top of an Inter-Integrated Circuit implementation.

Some embodiments disclosed herein feature a power converter comprising: a printed circuit board (PCB) (the printed circuit board comprising: a lower printed circuit board (PCB) part having a bottom side and a top side; and an upper printed circuit board (PCB) part having a bottom side and a top side); embedded circuitry that is between the top side of the lower PCB part and the bottom side of the upper PCB part (the embedded circuitry comprising: a driver configured to generate one or more driver signals; and one or more switches configured to be driven by the one or more driver signals), one or more vias extending through the upper PCB part, and an inductor positioned over the top side of the upper PCB part, wherein the one or more vias are electrically coupled to the inductor and to the embedded circuitry, and a footprint of the inductor at least partially overlaps a footprint of the embedded circuitry. The embodiments can have any combination of: wherein the power converter is configured with an isolated topology configured to isolate a direct electrical connection between an input and an output of the power converter; wherein the isolation topology includes at least one of: a flyback topology, forward converter topology, two transistor forward, LLC resonant converter, push-pull topology, full bridge, hybrid, PWM-resonant converter, and half bridge topology; further comprising a transformer that includes a first inductor and a second inductor configured such that a changing current through the first inductor induces a changing current in the second inductor; further comprising a wireless communication system in a same package as the embedded circuitry; wherein an output of the power converter is configured to be adjusted in response to a wireless signal received by the wireless communication system; further comprising a feedback system comprising a ramp generator that is configured to generate a signal that emulates a current ripple through the inductor, and wherein the feedback system includes a current source that is configured to be trimmed or adjusted in response to a wireless signal received by the wireless communication system; wherein the embedded circuitry comprises the wireless communication system; further comprising a communication interface configured to receive a control signal for adjusting an output of the power converter; wherein the communication interface includes a Power Management Bus (PMBUS); wherein the communication interface is configured to implement an inter-integrated circuit (I2C) protocol; further comprising a feedback system comprising a ramp generator that is configured to generate a signal that emulates a current ripple through the inductor, and wherein the feedback system is configured to trim the ramp generator in response to a command received over the communication interface; wherein the embedded circuitry comprises a pulse width modulator (PWM) controller configured to generate one or more PWM signals, wherein the PWM controller is coupled to the driver, and wherein the driver is configured to generate the one or more driver signals based at least in part on the PWM signals; wherein the inductor has a current rating and the inductor has a saturation rating, and wherein the saturation rating is no more than 50% higher than the current rating; wherein the inductor has a current rating and the inductor has a saturation rating, and wherein the saturation rating is no more than 20% higher than the current rating; further comprising an overcurrent protection circuit configured to prevent a current through the inductor from exceeding the saturation rating; further comprising an overcurrent protection circuit configured to cause at least one of the one or more switches to open in response to detecting an overcurrent condition; wherein the power converter is a direct current to direct current (DC-DC) power converter; wherein the power converter is a alternating current to direct current (AC-DC) power converter; further comprising a feedback system, the feedback system comprising a current source, wherein the current source is configured to be trimmed or adjusted based at least in part in response to a wireless signal received by the wireless communication system; further comprising an overcurrent protection system configured to provide an indication of a current through the inductor, the overcurrent system comprising a current source, wherein the current source is configured to be trimmed or adjusted based at least in part in response to a wireless signal received by the wireless communication system.

Some embodiments disclosed herein feature an article comprising: the power converter of the above paragraph, a first system configured to perform a physical action using electrical power; and an electrical system configured to control the first system; wherein the power converter is configured to provide electrical power to one or both of the first system and the electrical system, and wherein the electrical system is configured to control the first system based at least in part on a wireless signal received by the wireless communication system that is in the same package as the embedded circuitry of the power converter. In some embodiments, the article is an internet of things device. Some embodiments feature a power supply system comprising: a plurality of power converters, wherein each of the plurality of power converters is according to the power converter of the above paragraph; and a shared pulse width modulator (PWM) controller configured to generate a plurality of PWM signals, wherein the PWM controller is coupled to the drivers of the plurality of power converters to deliver the plurality of PWM signals to the corresponding drivers of the power converters, and wherein the drivers are configured to generate the one or more driver signals based at least in part on the PWM signals. Some embodiments feature a power supply system comprising: a first power converter according to the power converter of Claim 1; and a second power converter coupled in parallel with the first power converter. The power supply system can feature a control system configured to adjust an output of the first power converter and an output of the second power converter for current balancing.

Some embodiments disclosed herein feature a power converter comprising: a printed circuit board (PCB) comprising a lower printed circuit board (PCB) part having a bottom side and a top side and an upper printed circuit board (PCB) part having a bottom side and a top side; an input port configured to receive an input voltage; an output port configured to provide an output voltage that is different than the input voltage; embedded circuitry that is between the top side of the lower PCB part and the bottom side of the upper PCB part, the embedded circuitry coupled to the input port and configured to change the input voltage; a via extending through the upper PCB part; and an inductor or capacitor positioned over the top side of the upper PCB part, wherein the one or more vias are electrically coupled to the inductor or capacitor and to the embedded circuitry, and wherein a footprint of the inductor or capacitor at least partially overlaps a footprint of the embedded circuitry. The embodiments can have any combination of: wherein the inductor is positioned over the top side of the upper PCB part, wherein the one or more vias are electrically coupled to the inductor and to the embedded circuitry, wherein a footprint of the inductor at least partially overlaps a footprint of the embedded circuitry, and wherein the embedded circuitry comprises: a driver configured to generate one or more driver signals and one or more switches configured to be driven by the one or more driver signals; wherein the power converter is a direct current to direct current (DC-DC) converter; wherein the power converter is an alternating current to direct current (AC-DC) converter; further comprising a transformer that includes a first inductor and a second inductor configured such that a changing current through the first inductor induces a changing current in the second inductor; wherein the embedded circuitry comprises rectifier circuitry configured to change an alternating current (AC) input voltage into a pulsed DC voltage; comprising smoothing circuitry configured to smooth the pulsed DC voltage to a more stable DC voltage, wherein the smoothing circuitry comprises the inductor or capacitor positioned over the top side of the upper PCB part; wherein the rectifier circuitry comprises one or more switches; wherein the rectifier circuitry comprises a diode bridge.

Some embodiments disclosed herein feature a direct current to direct current (DC-DC) power converter comprising: a lower printed circuit board (PCB) part having a bottom side and a top side; an upper printed circuit board (PCB) part having a bottom side and a top side; embedded circuitry that is between the top side of the lower PCB part and the bottom side of the upper PCB part, the embedded circuitry comprising: a pulse width modulator (PWM) controller configured to generate a PWM signal, a driver configured to receive the PWM signal and to generate one or more driver signals, a first switch configured to be driven by at least one of the one or more driver signals, and a second switch configured to be driven by at least one of the one or more driver signals; one or more vias extending through the upper PCB part; an inductor positioned over the top side of the upper PCB part, wherein the one or more vias are electrically coupled to the inductor and to the embedded circuitry, and wherein a footprint of the inductor at least partially overlaps a footprint of the embedded circuitry; and a wireless communication system in a same package as the embedded circuitry, wherein the wireless communication is configured to provide a signal to at least one of the PWM controller or the first switch to affect an output of the DC-DC converter.

Some embodiments disclosed herein feature a direct current to direct current (DC-DC) power comprising: an integrated circuit positioned inside of a printed circuit board (PCB), the integrated circuit comprising: a first gallium nitride (GaN) switch configured to be driven by a first signal from a driver; and a second GaN switch configured to be driven by a second signal from the driver; an inductor positioned above the integrated circuit such that the inductor has a footprint that overlaps, at least partially, with a footprint of the integrated circuit; and a via electrically coupling the inductor to the GaN switch. Some embodiments can include: wherein the first GaN switch is an first enhanced gallium nitride (eGaN) switch, and the second GaN switch is a second eGaN switch.

BRIEF DESCRIPTION OF THE DRAWINGS

FIG. 7A shows an example of a DC-DC converter used in a memory device.

FIG. 7B shows an example of a chip embedded DC-DC converter used in a memory device.

FIG. 24B shows an example layout of inductors in a DC-DC converter.

DETAILED DESCRIPTION

Introduction

Figure 1:
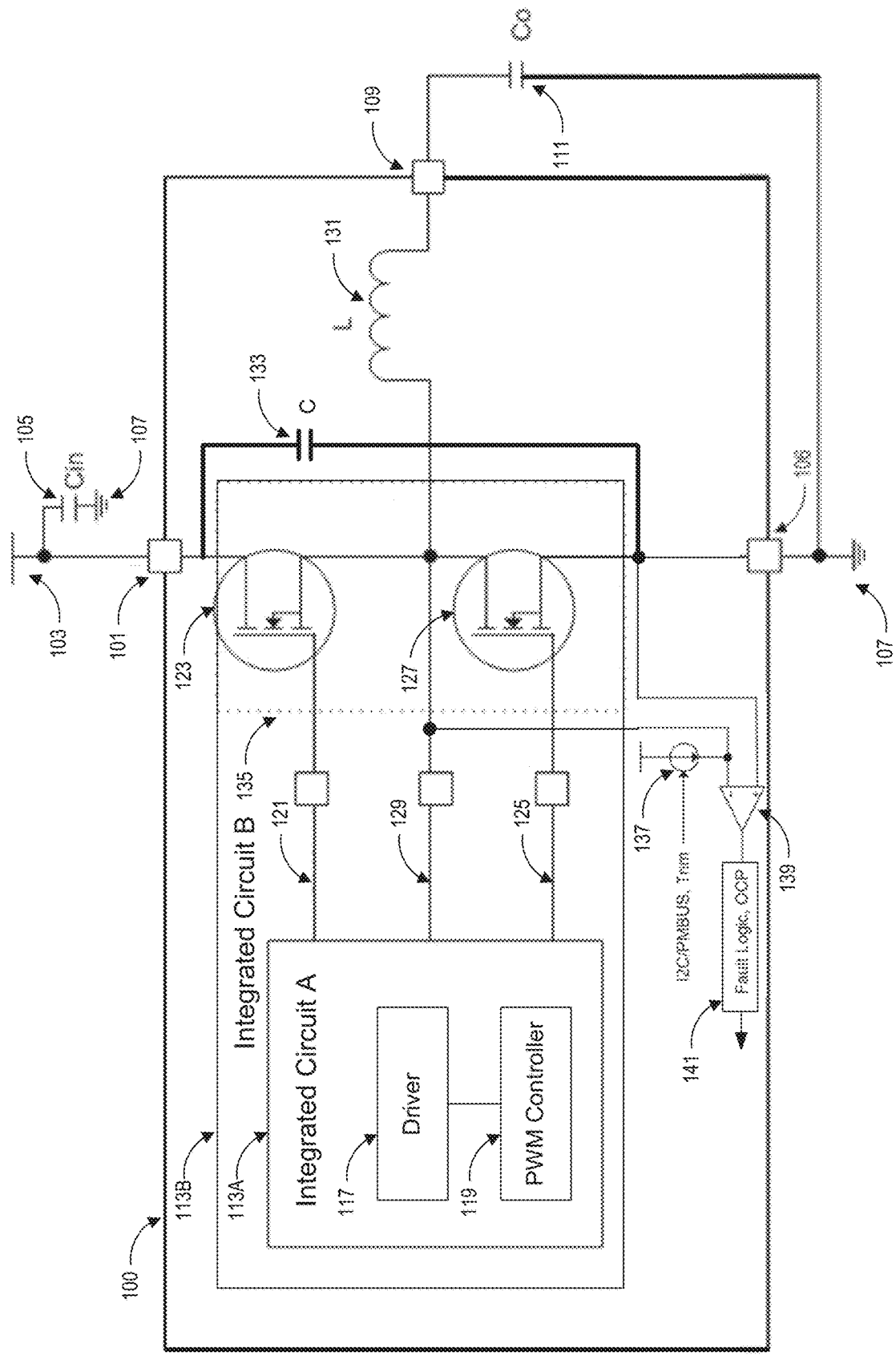
FIG. 1 shows an example circuit level schematic of a chip embedded DC-DC converter package.

Direct current (DC) to direct current (DC-DC) converters are a type of electronic circuit. DC-DC converters can receive input power at a first voltage and can provide output power at a second voltage. Examples of DC-DC converters include boost converters (which can have a higher output voltage than the input voltage), buck converters (which can have a lower output voltage than the input voltage), buck-boost converters, and various other topologies.

Some DC-DC converters are affected by non-ideal component characteristics. These can include parasitic inductances, parasitic capacitances, and/or parasitic resistances caused by components such as wire bonds and leadframe packages such as quad flat no-lead (QFN) packages, power quad flat no-lead (PQFN) packages, dual flat no-lead (DFN) packages, micro lead-frame (MLF) packages, etc. Furthermore, interconnections between internal components of the DC-DC converter, such as from a driver to switches, can also contribute to parasitic effects. These parasitic effects can limit the switching speed and/or efficiency of DC-DC converters. The package can refer to the DC-DC converter level package. The package can encapsulate one or more IC's included in the DC-DC converter. The package can provide support and protection for components in the DC-DC converter, and the package can provide electrical contacts for connecting to the DC-DC converter. In various embodiments, the package may include one or more inductors and/or capacitors within the package and/or coupled to the package from the outside.

This disclosure includes examples of highly integrated solutions where the DC-DC converter can switch more efficiently, switch at higher frequencies, and/or offer improved performance with a reduced package footprint. An integrated circuit chip that integrates many DC-DC components such as a pulse-width modulator controller, a driver, and/or one or more enhanced gallium arsenide switches (also known as enhancement mode gallium arsenide switches and eGaN FETs) can be included in a package. The integrated circuit can be embedded in a printed circuit board, or embedded between printed circuit boards. The package can include an inductor and/or capacitor in a vertical design to reduce the package footprint. Certain features can reduce the parasitic effects that would otherwise prevent achieving higher switching speeds and/or higher efficiency. By efficiently achieving higher switching speeds, the inductor size can then be reduced. The DC-DC converter can operate at higher frequencies, offer better transient performance, have lower ripples, use fewer capacitors, and/or reduce the overall footprint.

For purposes of providing an introduction, certain aspects, advantages, and novel features have been introduced. It is to be understood that not necessarily all such aspects, advantages, and novel features of the introduction are achieved in accordance with any particular embodiment. Thus, one or more aspects, advantages, and novel features may be achieved without necessarily achieving the other aspects, advantages, and novel features disclosed herein. It is also to be understood that not all aspects, advantages, and novel features have been disclosed in the introduction.

Example Schematic Diagram

FIG. 1 shows an example circuit level schematic of a chip embedded DC-DC converter package 100. The schematic shows a power input port 101, a power source 103, an input capacitor 105, a ground port 106, ground 107, a voltage output port 109, an output capacitor 111, an integrated circuit (IC) chip 113A, an alternative IC 113B, a driver 117, a pulse width modulator (PWM) controller 119, a first electric pathway 121, a first switch (e.g., a first enhanced gallium nitride (eGaN) switch) 123, a second electric pathway 125, a second switch (e.g., a second eGaN switch) 127, a third electric pathway 129, an inductor 131, and an AC bypass capacitor 133. A dotted line 135 indicates an alternative, separate packaging of the switches 123, 127. The switches 123, 127 can also be referred to as power switches, switching FETs, and/or switching transistors. The schematic also shows a current source 137, a comparator 139, and fault logic and/or over current protection circuitry 141.

The chip embedded DC-DC converter package 100 can be coupled through the power input port 101 to the power source 103 and also coupled through the input capacitor 105 to ground 107. The chip embedded DC-DC converter package 100 can also include a voltage output port 109 that can be coupled through the output capacitor 111 to ground 107. The chip embedded DC-DC converter package 100 can also include the ground reference port 106 that is coupled to ground 107.

The chip embedded DC-DC converter package 100 can have a printed circuit board (PCB) that includes an embedded integrated circuit (IC) chip 113A or 113B. The IC can include a driver 117 and/or a pulse width modulator (PWM) controller 119. By way of example, the first electric pathway 121 couples the IC to the gate of a first eGaN switch 123. The second electric pathway 125 couples the IC to the gate of the second eGaN switch 127. The third electric pathway 129 couples the IC to a source of the first eGaN switch 123, a drain of the second eGaN switch 127, and to the inductor 131. The inductor 131 can be coupled to the voltage output port 109. An AC bypass capacitor 133 can be coupled from the drain of the first eGaN switch 123 to the source of the second eGaN switch 127 to short AC signals to ground 107.

Although FIG. 1 shows the driver 117 and the PWM controller 119 as part of the IC 113A, in various embodiments, the IC can include one of the PWM controller 119 or the driver 117 while the other of the PWM controller 119 and the driver 117 is separately coupled to the IC 113A. In some embodiments, one of the eGaN switches 123, 127 or the pair of eGaN switches 123, 127 can be integrated into the IC 113A along with the respective electric pathways 121, 125, and/or 129. The IC 113A can be a semiconductor. The IC 113A can be a silicon, gallium arsenide, gallium nitride, eGaN, or other III-V material based semiconductor. Accordingly, any integrated components, can also be made of a material the same as or similar to the IC 113A. The switches 123, 127, electric pathways 121, 129, 125, driver, 117, and PWM controller 119 can also be made of the same or similar material as the IC 113A.

The pair of switches 123, 127 can be monolithic eGaN field effect transistors (FETs). In some embodiments, the pair of switches 123, 127 can be separate devices, including two standalone eGaN FETs. In some embodiments, the switches 123, 127 are metal oxide field effect transistors (MOSFETs). Various other numbers or types of switches can be used in various other embodiments. Although many embodiments describe the switches 123, 127 as eGaN switches, other suitable materials can be used instead of or in addition to eGaN.

In some embodiments, the electric pathways 121, 129, 125 can be implemented with vias such as copper pillars, traces, and/or other electric pathways with low parasitic effects (e.g., low parasitic inductance, low parasitic resistance, and/or low parasitic capacitance). Wire bonds can have higher parasitic effects (e.g., higher parasitic inductance, higher parasitic resistance, and/or higher parasitic capacitance).

The ports, including power input port 101, ground port 106, and voltage output port 109, can be implemented as pads, pins, or other electric conductor with low parasitic effects (e.g., low parasitic inductance, low parasitic resistance, and/or low parasitic capacitance). The ports can be designed to couple to traces on another device such as a motherboard, PCB, etc.

Many variations are possible. In some embodiments, bypass capacitor 133 can be omitted. Some embodiments can feature different inductors, capacitors, magnets, and/or resonant arrangements. The various components shown in the example schematic of FIG. 1 form a DC-DC converter, but DC-DC converters can have other variations. It will be appreciated that the teachings disclosed herein can extend to DC-DC converters of other variations.

By way of example, the DC-DC converter 110 can receive a power signal through the power input port 101 from the power source 103. The power signal can be filtered through shunt input capacitor 105 that can act as a decoupling capacitor to filter noisy alternating current (AC) signal components. The power signal is provided to the drain of the first switch 123 of a pair of switches 123, 127.

A driver 117 provides a first control signal through the electric pathway 121 to the gate of the first switch (e.g., eGaN switch) 123. The driver also provides a second control signal through the electric pathway 125 to the gate of the second switch (e.g., eGaN switch) 127. Using the control signals, the driver can turn the switches 123, 127 on and off in alteration. The driver can control the signal such that the on/off state of the first switch 123 is opposite of the on/off state of the second switch 127. The on/off duty cycles of the control signals can be set by the PWM controller 119. The PWM controller 119 can also control the pulse width or period through PWM signals provided to the driver.

The switches 123, 127, IC 113A (e.g., including the PWM controller 119 and/or driver 117), and the inductor 131 can be arranged to form part of a non-isolated synchronous power converter or a power stage. When the driver 117 drives the first switch 123 on and drives the second switch 127 off, power can be provided from the power source 103 to an energy storage circuit, such as the inductor 131 and/or capacitor 111, causing the DC output voltage at voltage output port 109 to increase. While driver 117 drives the first switch 123 off and drives the second switch 127 on, power from the energy storage circuit can drain through the second switch 127 to ground 107, causing the DC output voltage at voltage output port 109 to decrease. Accordingly, the pair 123 of switches 123, 127 can be quickly toggled to control the DC output voltage at voltage output port 109. The inductor 131 and capacitor 111 also act as a resonant filter that helps regulate the DC voltage.

The comparator 139 has a first input coupled to the drain of the second switch 127. The comparator 139 has a second input coupled to the source of the second switch 127. Accordingly, the comparator 139 can be coupled across the second switch 127. In some embodiments, the comparator 139 can have an inverting terminal as the first input. The first input of the comparator 139 can also be coupled to a current source 137. An I$^2$C and/or PMBUS (further described with respect to FIG. 2) can be used to trim and/or adjust the output current of current source 137. Accordingly, an overcurrent limit can be set and/or adjusted. The output of the comparator 139 can be provided to fault logic and overcurrent protection (OCP) circuitry 141.

The comparator 139 along with the fault logic and OCP circuitry 141 are configured to sense the drain-source resistance $R_{ds}$ when the switch 127 is on. The voltage drop across the switch 127 caused by $R_{ds}$ is compared to a reference value that can be adjusted by trimming or adjusting current source 137. The output of the comparator 139 can trip when an overcurrent condition occurs. The overcurrent protection circuitry 141 can turn off the switches 123, 127 and/or the driver when an overcurrent condition is detected and enter fault mode. In various embodiments, the OCP circuitry can couple directly to the gates of the switches 123, 127 to turn off the switches, short one or more alternative energy pathways (not shown) to discharge energy, affect the PWM controller 119 outputs in response to an overcurrent condition, and/or affect the driver 117 outputs in response to an overcurrent condition. In fault mode, the system can make periodic attempts to recover by briefly turn on the switches 123, 127 and/or driver, attempt to detect the overcurrent condition, and if the overcurrent condition still persists, turn off the switches 123, 127 and/or driver 117, and wait for a period of time before re-attempting to recover.

Sometimes, overcurrent conditions can occur as a result of inductor saturation. An inductor, such as inductor 131, can saturate if too much current is provided to the inductor for too long and lose its magnetic properties. In such cases, the inductance of an inductor can drop by 10%, 30%, or even more. A fully saturated inductor can effectively act as a wire, creating a potential short in the circuit. During saturation, the effective resistance of the inductor can drop, causing the output current to increase beyond specification and to potentially unsafe levels. The LC resonance of the circuit can also be affected when the inductor no longer effectively stores energy, so overvoltage and/or under voltage conditions can occur.

The inductor 131 can be selected to tolerate the load current (DC output current) as well as an AC ripple. Accordingly, the saturation current limit of the inductor 131 can be selected to exceed a specified DC output current plus the maximum AC ripple. For example, if the chip embedded DC-DC converter generates a 10 A DC current and a +/−5 A ripple, then the maximum total current is 15 A, and the inductor saturation limit should exceed 15 A. Inductors with higher inductances can have higher saturation limits and be larger in size.

In some designs, determining the overcurrent protection limits and determining the inductor size can be determined independently from each other, and one or the other can be over-engineered. This can occur, for example, when a second party selects and couples inductors to a DC-DC converter otherwise made by a manufacturer. In some cases, the second party may over-engineer the inductor out of an abundance of caution, for example, by allowing for a 5 A AC current, a 10 A DC current, and a 100% DC overcurrent, such the inductor is selected to have a saturation limit of 25 A or more. In some cases, the second party may not know OCP limits, and therefore resort to over-engineering the inductor to be larger in inductance and size such that the inductor is not saturated. In some cases, a second user could otherwise use a smaller inductor but for overcurrent protection limits that are too high, and therefore use an inductor of a minimum size and inductance that are larger than otherwise necessary. In some cases, a manufacturer may set an overcurrent limit too high or too low. Some embodiments of DC-DC converters disclosed herein can include an adjustable overcurrent limit. Some embodiments of DC-DC converters disclosed herein can include both overcurrent protection circuitry and an inductor, wherein the overcurrent limit is determined based at least on the size of the inductor, and the overcurrent limit can be set to a value equal to and/or below the saturation limit of the inductor. Some embodiments of DC-DC converters disclosed herein can include both overcurrent protection circuitry and an inductor, wherein the size of the inductor is selected, based at least in part, on the overcurrent limit, such that the saturation limit of the inductor is equal to or exceeds the overcurrent limit by a narrower margin such as 50% or less, 40% or less, 30% or less, 20% or less, 10% or less, or any values therebetween, or ranges bounded by any of these values, etc. Some embodiments of DC-DC converters disclosed herein can have overcurrent limits set to be less than the expected maximum AC current plus twice the expected DC current, such as a 90% or less DC overcurrent, a 75% or less DC overcurrent, a 50% or less DC overcurrent, 50% or less DC overcurrent, 40% or less DC overcurrent, 30% or less DC overcurrent, 20% or less DC overcurrent, 10% or less DC overcurrent, or any values therebetween, or ranges bounded by an of these values, etc. In some embodiments, a single designer can provide the components for and select the values for both the OCP circuit and limits as well as the inductor and its saturation limit. Accordingly, in some embodiments, the DC-DC converter can operate without the inductor reaching saturation while having a smaller footprint, lower inductor direct current resistance, and increased efficiency.

Packaging

Figure 2:
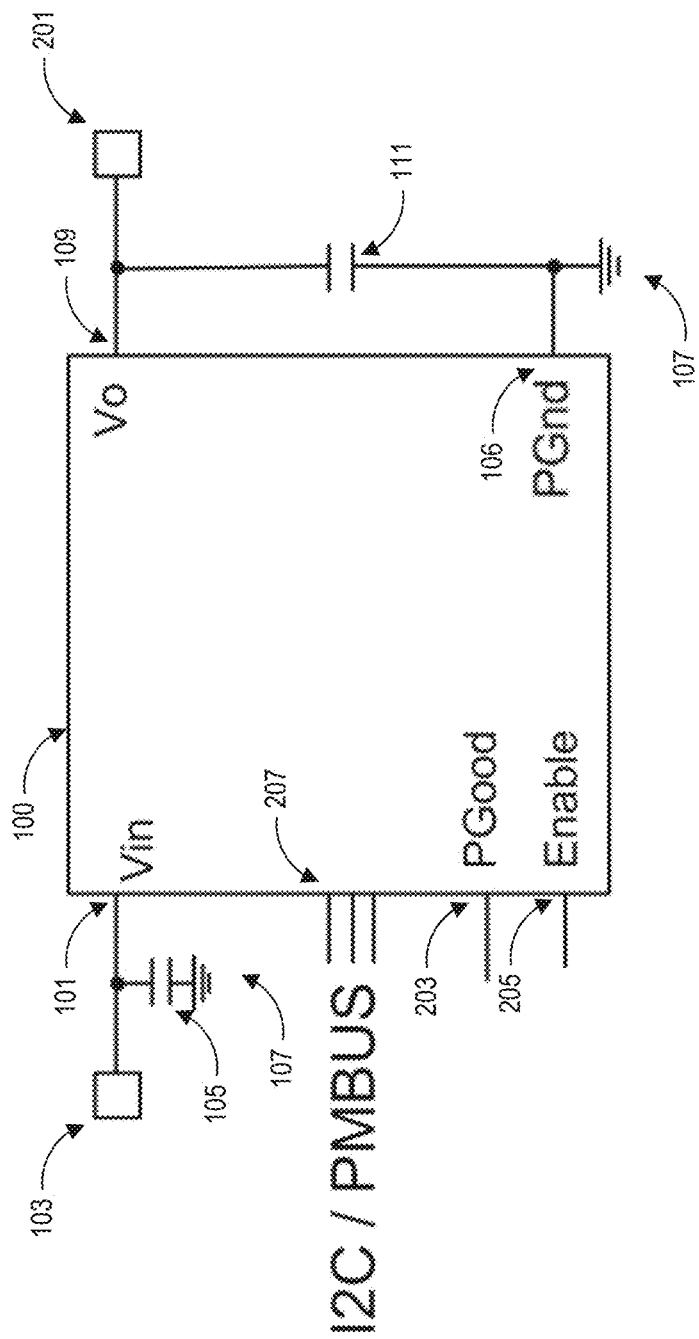
FIG. 2 shows a package level schematic of an example embodiment of a chip embedded DC-DC converter package.

FIG. 2 shows a package level schematic of an embodiment of a chip embedded DC-DC converter package 100. The chip embedded DC-DC converter package can include input port 101, ground port 106, and output port 109. As described with respect to FIG. 1, a power input port 101 can be coupled to a power source 103, such as by way of an input capacitor 105 that is coupled to ground. A voltage output port 109 can supply a DC output voltage to a load coupled at node 201, such as by way of an output capacitor 111 that is coupled to ground 107. An enable port 205 is configured to receive a signal to enable the DC-DC converter. A test port 203 can be used to check the status of the device. In some embodiments, an Inter-Integrated Circuit (I$^2$C) and/or Power Management Bus (PMBUS) provides a communication pathway to/from the chip embedded DC-DC converter package 100.

The package 100 footprint can include all the components of a DC-DC converter. In some embodiments, the package 100 footprint includes the IC 113A or 113B and an inductor 131, for example such that the package can operate as a DC-DC converter without additional external inductors. In some embodiments, at least one or more of capacitors 105, 111, and/or 133 can also be included within the package footprint, for example such the package can operate as a DC-DC converter without additional external capacitors.

Figure 16:
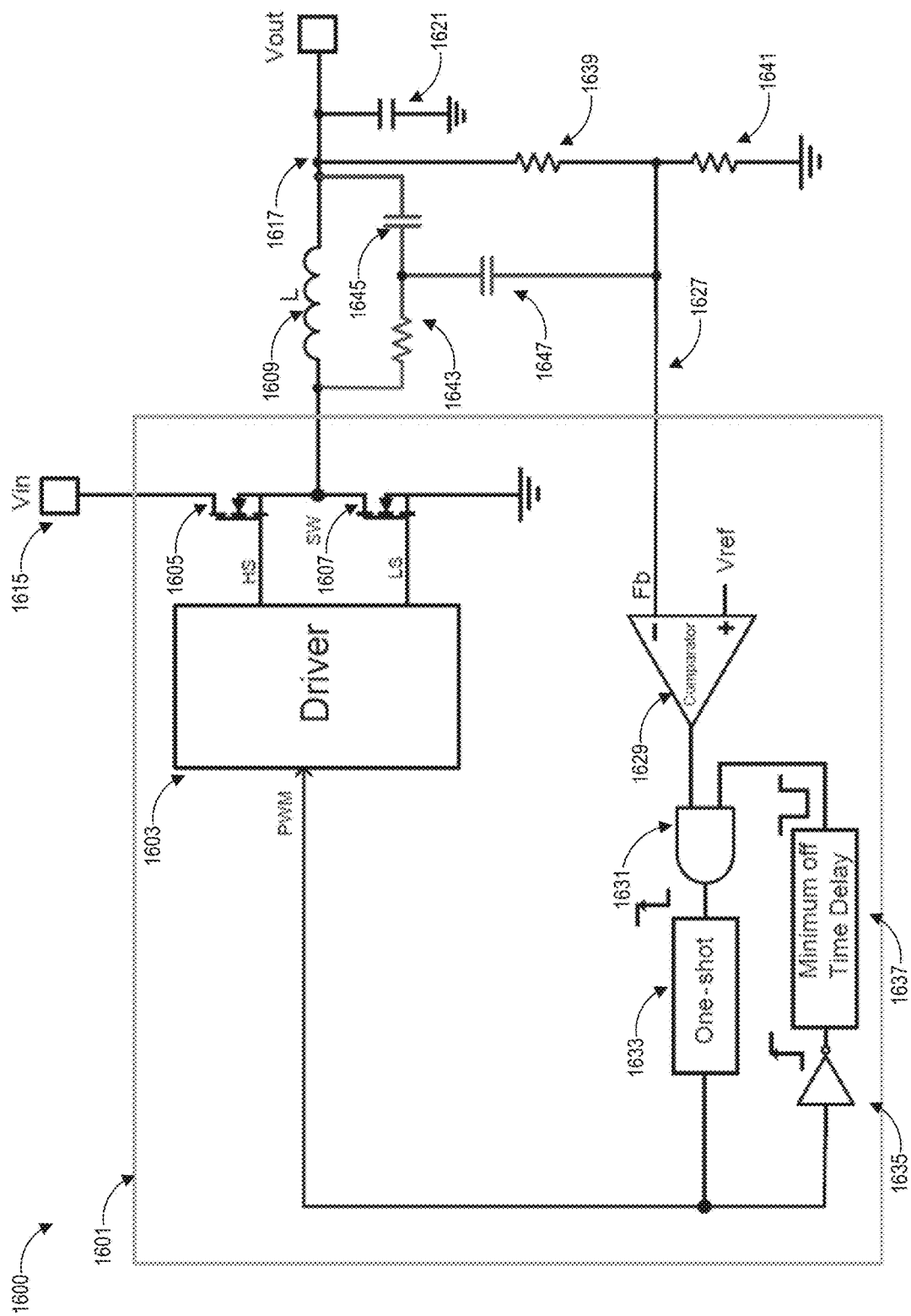
FIG. 16 shows an example chip embedded DC-DC converter with an external ripple voltage feedback circuit.
Figure 17:
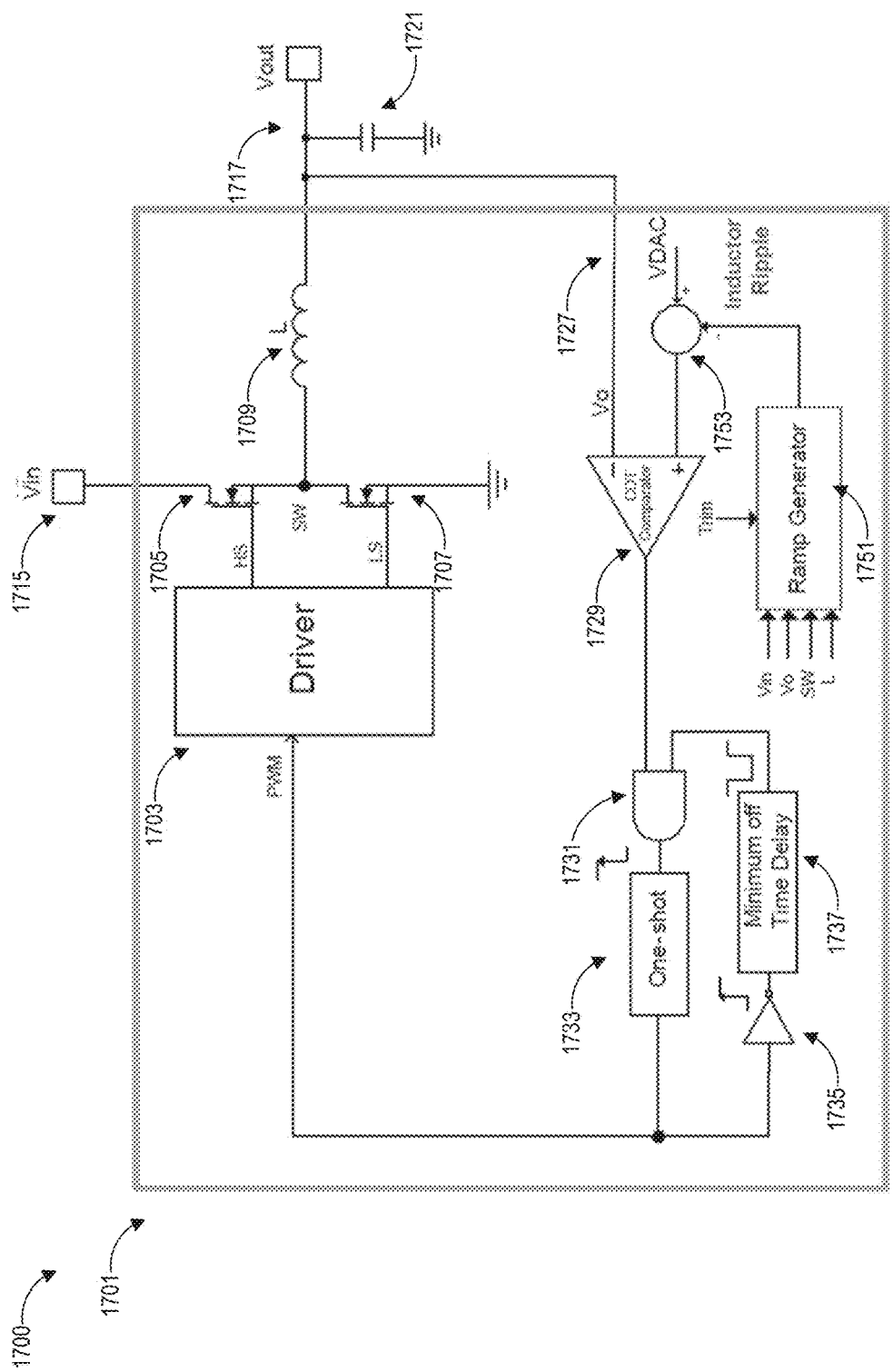
FIG. 17 shows an example chip embedded DC-DC converter with an internal ripple voltage feedback circuit.

In some embodiments, the I²C and/or PMBUS can be used to receive I²C and/or PMBUS protocol communications to perform one or more of the following: turn on or off the chip embedded DC-DC converter package 100, change a low power or sleep mode of the DC-DC converter package 100, read out information about current settings of the DC-DC converter package 100, read out diagnostic and/or technical information about the DC-DC converter package 100, set or change an output voltage provided by the DC-DC converter package 100 (e.g., by changing a digital signal provided to the digital to analog controller "DAC" described with respect to FIG. 16 and FIG. 17), trimming a property of the ramp generator (e.g., the ramp generator of FIG. 17) such as amplitude or frequency, trimming one or more current sources (e.g., the current sources of FIG. 18), and other functions. In some embodiments, the PMBUS protocol is implemented as an interconnect layer on top of the I²C implementation.

Integration and Chip Embedded Design

The DC-DC converter can be highly integrated and can switch at higher frequencies and offer improved performance as compared to other DC-DC converters. In some designs, parasitic effects prevent can prevent DC-DC converters from efficiently operating at higher frequencies (higher switching speeds), if at all. A number of designs for DC-DC converters are disclosed herein along with additional designs with reduced parasitic effects.

Some DC-DC converter packages include wire bonds and/or leadframe packages. An example 1 mil, 1 mm long bond wire may have 0.7 nH of parasitic inductance, 0.08 pF of parasitic capacitance, and 140 mΩ of parasitic resistance. Similar or higher parasitic effects can result from leadframe packages such as quad flat no-lead (QFN) packages, power quad flat no-lead (PQFN) packages, dual flat no-lead (DFN) packages, micro lead-frame (MLF) packages, etc. Some embodiments of DC-DC converters disclosed herein can limit or avoid the use of wire bonds and/or leadframes altogether in order to reduce parasitic effects. Vias, traces, bumps, and/or bump pads can be used inside of a package instead.

Figure 3:
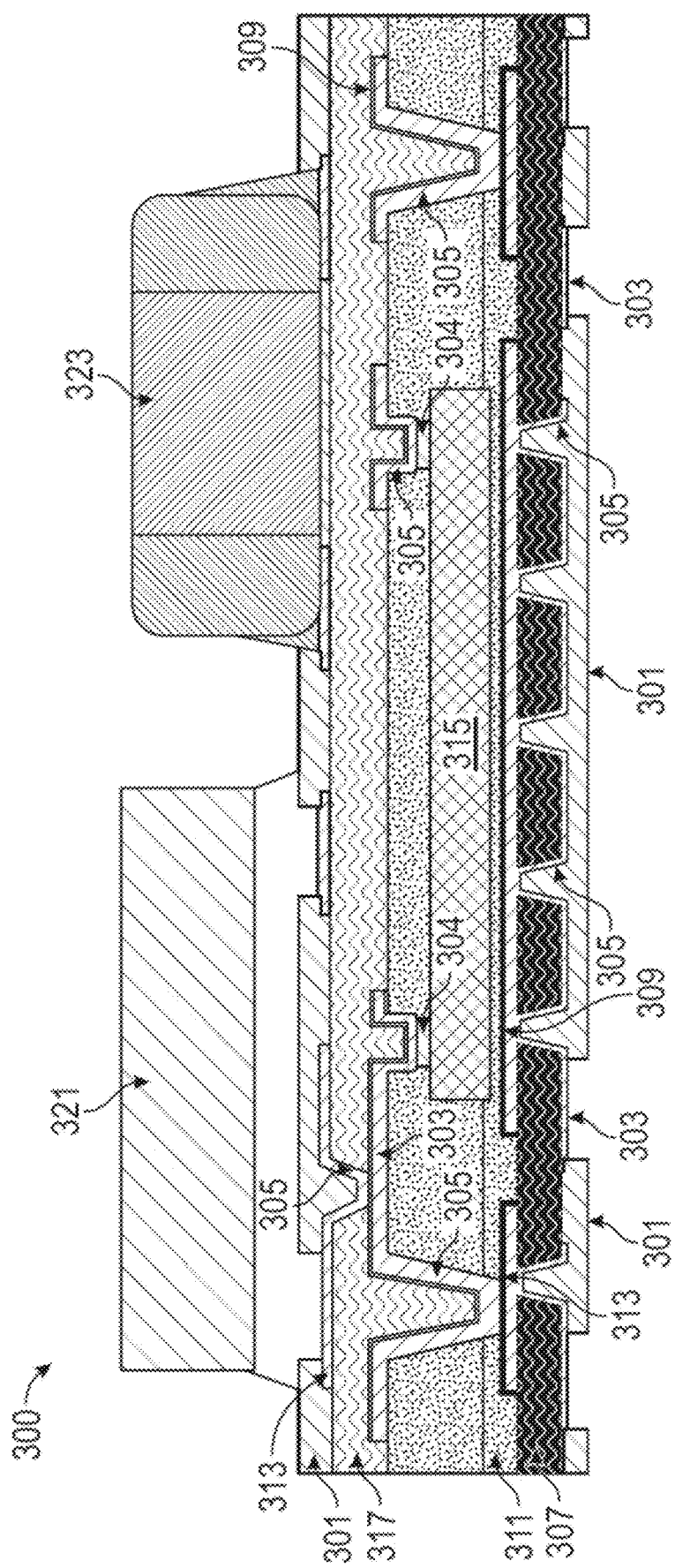
FIG. 3 shows a cross section view of an example chip embedded DC-DC converter.

Some DC-DC converter packages do not include an inductor or capacitor. Such packages give a user the flexibility to select particular values for the capacitors and inductors and control the quality of those components. The DC-DC converter package, inductors, and capacitors may be surface mounted on a motherboard or separate PCB and coupled together with wire bonds or long traces through the motherboard or the separate PCB (for example, as shown in FIG. 7A). However, coupling a DC-DC converter package to the external inductors or capacitors can introduce parasitic effects. Parasitic effects can similarly be introduced between the inductor and a load. Some embodiments of DC-DC converters disclosed herein can reduce parasitic effects of coupling to the inductor or capacitor by integrating the inductor or capacitor in the same package as the other components of the DC-DC converter. In some embodiments disclosed herein, the electric pathways coupling to the inductors or capacitors can be implemented with vias and/or traces instead of wire bonds. In some embodiments disclosed herein, the electric pathways coupling to the one or more inductors or capacitors can include vias and/or traces located in the PCB of the DC-DC converter instead of including traces in the motherboard or separate PCB (e.g., as shown in FIG. 3 and FIG. 7B). In some embodiments disclosed herein, any combination of the PWM controller, driver, inductor(s), capacitor(s), and/or switch(es) can be included in the same package.

In some designs, parasitic effects can arise as a result of component interconnections. For example, with respect to FIG. 1, a driver 117 in one integrated circuit 113A can couple to a separate electronic component 135 that includes switches 123, 127. The integrated circuit 113A and the separate electronic component 135 can be included in a PCB. The electric pathways 121, 129, 125 between the driver and the switches 123, 127 can be implemented using traces on the PCB, but the traces on a PCB can have relatively higher parasitic effects as compared to electric pathways inside integrated circuits. Some embodiments of DC-DC converters disclosed herein can reduce parasitic effects of interconnections between the driver and switches by integrating the switches 123, 127, and driver 117 along with their interconnections in the same IC 113B. In some embodiments disclosed herein, the PWM controller, driver, and switches are all included in the same IC 113B. In some embodiments, one or more capacitors can also be include in the same IC 113B.

In some designs, MOSFET switches can be used. However, MOSFET switches can be less efficient at higher switching speeds. In some embodiments disclosed herein, the switches 123, 127 can be eGaN switches. eGaN switches can switch more efficiently and at higher speeds compared to MOSFET switches.

The synergy of the techniques disclosed herein will be appreciated. Parasitic capacitance and/or inductance effects can limit maximum switching speeds in a DC-DC converter. This may be because the parasitic effects can cause undesired energy to be stored, affecting the charging and discharging of energy, and thereby affecting DC voltage regulation. The parasitic effects can also cause the switches to turn on or off slowly. In some embodiments, a combination of the techniques disclosed herein can cause the parasitic effects to be reduced by a sufficient degree for improvement in DC-DC converter performance. Additional synergies relating to the arrangement, size, and performance of DC-DC converters are also discussed in later sections of the detailed disclosure.

Compared to some other DC-DC converters, some embodiments disclosed herein remove about 40 bond wires, which can reduce parasitic effects by about 20 mΩ and can also reduce the package leakage inductance (parasitic inductance) by 10 nH or more. The elimination of these parasitic effects can help to realize the benefits of high speed switches (e.g., eGaN switches).

The figure of merit for a power switch can be determined according to equation 1:

$$FOM = R_{DS(ON)} * Q_G \qquad \text{Eq. 1}$$

where FOM is the figure of merit, $R_{DS(ON)}$ is the on-resistance of the switch, and $Q_G$ is the gate charge of the switch. The gate charge $Q_G$ can be affected by parasitic inductances. Reducing the parasitic inductances can result in a lower FOM, a design improvement that is usually difficult to achieve.

It will be further appreciated that some, but not all, of the full advantages can be realized only by the simultaneous combination of sufficient parasitic effect reduction and component choices. For example, some advantages of reducing parasitic effects may not be realized if MOSFETs are used, under some circumstances. This is because, although parasitic effects may be reduced to a sufficient level to allow faster switching speeds, the MOSFET design may not allow for efficient switching at the faster speeds. Likewise, the full switching potential of eGaN switches (or other faster, and typically more costly switches) in a DC-DC converter can be limited by parasitic effects. Full switching potential can include more efficiently switching at higher frequencies in the megahertz range such as 1 MHz or higher, 3 MHz or higher, 4 MHz or higher, 5 MHz or higher, 7 MHz or higher, 10 MHz or higher, etc. In some instances, switching rates up to 15 MHz can be achieved, and switching rates outside these identified ranges could be used in some implementations.

Accordingly, an engineer testing limited techniques to reduce parasitic effects may not cause the parasitic effects to drop to an impactful level. An engineer testing a combination of parasitic reduction techniques may not achieve more significant gains if switching speeds are limited by MOSFETs. An engineer testing eGaN switches without first realizing and addressing the parasitic effects in DC-DC converters may not realize the switching speed benefits of using eGaN switches, especially because eGaN switches can be more costly than MOSFET switches. Additionally, increasing the switching speeds, especially to 1, 2, 3, 5, 7 or 10 MHz and above, depending on other variables, can go against conventional knowledge that efficiency tends to decrease with higher switching speeds.

The Integration and Chip Embedded Design section of the Detailed Disclosure discusses various embodiments for reducing parasitic effects and/or achieving faster switching speeds. Although some embodiments include a combination of features, the embodiments including fewer than all the features will still be appreciated in their own right.

Physical Arrangement Figures

FIG. 3 shows a cross section view 300 of an example chip embedded DC-DC converter. The view 300 includes insulators 301, conductor (e.g., metal) 303, bumps or pads 304, conductor micro-vias 305, a first PCB layer 307, conductive plating 309, a PCB core 311, traces 313, an embedded IC chip 315, a second PCB layer 317, an inductor 321, and a capacitor 323.

The embedded IC chip 315 can be embedded in a PCB core 311. In various embodiments, the IC chip 315 can be embedded in a layer of the PCB or between two or more layers of a PCB, or between a lower PCB and an upper PCB. The embedded IC chip 315 can include a PWM controller, driver, and/or one or more switches (e.g., eGaN switches), as discussed herein, such as with respect to FIG. 1. The embedded IC chip 315 can be coupled to the inductor 321 and capacitor 323 through a plurality of vias 305 and/or traces 313 in a DC-DC converter arrangement.

The insulators 301 can include, for example, a solder mask, mold, underfill, etc. The layers 307, 317 of the PCB can be a PCB substrate, laminate, resin, epoxy, insulator, etc. In the illustrated view 300 shown in FIG. 3, PCB core 311 can be a filler, laminate, an insulating mold compound or substrate, etc. The conductor (e.g., metal) 303, vias 305, and traces 313 can be metals or conductive materials of various types, such as copper, aluminum, gold, etc. Although the vias are shown as plated vias, some embodiments can use pillars or other vias. Various embodiments can use more or fewer types and layers of metals.

In some embodiments, the IC chip 315 can be flip chip mounted. In various embodiments, the IC chip 315 can be face up or face down such that connections on the IC chip 315 can be facing toward the inductor 321 and/or capacitor 323 or away from the inductor 321 and/or capacitor 323. If the connections on the IC chip 315 face away from the inductor 321 and/or capacitor 323, then the inductor 321 and/or capacitor 323 can be coupled by way of vias 305 and/or traces 313 to the far side of the IC chip 315.

Although FIG. 3 shows a single IC chip 315 that can include a driver and switches, in some embodiments, switches (e.g., monolithic eGaN switches) can be chip embedded in the PCB separate from the IC chip 315 and can be interconnected with the driver in the chip embedded IC chip 315. Vias, pads, and/or traces can couple various components as a DC-DC converter, and the two dies can be faced down or up. An inductor or other magnetic can be placed in or on the top layer and create a complete half bridge combination in a Buck converter or any other configuration using a Half Bridge scheme.

Although the IC chip 315 is shown coupled to the inductor 321 by way of both vias 305 and traces 313, in some embodiments, the IC chip 315 can be coupled to the inductor 321 and/or capacitor 323 by either vias 305 or traces 313 without the other. In various embodiments, the PCB assembly can have more or fewer PCB layers than shown in FIG. 3, and the IC chip 315 can be embedded in or between a single layer or multilayer PCB. In various embodiments, layers 307, 317 can be layers of a PCB or separate PCBs. The metal 303 exposed at the bottom of the PCB can provide input/output pads for coupling to an input power supply, a ground, and/or a load.

Parts of the inductor 321 and/or capacitor 323 can be stacked above the IC chip 315. In some embodiments, the inductor 321 and/or the capacitor 323 can be stacked entirely over the IC chip 315. The inductor 321 and IC chip 315 tend to be the larger components in the DC-DC converter package. In some embodiments, the smaller of the inductor 321 or IC chip 315 can be stacked within the footprint of the larger of the inductor 321 or IC chip 315. Although a single IC chip 315 that includes both switches and a driver is shown in FIG. 3, in various embodiments, the inductor 321 and/or capacitor 323 can overlap, at least partially, with components that are separate from the single IC chip 315. For example, the inductor 321 can overlap with one or more switches, with the PWM controller, and/or with the driver, etc.

The position of inductor 321 can contribute to better thermal performance of the DC-DC converter. By positioning the inductor 321 on top, the inductor 321 can be cooled by ambient air. The top-mounted inductor 321 also allows various sizes or shapes for the inductor 321 to be used (e.g., such that the inductor 321 is not constrained by the dimensions of the PCB).

Figure 4A:
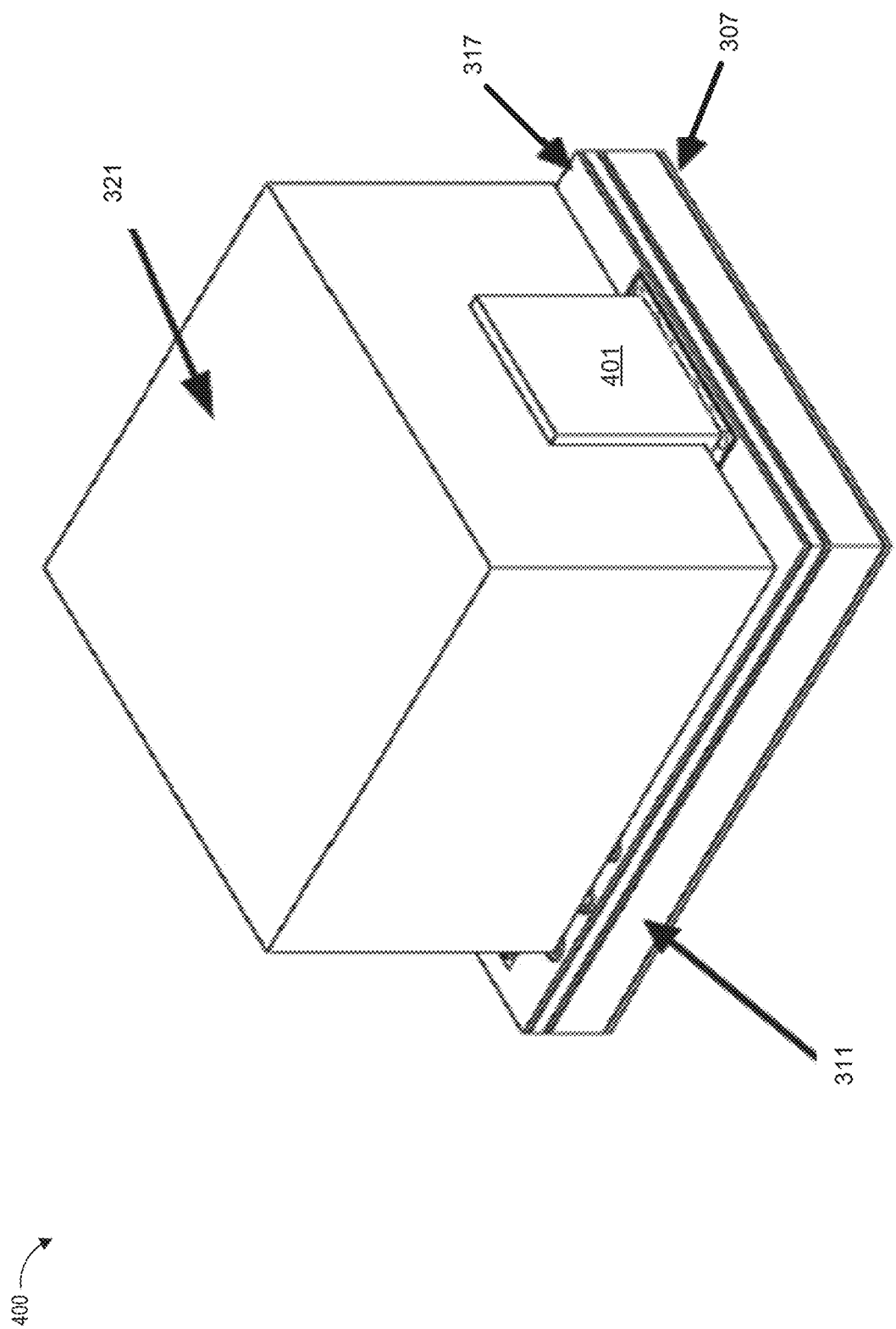
FIG. 4A shows a perspective view of an example chip embedded DC-DC converter with a stacked inductor.

FIG. 4A shows a perspective view 400 of an example chip embedded DC-DC converter with a stacked inductor 321. The inductor 321 can be stacked above an IC chip (not visible) that is embedded in a core 311 between the layers 317, 307 of a PCB. The inductor 321 can be coupled to the PCB, at least partially, through a metal contact 401. In some embodiments, one or more capacitors 323 (not visible) can be coupled to the PCB layer 317.

Figure 4B:
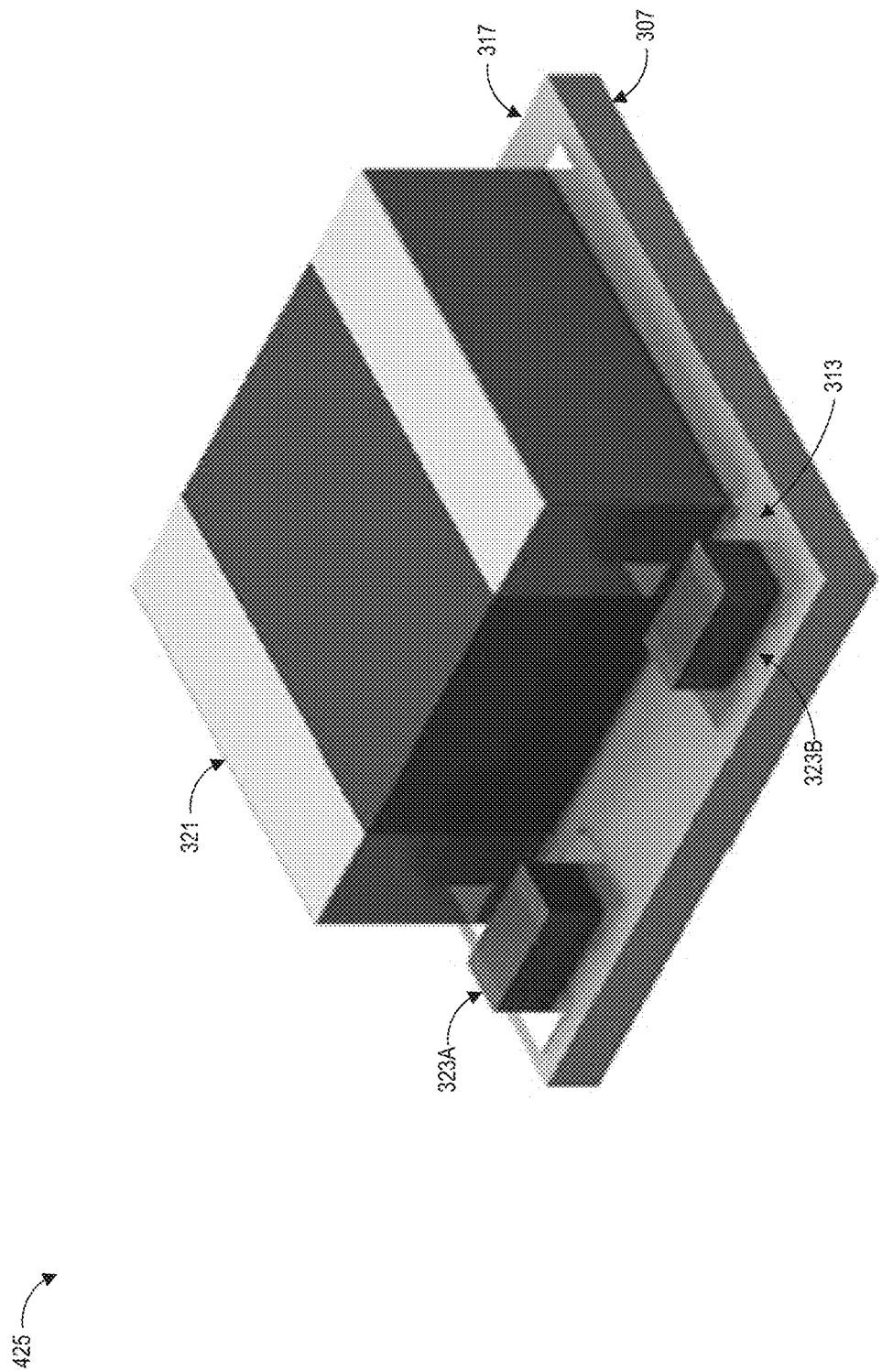
FIG. 4B shows a reverse perspective view of an example rendered chip embedded DC-DC converter with a stacked inductor.

FIG. 4B shows a reverse perspective view 425 of an example rendered chip embedded DC-DC converter with a stacked inductor 321. The inductor 321 can be stacked above an IC chip (not visible) that is embedded between the layers 317, 307 of a PCB. The inductor 321 can be coupled to the PCB, at least partially, through a metal trace 313. One or more capacitors 323A, 323B can be coupled to the PCB layer 317. The one or more capacitors 323A, 323B can also be coupled to inductor 321 by way of a trace 313.

In some embodiments, as switching frequencies increase, inductors can be made smaller. Additionally, some materials and technologies such as thin film technologies can also reduce the sizes of inductors. Accordingly, in some embodiments the inductor can be embedded in a PCB, such as above or alongside an IC. Such arrangements offer further integration and increase the amount of space available, such as on a PCB mounting surface area, for other peripheral components, such as input and output capacitors.

Figure 4C:
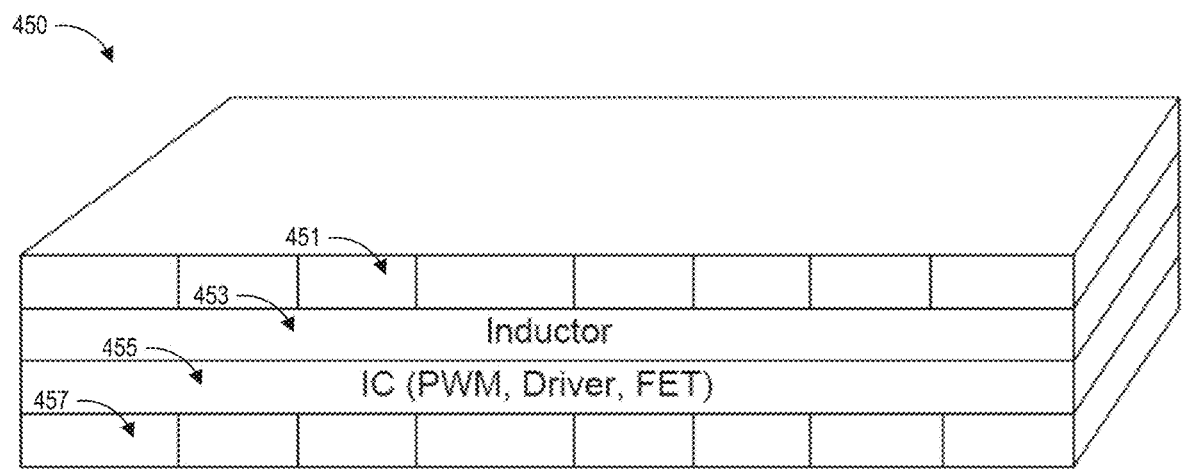
FIG. 4C shows a side view of an example chip embedded DC-DC converter with an embedded stacked inductor.

FIG. 4C shows a side view 450 of an example chip embedded DC-DC converter with an embedded stacked inductor. A first layer 451 can be, for example, a packaging layer or a PCB layer. A second layer 453 can be a PCB layer that includes an inductor embedded within the second layer 453. A third layer 455 can be a PCB layer that includes circuitry (e.g., an IC) embedded within the third layer. The circuitry (e.g., the IC) can include, for example, the PWM controller, driver, and/or switches (e.g., FET's). A fourth layer 457 can be, for example, a packaging layer or a PCB layer. In FIG. 4C, the inductor can overlap, at least partially, with the circuitry (e.g., IC) or be off to the side. The inductor can couple to the IC by way of vias and/or traces without bond wires.

Figure 4D:
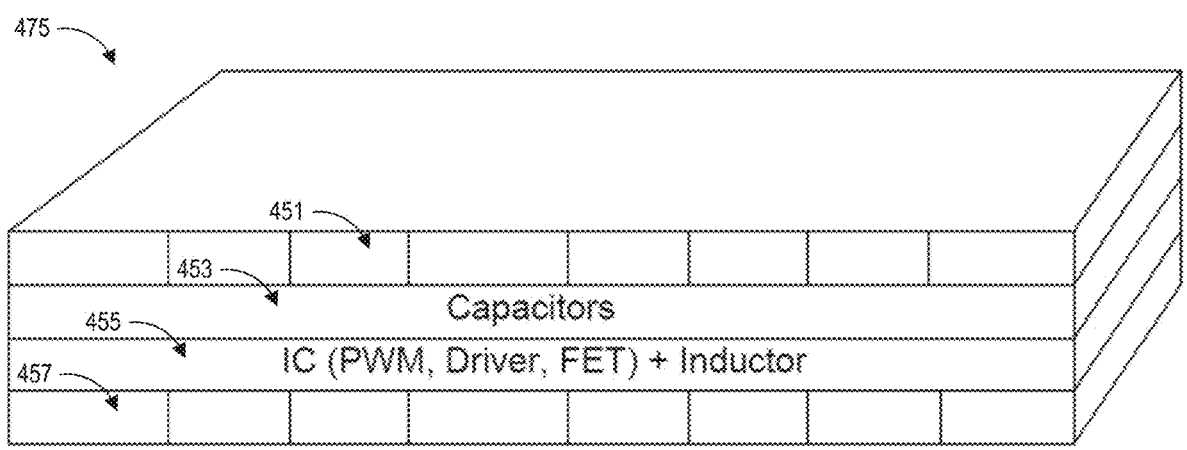
FIG. 4D shows a side view of an example chip embedded DC-DC converter with an embedded inductor.

FIG. 4D shows a side view 475 of an example chip embedded DC-DC converter with an embedded inductor. The layers 451, 453, 455, and 457 can be the same as or similar to those described for FIG. 4C. In FIG. 4D, layer 455 can include circuitry (e.g., the IC) and the inductor beside the other circuitry (e.g., the IC). The IC can be coupled to the inductor by way of traces. Layer 453 can include embedded capacitors. In some embodiments, the one or more embedded capacitors can be embedded in the PCB, and the embedded capacitors can be mounted so that a footprint of the one or more embedded capacitors overlaps a footprint of the circuitry (e.g., the IC) and/or inductor. In some embodiments, one or more embedded capacitors can be included in the same layer 455 with the embedded circuitry (e.g., the IC) and/or the embedded inductor. In some embodiments, capacitors can be surface mounted on layer 453. In some embodiments, layer 453 can be omitted. In some embodiments, capacitors can be mounted outside the PCB (e.g., such as capacitor 323 shown in FIG. 3). Many variations are possible. Circuitry (e.g., one or more IC's) including any combination of the PWM controller, driver, and/or switches can in the same layer as either or both of the one or more inductors and/or the one or more capacitors. The IC can be an eGaN IC. A monolithic eGaN IC can include any combination of the PWM controller, the driver, and the one or more switches. In some implementations, the one or more capacitors and/or the one or more inductors can be included in an IC (e.g., an eGaN IC) together with one or more of the PWM controller, the driver, and/or the one or more switches. The one or more inductors, the one or more capacitor, or both can be disposed in a separate layer embedded in the PCB, such as either above or below the circuitry (e.g., the IC). In some embodiments, the one or more inductors can be on a first side of the circuitry (e.g., the IC) and the one or more capacitors can be on a second opposing side of the circuitry (e.g., the IC). In some embodiments, the one or more inductors and the one or more capacitors can be embedded in different layers of the PCB but on the same side of the circuitry (e.g., the IC). Either or both of the one or more capacitors and/or the one or more inductors can be disposed outside the PCB (e.g., as in FIG. 3). In some implementations, one or more of the PWM controller, driver, and one or more switches can be in different layers embedded in the PCB. In some embodiments, the PWM controller and the driver can be in separate ICs (e.g., eGaN ICs). Components embedded in different layers in the PCB can be oriented so that they at least partially, or completely, overlap, or so that they do not overlap. Any eGaN embodiment disclosed herein can alternatively be implemented as a GaN embodiment, which can include depletion mode GaN, eGaN and/or any combination thereof.

Figure 5:
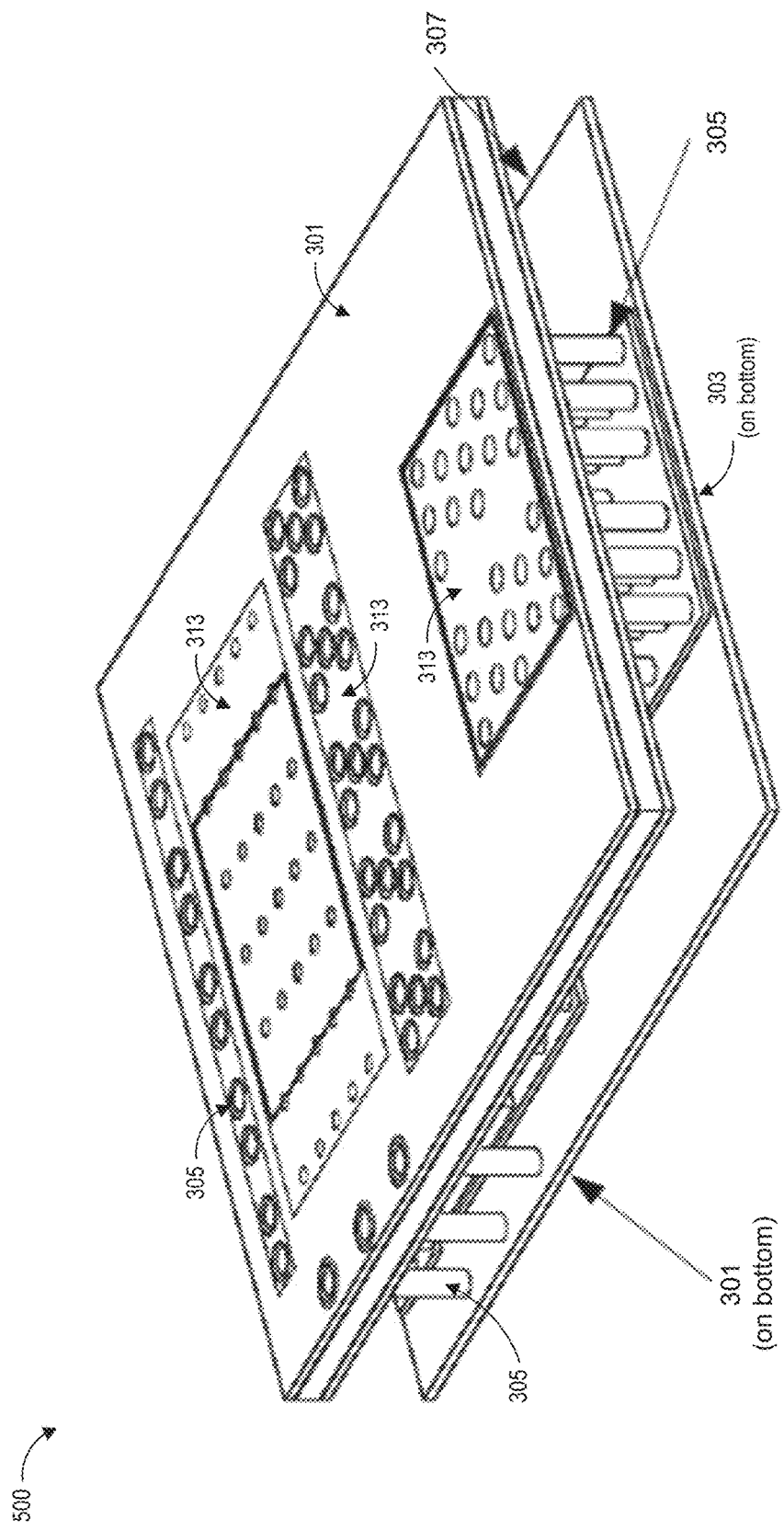
FIG. 5 shows a see-through perspective view 500 of an example chip embedded DC-DC converter.

FIG. 5 shows a see-through perspective view 500 of an example chip embedded DC-DC converter. FIG. 5 shows the same example chip embedded DC-DC converter as shown in FIG. 4A and FIG. 4B, but with without the inductor 321, capacitors 323, or core 311 to illustrate otherwise obscured components. Vias 305 can couple traces 313 and/or pads 303.

Figure 6:
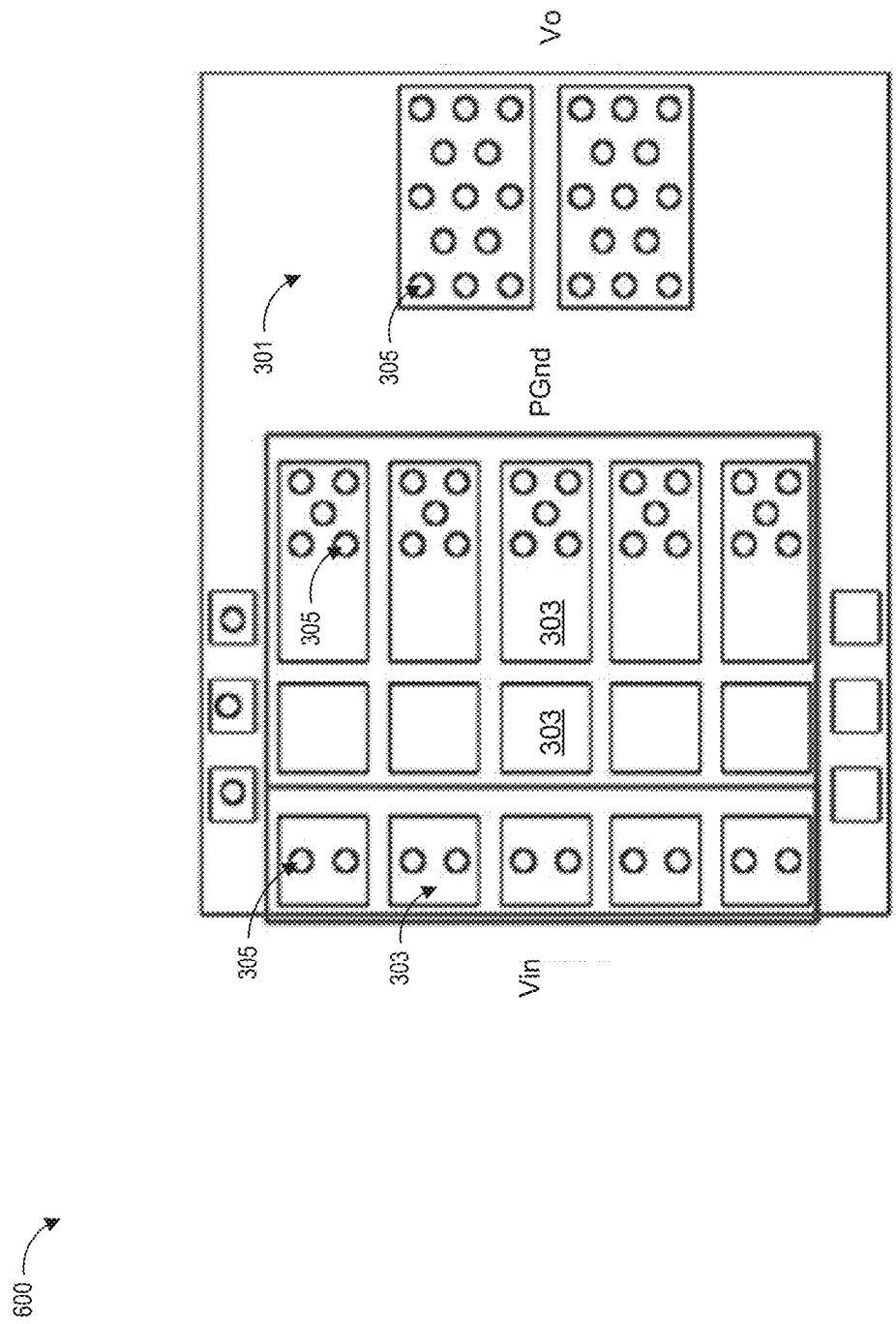
FIG. 6 shows a bottom view of an example chip embedded DC-DC converter.

FIG. 6 shows a bottom view 600 of an example chip embedded DC-DC converter. FIG. 6 shows the same example chip embedded DC-DC converter as shown in FIG. 5. Exposed metal 303 pads between areas of insulator 301 provide electrical contacts for the supply voltage, ground, and/or voltage output. Vias 305 are shown. However, in some embodiments, the vias do not visibly extend through the exposed metal 303.

Reduced Footprint

The physical arrangement and other techniques disclosed herein can be used to reduce the footprint of a DC-DC converter. In some embodiments, the footprint can be reduced by about 70%. Stacked components, the use of smaller inductor with faster switching speeds, and a single package of components can all contribute to the reduced footprint.

As previously discussed, some DC-DC converter packages do not include an inductor or capacitor, and some DC-DC converters may include an inductor mounted beside a driver, PWM controller, and/or IC chip. Such packages may give a user the flexibility to select particular values for the capacitors and/or inductors and control the quality of those components. However, arranging components in a stacked arrangement instead of beside each other can reduce the footprint of the DC-DC converter. Some embodiments disclosed herein feature an inductor that is vertically stacked, wholly or partially, above the IC chip. Some embodiments disclosed herein feature a capacitor that is vertically stacked, wholly or partially, above the IC chip. Stacking the inductor and/or capacitor can reduce the footprint of the DC-DC converter. Stacked components can be electrically coupled (e.g., to the IC chip) with vias, which can reduce parasitic effects as discussed above. Some embodiments disclosed herein can provide for ease of design such that individual components do not need to be selected, arranged, and mounted by a user. A single package DC-DC converter can be used without configuring external capacitors or inductors. Furthermore, some embodiments can integrate the inductor into the package without compromising the size of the inductor, without compromising the performance of the inductor, and/or without requiring a custom made inductor.

As discussed above, the parasitic effects can be reduced, and the switching speed of the DC-DC converter can be increased with efficiency. The inductance of a DC-DC converter can be determined according to equation 2, $$L = \frac{(Vin - Vo) * Vo}{2\Delta iL * Fs * Vin} \qquad \text{Eq. 2}$$

where L is the inductance, $V_{in}$ is the input voltage, $V_o$ is the output voltage, $\Delta iL$ is the inductor ripple current, and $F_s$ is the switching frequency. Notably, the inductance decreases as the switching speed increases. Accordingly, reduced parasitic effects and faster one or more switches (e.g., eGaN switches) can allow the DC-DC converters to use smaller inductors. In DC-DC converters, inductors can be one of the largest components. By reducing the size of the inductor (e.g., to a fraction of its original size), the footprint can be substantially reduced.

Some DC-DC converters include multiple packages. For example, there might be a first package that includes a driver, a second package for switches, and a third package that includes an inductor. Some embodiments disclosed herein feature a single package that includes all of the components of a DC-DC converter, such as a PWM controller, driver, switches (e.g., eGaN switches), inductor(s), and capacitor(s). In some embodiments disclosed herein, a number of components can be integrated into a single IC, such as the PWM controller, driver, and/or switches (e.g., eGaN switches).

Accordingly, the features relating to higher switching speeds can additionally synergize with the physical design of a DC-DC converter such that the size of a DC-DC converter can be reduced. The smaller DC-DC converter can be used in various applications to provide higher current density to power modern electronic devices such as microprocessors, field programmable gate arrays, application specific integrated processors, etc. Smaller DC-DC converters can be made at reduced manufacturing costs. The techniques disclosed herein can reduce board and package parasitic effects. Smaller DC-DC converters can feature tighter connections that reduce parasitic effects between the inductor, the IC chip, and/or a load, and the DC-DC converter can be efficiently operated at higher frequencies. The techniques disclosed herein can lead to reduced noise, including lower ripple effects and lower electromagnetic interference.

Generally, a larger sized DC-DC converters can handle larger amounts of current. In some embodiments, the DC-DC converters disclosed herein can handle a given amount of current with a smaller sized DC-DC converter, as compared to conventional approaches. For example, the DC-DC converters disclosed herein can have a footprint area of less than 20 mm² per amperage of current, less than 15 mm² per amperage of current, less than 10 mm² per amperage of current, less than 7 mm² per amperage of current, less than 5 mm² per amperage of current, less than 4 mm² per amperage of current, less than 3 mm² per amperage of current, less than 2 mm² per amperage of current, less than 1.5 mm² per amperage of current, or less than 1 mm² per amperage of current. The DC-DC converters can have as low as 1.0 or 0.5 mm² per amperage of current, although values outside the ranges discussed herein can be used in some implementations.

Example Applications

The DC-DC converters disclosed herein can be used to provide power to electronic devices. Examples include using the DC-DC converter to convert a primary supply voltage into a DC voltage appropriate for electronic devices powered through the supply voltage. By way of example, in some applications, modern power management solutions can use 40 or more chip embedded DC-DC converters to power 40 or more electronic components while meeting specifications for size, input/output ripple, efficiency, and thermal limits. DC-DC converters as disclosed herein can be made smaller and used in modern systems where the space and board size are limited. DC-DC converters as disclosed herein can be used to power components in various market segments such as storage, servers, networking, telecom, internet of things, etc. Other applications include using the DC-DC converters disclosed herein to provide power to micro point of load devices such as for processors in blade servers, components of solid state devices, etc.

FIG. 7A shows an example of a DC-DC converter used in a memory device 700. The memory device 700 can be, for example, a solid state drive. The memory device 700 can include a controller 703 and a plurality of memory chips 705 coupled through a PCB 701. A DC-DC converter 707 can receive a supply voltage through power input pins 709 and provide DC power to the memory chips 705 and/or controller 703. The DC-DC converter 707 can be coupled to an inductor 709 by way of bond wires or traces 711 through the PCB 701. The PCB 701 can be a separate PCB 701 from the package of the DC-DC converter 707. The capacity of the memory device 700 is limited by the number of memory chips 705, which is six memory chips in the implementation of FIG. 7A.

FIG. 7B shows an example application of a chip embedded DC-DC converter to a memory device 750. A chip embedded DC-DC converter 751 receives a supply voltage through power input pins 709 and provide DC power to the memory chips 705 and/or controller 703. A smaller inductor can be included in the package footprint of the chip embedded DC-DC converter 751. The chip embedded DC-DC converter 751 can be substantially smaller than the DC-DC converter 707 of FIG. 7A. Accordingly, the additional PCB room can be used for an additional memory chip 753 to improve the memory capacity of the memory device 750.

Figure 8A:
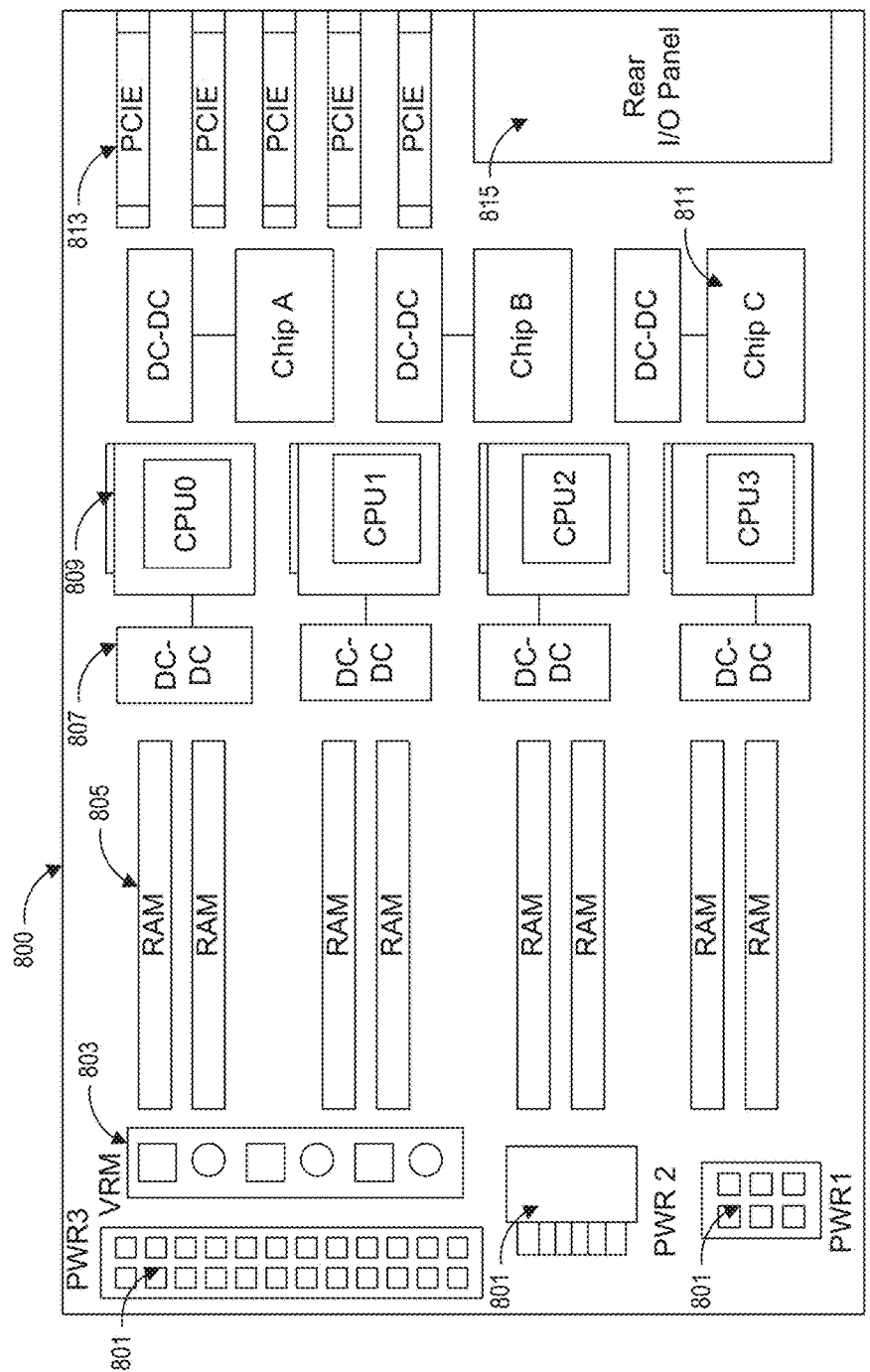
FIG. 8A shows an example application of DC-DC converters on a circuit board.

FIG. 8A shows an example application of DC-DC converters on a circuit board 800. The circuit board 800 can be, for example, a blade server or motherboard that includes a plurality of power connectors 801 (PWR), a voltage regulator management (VRM) circuit 803, a plurality of random access memory (RAM) slots 805, a plurality of peripheral component interconnect express (PCIE) slots 813, and a rear input/output panel 815. The circuit board 800 also includes a plurality of DC-DC converters 807 at points of load. The DC-DC converters 807 each power one of the central processing units 809 or computer chips 811. The DC-DC converters 807 can receive power supplied through the power connectors 801 and/or VRM circuit 803 and convert the voltage of the supplied power into a DC voltage meeting the DC power specifications of each respective CPU 809 or computer chip 811.

Figure 8B:
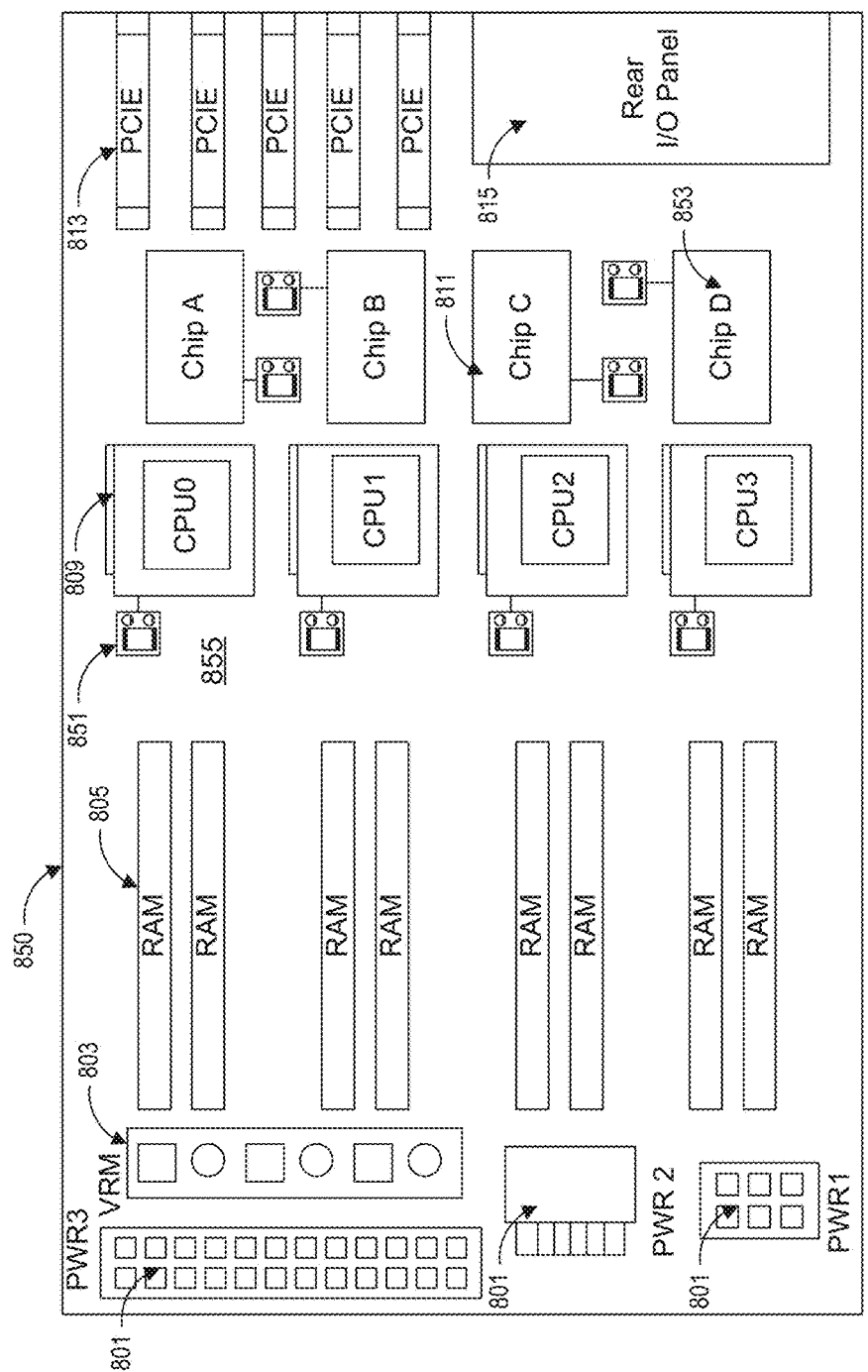
FIG. 8B shows an example application of chip embedded DC-DC converters on a circuit board.

FIG. 8B shows an example application of chip embedded DC-DC converters on a circuit board 850. The circuit board 850 includes a plurality of chip embedded DC-DC converters 851 (e.g., at points of load). The chip embedded DC-DC converters 851 can power central processing units 809 and/or computer chips 811, for example. The DC-DC converters 851 can receive power supplied through the power connectors 801 and/or VRM circuit 803 and convert the voltage of the supplied power into a DC voltage meeting the DC power specifications of the respective CPUs 809 and/or computer chips 811. The chip embedded DC-DC converters 851 can be smaller than the DC-DC converters 807 of FIG. 8A. Accordingly, the motherboard can have room for additional computer chips 853. Areas previously occupied by the DC-DC converter 807 may now be open areas 855 available for other components or can be left open to improve airflow.

Additional Embodiments

In some example embodiments, one or more switches (e.g., eGaN switches) (e.g., monolithic or standalone) can be used in a chip embedded DC-DC synchronous buck converter with an inductor where the embedded IC chip includes a PWM controller and a driver. In comparison to a MOSFET based DC-DC synchronous buck converter, the chip embedded DC-DC converter can be switched at higher speeds with lower switching losses, can switch more efficiently at high switching speeds (e.g., around 5 MHz or at other speeds described herein), and the eGaN switches can have about five times lower $Q_G$.

Some embodiments realize improved efficiency gains of about 30% lower power losses in comparison to alternative designs when switching at the same speeds, such as 3 MHz.

An example embodiment of a chip embedded DC-DC converter can be packaged in about a 3×3×1.5 mm package, switch at ranges from about 1-5 MHz, and supply about 6 A of current. In comparison, various wire-bond DC-DC converter designs for similar amperage can be about 12×12 mm in area and switch at about 600 kHz.

An example embodiment of a chip embedded DC-DC converter can receive a 12 V power supply and output a DC signal that is about 1.2 V and about 10 A. The chip embedded DC-DC converter can switch at about 1 MHz and include an inductor that is about 300 nH.

Some example embodiments of a chip embedded DC-DC converter include 25 A buck converters that can fit in package that is about 6×6 mm or 7×7 mm.

Some embodiments of chip embedded DC-DC converters include eGaN switches. The switches can operate at about 5 MHz, and the chip embedded DC-DC converters can operate with efficiency similar to MOSFET based DC-DC converters operating at about 1 MHz. This can result in smaller package sizes and overall higher system performance due to faster responses to transient loads.

Example Method

Figure 9:
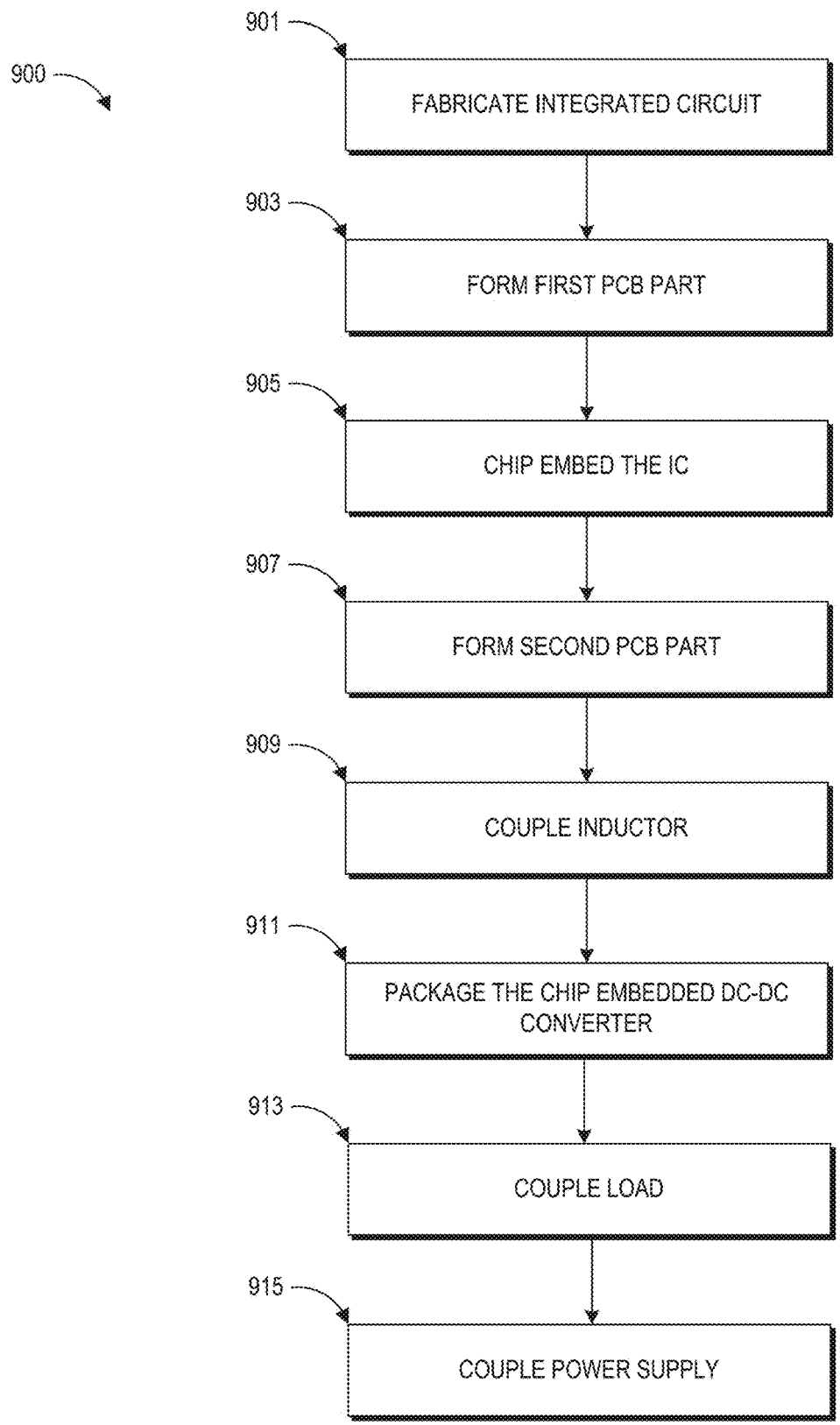
FIG. 9 shows a flowchart of an example method for making and using a chip embedded DC-DC converter.

FIG. 9 shows a flowchart of an example method 900 for making and using a chip embedded DC-DC converter.

At block 901, an integrated circuit can be fabricated. The integrated circuit can be an IC chip that includes at least one of: a driver, a PWM controller, and one or more power switches. The IC chip can include a plurality of: a driver, a PWM controller, power switches, an inductor, a capacitor, or other component of a DC-DC converter. In some embodiments, the one or more power switches can be eGaN switches, gallium arsenide switches, or other types of high performance switch.

At block 903, a first PCB part can be formed. Forming the first PCB part can include providing a PCB layer or insulator, masking, etching, drilling vias, filling vias, depositing conductive traces and pads, providing some or all of the I²C and/or PMBUS, and the like.

At block 905, the IC chip can be embedded using chip embedded technology. In some embodiments, a cavity could be formed (e.g., in a PCB), for example using machining or etching techniques, and the IC chip could be placed into the cavity. The IC chip can be coupled to the first PCB part, into a PCB, on a PCB layer, between multiple PCB layers, between multiple PCBs, etc. The IC chip can be chip embedded face up or face down. In some embodiments, the IC is embedded using a flip chip technique. The IC chip or die can be coupled to a die attachment or bonding material. In some embodiments, other components can also be embedded in the PCB. For example, in embodiments where one or more switches (e.g., monolithic eGaN power switches) are separate from the IC chip, the one or more switches (e.g., monolithic eGaN switches) can also be embedded in the PCB.

At block 907, the insulators and conducive routing for a second part of the PCB can be formed. This can include providing an additional PCB layer or insulator, masking, etching, drilling or exposing vias, filling vias, depositing conductive traces and pads, providing some or all of the I²C and/or PMBUS, and the like. In some embodiments, the actions described with respect to blocks 903, 905, and 907 be integrated together and/or overlap. In blocks 903, 905, and 907, the conductors (e.g., vias and traces) can be formed to couple components in a DC-DC converter arrangement (e.g., as shown in FIG. 1 and FIG. 3).

At block 909, an inductor can be coupled. The inductor can be coupled to the top of the PCB. The inductor can be stacked, at least partially, with one or more of the other components of the DC-DC converter such as the IC chip. The inductor can be stacked, at least partially, with one or more of the other components of the DC-DC converter such as the PWM controller, driver, and switches. In some embodiments, other surface components such as capacitors can also be coupled. Accordingly, the components of a chip embedded DC-DC converter can be coupled together. In some embodiments, the inductance of the inductor can be selected based at least in part on an overcurrent limit, for example, as described with respect to FIG. 1. In some embodiments, an overcurrent limit can be determined, adjusted, and/or trimmed based at least in part on a saturation limit of the inductor. In some embodiments, the inductor and overcurrent limit values can be determined and/or designed by a single person, designer, design team, and/or manufacturer.

At block 911, the chip embedded DC-DC converter can be packaged. This can include packaging the chip embedded DC-DC converter as a single discrete component. The package can include the inductor and capacitor such that the DC-DC converter can operate without external inductors or capacitors.

At block 913, a load can be coupled to the DC-DC converter. This can include, for example, coupling an output of the packaged chip embedded DC-DC converter through a trace on a separate motherboard to an electronic device. In some embodiments, the DC-DC converter can be coupled near the point of load to reduce some parasitic effects.

At block 915, a power supply can be coupled to the packaged chip embedded DC-DC converter. Accordingly, the chip embedded DC-DC converter can use the supplied power to provide a DC output voltage to power the electronic device.

Although blocks 911, 913 describe packaging and using the packaged chip embedded DC-DC converter with a separate PCB of a load device, in some embodiments, the techniques described herein can be applied to the end-device PCB.

Multi-Inductor Chip Embedded DC-DC Converter

The chip embedded DC-DC converter technology described herein can be extended to multi-inductor implementations. This can include, for example, dual buck converters, dual boost converters, and voltage converters with 2, 3, 4, 5, 6, 8, 16, or any number of inductors. The multiple inductors can be arranged in parallel. The output of the multiple inductors (e.g., in parallel arrangement) can be coupled to an energy storage circuit such as a capacitor or LC resonant circuit. Each respective inductor can be coupled to a respective pair of switches. Each respective pair of switches can be driven by a respective driver. Each driver can be driven with PWM signals that are out of phase with PWM signals provided to the other drivers. Each PWM signal can have an on time that is a small enough fraction of a shared period such that the superimposed combination of driver signals has an effective period that is shorter than the shared period. In some embodiments, the multi-inductor chip embedded DC-DC converter can be formed by duplicating some or all of the components (e.g., the switches, the inductor, parts of the integrated circuit) disclosed herein (e.g., shown in FIG. 1).

The various embodiments disclosed herein can have one, some combinations, or all of the following features. Multi-inductor chip embedded DC-DC converters can operate faster and more efficiently than single inductor chip embedded DC-DC converters. The current through the DC-DC converter can be divided among the multiple inductors. The heat can be spread out over multiple inductors. Smaller sized individual inductors can be used. The current density can be increased. The overall size of the DC-DC converter can be reduced. Switches can switch fewer numbers of times. The life expectancies of the switches can be extended. The life expectancies of the inductors can be improved. Fewer and/or smaller number of output capacitors can be used. There can be a faster transient response. There can be a lower fluctuation in output voltage when current demand changes. The DC-DC converter can operate at higher frequencies and/or use smaller inductors (e.g., in accordance with Eq. 2). The size of the DC-DC converter can be reduced. Each pair of switches can operate at a maximum frequency that is efficient, yet the overall frequency can be greater than the individual frequency of any pair of switches.

In some embodiments, power losses can be reduced. Using the equation $P=I^2*R$, it can be seen that power loss increases with DC current (I). However, by splitting the current among multiple inductors, the overall power loss can be reduced. Furthermore, the resistance of each inductor also decreases. For example, by dividing the current ($I_o$) among two inductors, $P=2*[(I_o/2)^2*R/2]=[I_o^2*R]/2$, it can be seen that power loss can be reduced by half. Accordingly, the distributed power delivery among multiple inductors provides improved efficiency. As demand for high current density DC-DC converters increases, multi-inductor, chip embedded DC-DC converters can provide small sizes and high current densities with less power loss.

Figure 14:
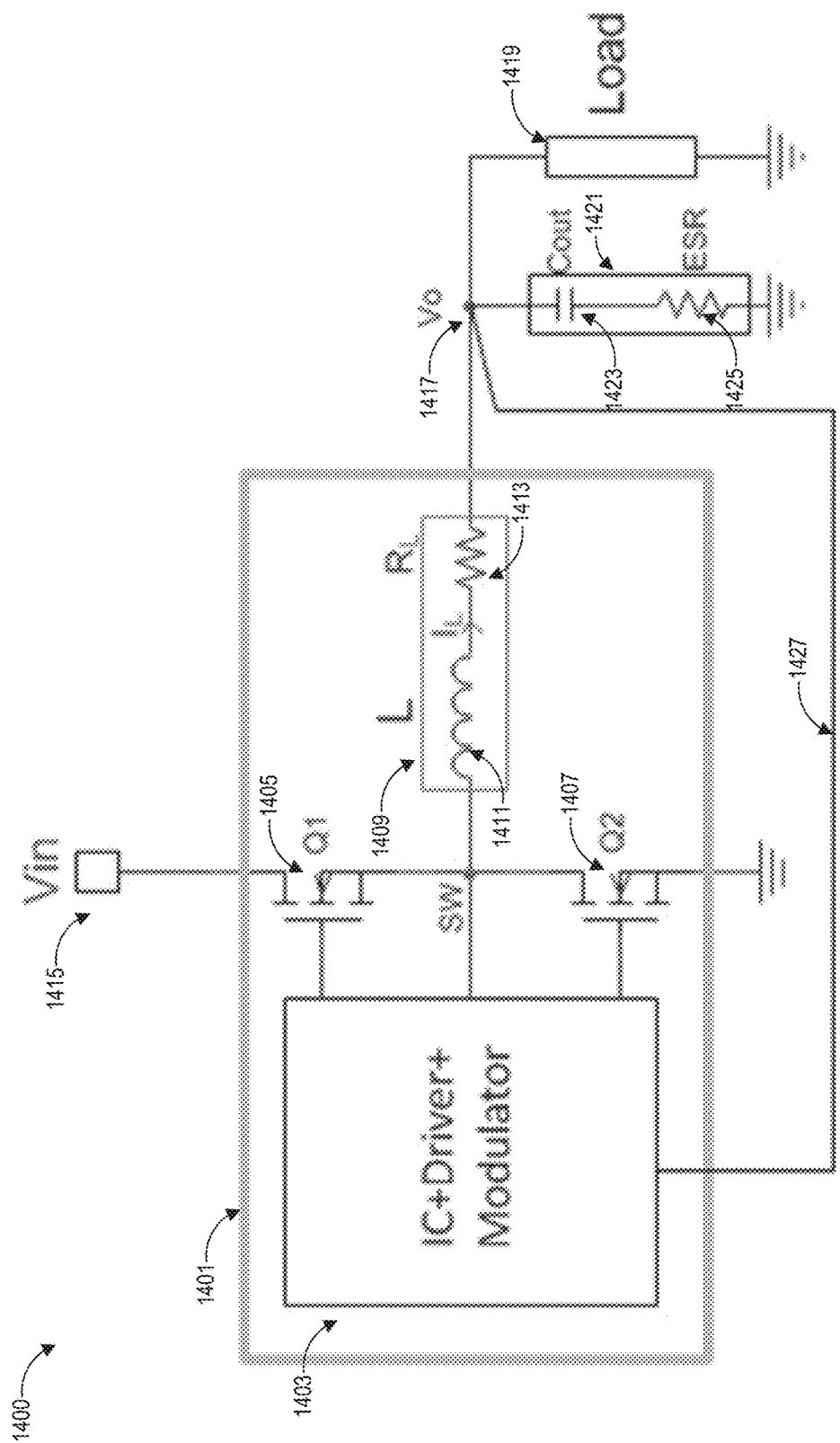
FIG. 14 shows an example chip embedded DC-DC converter with an external ripple voltage feedback circuit.

In some embodiments, the smaller inductors in a multi-inductor, chip embedded DC-DC converter allows for faster transient responses to changes in the demanded current. For example, as shown in FIG. 8B, a chip embedded DC-DC converter may provide DC power to a CPU. The CPU may suddenly experience a heavy computational load (e.g., utilize all cores and/or boosting its switching frequency), causing a sudden increase in the power drawn (e.g., scaling from 1 amp to 10 amps in the ns range). As energy is drawn from an output capacitor (e.g., output capacitor 111 of FIG. 1, FIG. 2), the voltage across the output capacitor may fall too fast beyond the DC power specifications (e.g., <1% drop in voltage) required by the CPU, risking stop errors. Accordingly, a feedback system (e.g., as shown in FIG. 14, FIG. 16, and FIG. 17) may be implemented to increase the power delivered through the inductor to the capacitor and prevent the voltage drop. However, a high inductance resists the change in power delivery. Because a multi-inductor system uses smaller inductors, the transient feedback response of a multi-inductor, chip embedded DC-DC converter can be faster than the transient feedback response of a DC-DC converter with fewer, larger inductors, and the response can have a lower output voltage drop. The DC-DC converters disclosed herein that have higher switching frequencies can utilize smaller inductors, so that the single-inductor embodiments described herein can have improved response to transient loads.

Example Dual Buck Converters

Figure 10:
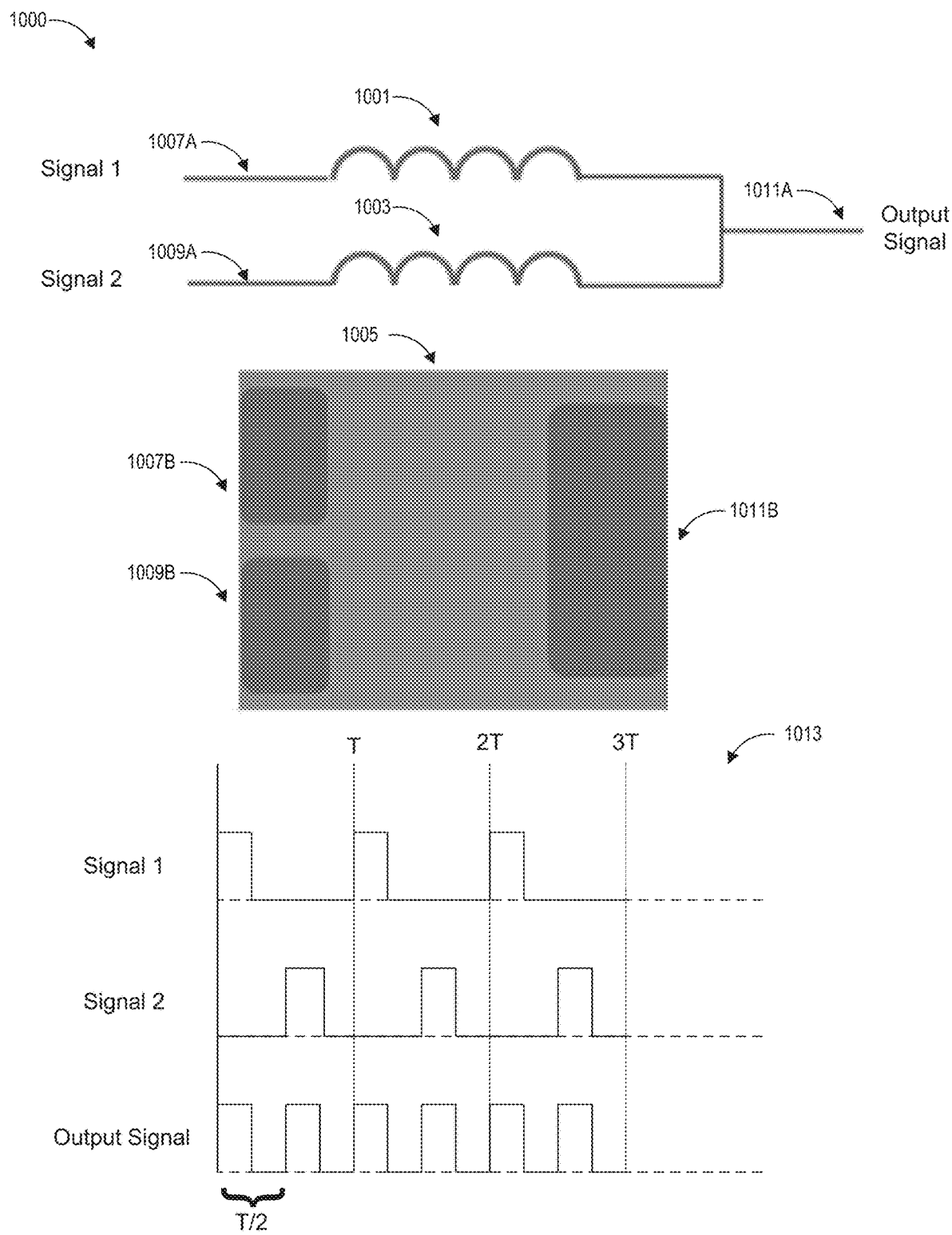
FIG. 10 shows an example dual inductor design for a dual buck converter using a chip embedded DC-DC converter.

FIG. 10 shows an example dual inductor design for a dual buck converter 1000 using a chip embedded DC-DC converter. A dual buck converter can use two parallel inductors instead of using a single inductor.

FIG. 10 includes a first inductor 1001, a second inductor 1003, and a PCB 1005 that includes a chip embedded IC and other components (shown in FIGS. 11A, 11B, 11C and 11D, not visible in FIG. 10). A first input node 1007A to the first inductor 1001 can correspond to a first pad 1007B on the PCB 1005. A second input node 1009A to the second inductor 1003 corresponds to a second pad 1009B on the PCB 1005. A voltage output node can 1011A correspond to a voltage output pad 1011B on the PCB 1005. A graph 1013 shows the waveforms for Signal 1, Signal 2, and the Output Signal.

The dual buck converter can be configured to include two inductors 1001, 1003. The two inductors 1001, 1003 can be surface mounted on the PCB 1005. In various embodiments, the two inductors 1001, 1003 can be two separate inductors positioned side by side, two separate inductors vertically stacked on top of the other, or it a single magnetic core with two inductor windings.

Signal 1 is provided to the first input node 1007A. Signal 1 has a period of T. Signal 2 is provided to the second input node 1009A. Signal 2 also has a period of T. Signals 1 and 2 are out of phase with each other and have an "on" time that is less than 50% of the period T. An Output Signal is formed by the combination of Signal 1 and Signal 2. For each pulse, the output signal has the same "on" time as Signal 1 and Signal 2. The "on" times of Signal 1 and Signal 2 are the same, and the effective period of the Output Signal is reduced by half (the frequency is doubled).

Figure 12:
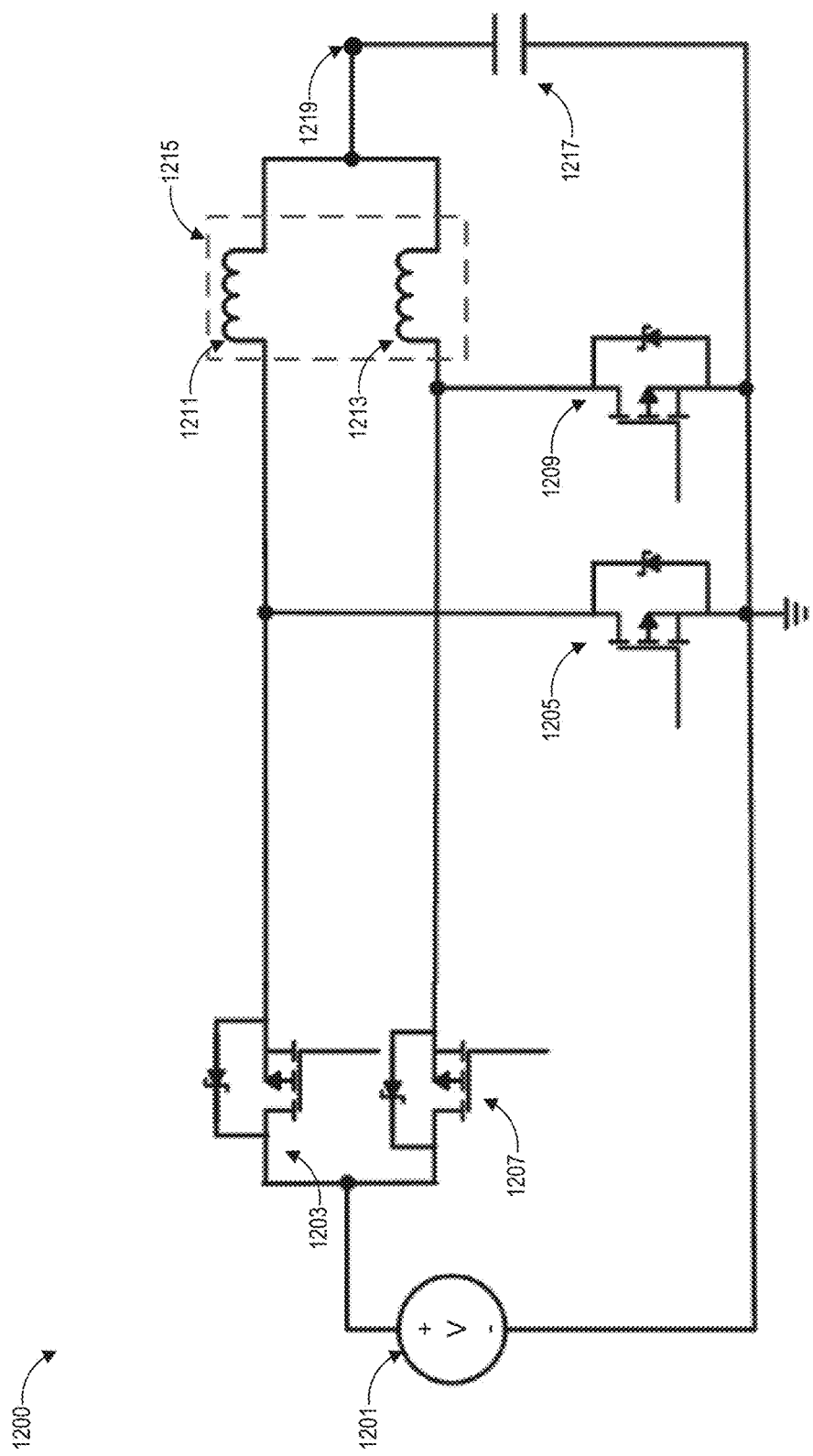
FIG. 12 shows an example circuit level schematic of a dual buck converter including a chip embedded DC-DC converter.

FIG. 12 shows an example circuit level schematic 1200 of a dual buck converter including a chip embedded DC-DC converter. The schematic includes a voltage source 1201, a first switch 1203 of a first switch pair, a second switch 1205 of the first switch pair, a third switch 1207 of a second switch pair, a fourth switch 1209 of the second switch pair, a first inductor 1211, a second inductor 1213, an output capacitor 1217, and a voltage output node 1219.

The pair 1215 of inductors 1211, 1213 can be coupled outside of the PCB. The switches 1203, 1205, 1207, 1209 can be embedded in the PCB, either as standalone chips or as part of an IC chip that includes other components (e.g., a driver, PWM controller, other switches). The capacitor 1217 can be coupled outside of the PCB or inside of the PCB. The inductors 1211 and 1213 can use a shared common core, or can use separate cores.

The voltage source 1201 can be coupled to a drain of the first switch 1203. The source of the first switch 1203 can be coupled to a first node of the first inductor 1211. The source of the first switch 1203 can also be coupled to a drain of the second switch 1205. The gates of the first switch 1203 and the second switch 1205 can be coupled to a driver (not shown in FIG. 12). The driver can drive opposite control signals to the first switch 1203 and the second switch 1205, turning the first switch 1203 and the second switch 1205 on and off in alternation, such that one of the first switch 1203 and the second switch 1205 is on while the other one is off. While the first switch 1203 is on and the second switch 1205 is off, energy can be provided from the voltage source 1201 to the inductor 1211 and/or capacitor 1217, where the energy can be stored, causing the output voltage to rise. While the first switch 1203 is off and the second switch 1205 is on, energy can be drained from the inductor 1211 and/or capacitor 1217, causing the output voltage to fall.

The voltage source 1201 can be coupled to a drain of the third switch 1207. The source of the third switch 1207 can be coupled to a first node of the second inductor 1213. The source of the third switch 1207 can also be coupled to a drain of the fourth switch 1209. The gates of the third switch 1207 and the fourth switch 1209 can be coupled to a driver (not shown in FIG. 12). Accordingly, the driver can drive opposite control signals to the third switch 1207 and the fourth switch 1209, turning the third switch 1207 and the fourth switch 1209 on and off in alternation, such that one of the third switch 1207 and the fourth switch 1209 is on while the other one is off. While the third switch 1207 is on and the fourth switch 1209 is off, energy can be provided from the voltage source 1201 to the inductor 1213 and/or capacitor 1217 where the energy can be stored, causing the output voltage to rise. While the third switch 1207 is off and the fourth switch 1209 is on, energy can be drained from the inductor 1213 and/or the capacitor 1217, causing the output voltage to fall.

The second node of the first inductor 1211 and the second node of the second inductor 1213 can be coupled to the output node 1219 and also coupled to the output capacitor 1217, also referred to as a smoothing capacitor. The voltage at the output node 1219 can be affected by the energy stored in the capacitor 1217. The energy stored in the capacitor 1217 can increase when current flows from the capacitor 1217 from either the second node of either the first inductor 1211 or the second node of the second inductor 1213. Accordingly, a small signal ripple is provided to the capacitor as the switches provide or discharge energy.

The first pair of switches 1203, 1205 can be driven out of phase from the second pair of switches 1207, 1209. The first pair of switches 1203, 1205 can also be driven at the same frequency and with the same period as the second pair of switches 1207, 1209. Accordingly, in some embodiments, at most one of the upper switches 1203, 1207 will be on at a given time. The four switches 1203, 1205, 1207, 1209 can be driven with four respective signals that are all out of phase with each other. The first pair of switches 1203, 1205 and the first inductor 1211 provide DC bucking functionality in parallel with the second pair of switches 1207, 1209 and the second inductor 1213.

Figure 13A:
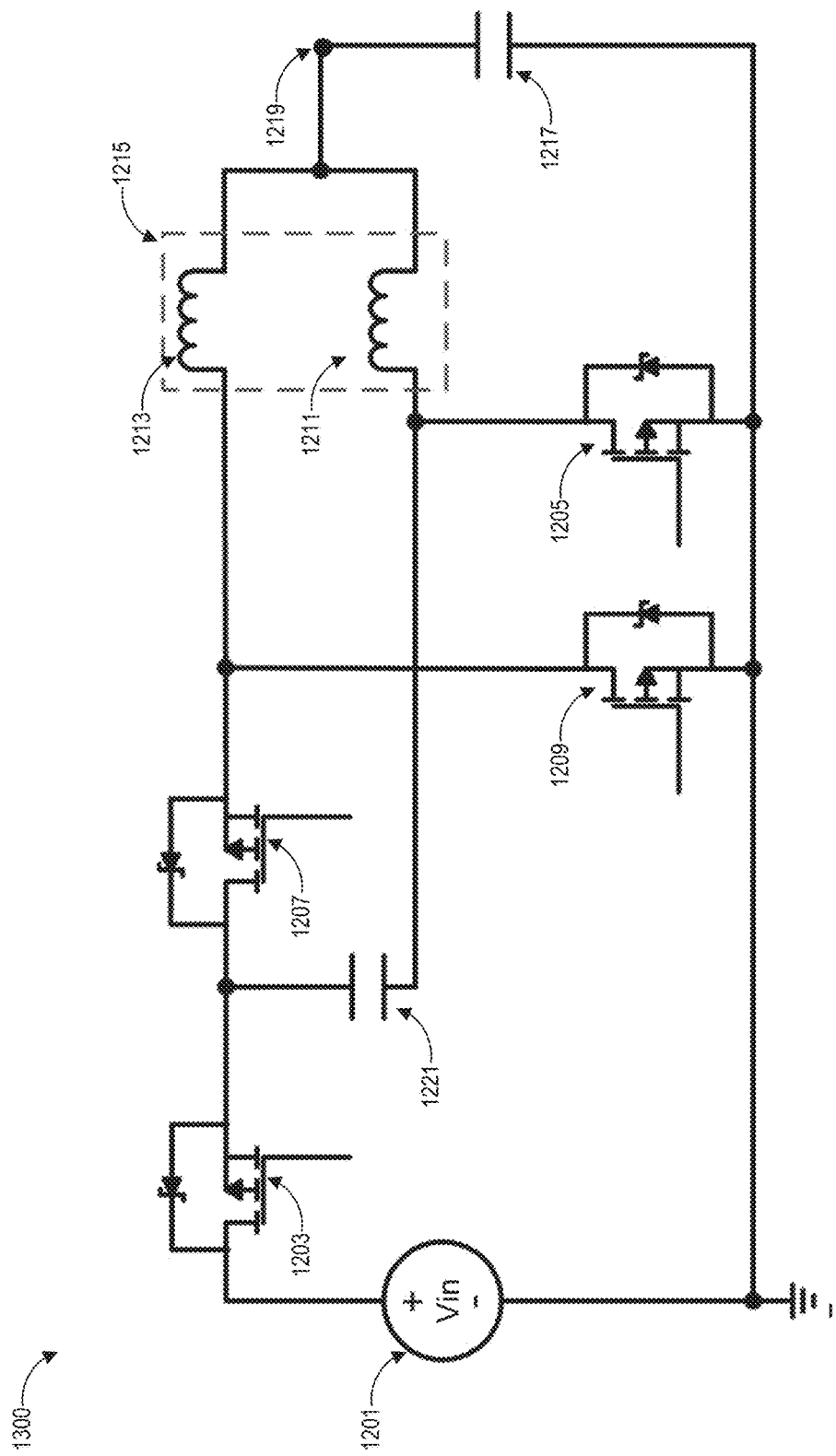
FIG. 13A shows an example circuit level schematic of a DC-DC converter including a chip embedded DC-DC converter.

FIG. 13A shows an example circuit level schematic 1300 of a DC-DC converter including a chip embedded DC-DC converter. The components of FIG. 13A can be the same as or similar to those in FIG. 12. The DC-DC converter of FIG. 13A can include an additional capacitor 1221. The capacitor 1221 can store energy when switch 1203 is turned on. In some embodiments, energy can be stored such that the capacitor 1221 charges to about half the voltage of the voltage supply 1201. When switch 1203 is turned on, switch 1207 is turned off, and switch 1205 is turned off, transient current can flow through the capacitor 1221 to inductor 1211. When switch 1207 is turned on and switch 1209 is turned off, the capacitor 1221 can provide power to switch 1207 and cause current to flow to inductor 1213. Capacitor 1221 also acts as an AC coupling capacitor between switch 1207 and switch 1205. The components in FIG. 13 are also arranged with a modified layout compared to those in FIG. 12, however, the DC-DC converters in FIG. 12 and FIG. 13A can function similarly. The inductors 1211 and 1213 can use a shared common core, or can use separate cores.

Figure 13B:
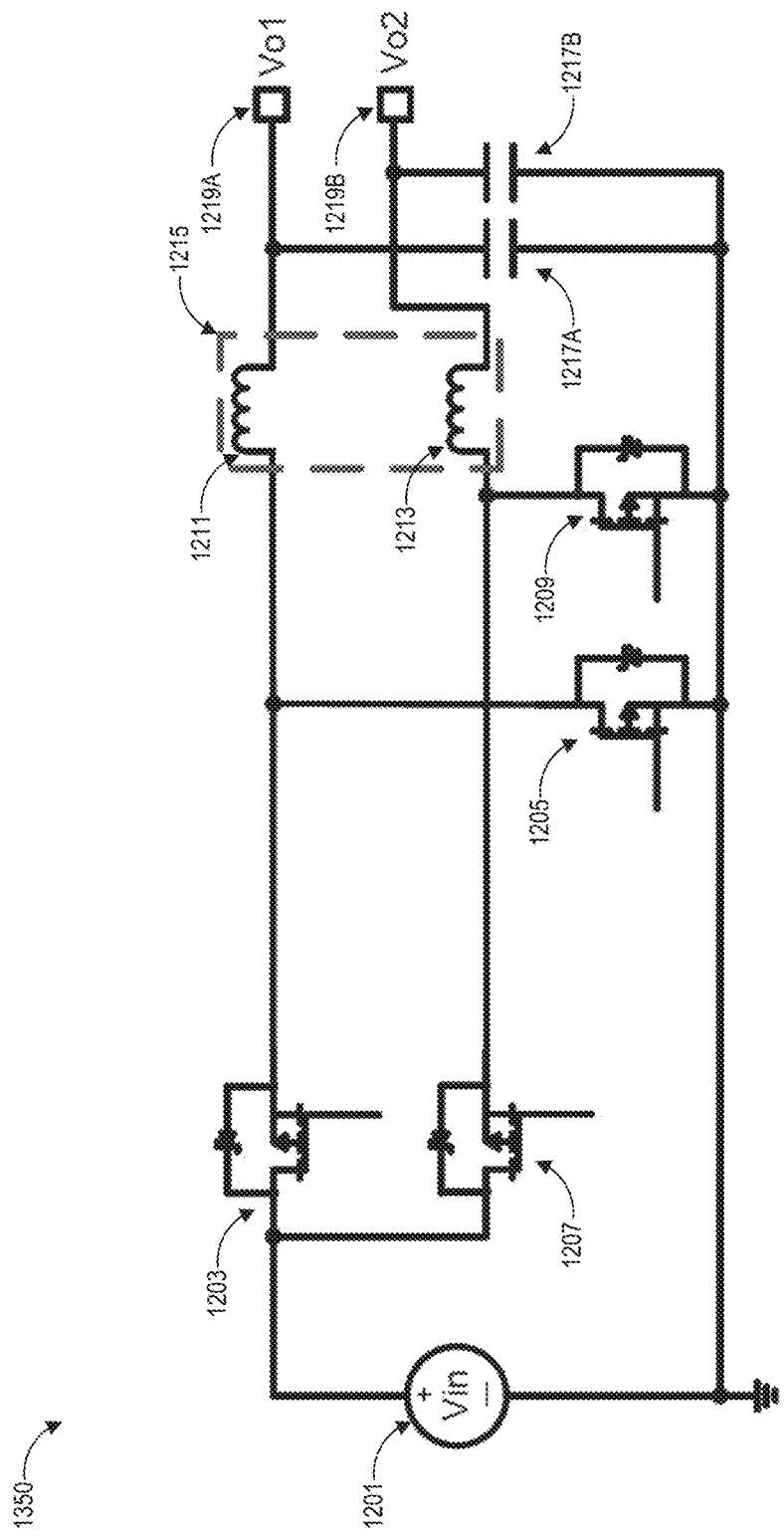
FIG. 13B shows an example circuit level schematic of a DC-DC converter including a chip embedded DC-DC converter.

FIG. 13B shows an example circuit level schematic 1350 of a DC-DC converter including a chip embedded DC-DC converter. The components of FIG. 13 can be the same as or similar to those in FIG. 12. The first pair of switches 1203, 1205 and first inductor 1211 can be coupled to a first capacitor 1217A and configured to provide a first output voltage at a first output node 1219A. The second pair of switches 1207, 1209 and second inductor 1213 can be coupled to a second capacitor 1217B and configured to provide a second output voltage at a second output node 1219B. The output voltages at the first and second output nodes 1219A, 1219B can be the same voltage or can be different voltages. In some embodiments, a driver (e.g., as shown in FIG. 1, not shown in FIG. 13B) can separately drive the first pair of switches 1203, 1205 and second pair of switches 1207, 1209 such that different voltages are provided at the different nodes 1219A, 1219B. The inductors 1211 and 1213 can use a shared common core, or can use separate cores.

The embodiments shown in FIGS. 13A and 13B can be implemented on one or a plurality of IC dies. For example, in FIG. 13A, the switches 1203, 1205, 1207, 1209 can all be included in a single IC (e.g., a monolithic eGaN IC). In some embodiments, the switches 1203, 1205, 1207, 1209 can be divided among two or more separate devices. The embodiments shown in FIGS. 13A and 31B can also be controlled by one or more drivers and/or PWM controllers. For example, a first PWM controller can be coupled to a first driver that drives a first pair of the switches from among switches 1203, 1205, 1207, 1209, and a second PWM controller can be coupled to a second driver that drives a second pair of switches from among switches 1203, 1205, 1207, 1209.

Example Designs for Chips Embedded in Dual Buck Converters

Figure 11A:
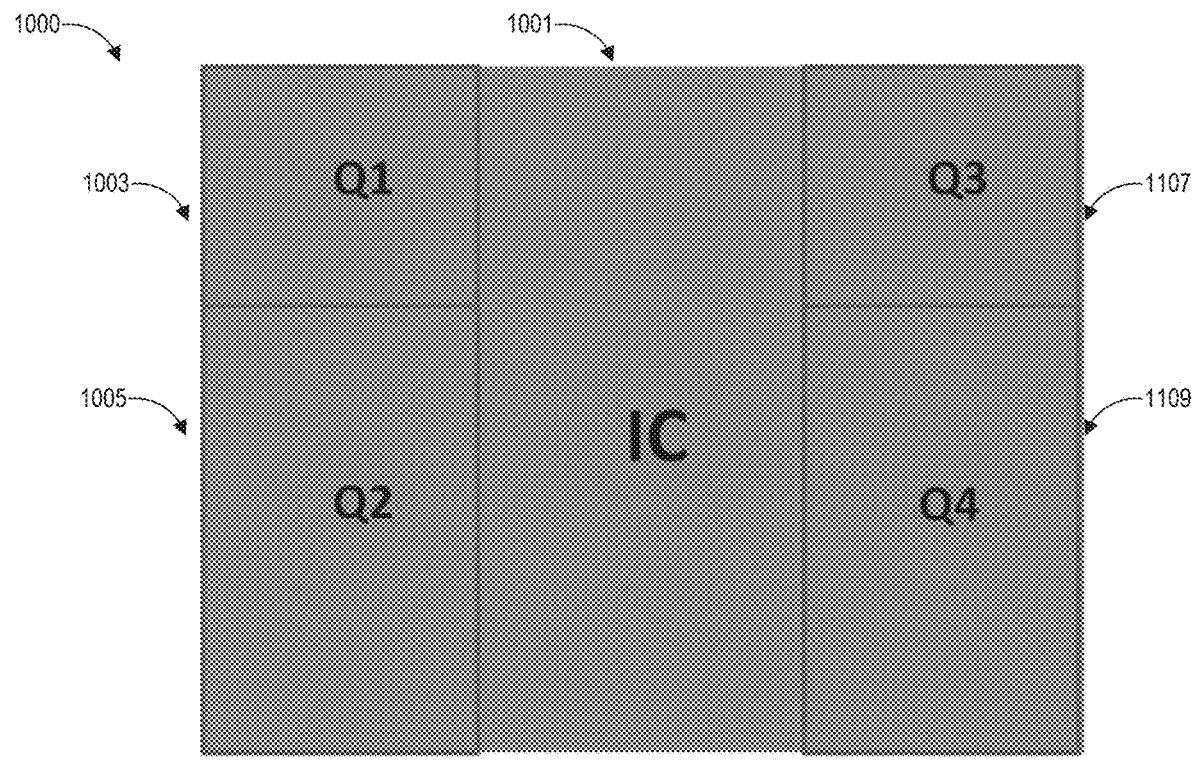
FIG. 11A shows a first example layout design for the embedded chip in a dual buck converter.

FIG. 11A shows a first example layout design 1100 for the embedded chip in a dual buck converter. The design includes an IC section 1101, a first power switch 1103 of a first switch pair, a second power switch 1105 of the first switch pair, a third power switch 1107 of a second switch pair, and a fourth power switch 1109 of the second switch pair.

In the embodiment of FIG. 11A, the IC section 1101, the first power switch 1103, the second power switch 1105, the third power switch 1107, and the fourth power switch 1109 are all included in the same IC chip. The IC section 1101 can include a PWM controller and a driver. The driver can be configured to drive the first switch pair out of phase with the second switch pair. The driver can be configured to drive the first switch pair and the second switch pair with the same period and the same frequency. The driver can also be configured to drive the switches in each switch pair in alternation. In some embodiments, the IC section 1101 includes a first driver configured to drive the first switch pair and a second driver configured to drive the second switch pair. The PWM controller can provide first PWM signals to the first driver and second PWM signals to the second drivers, and the first and second PWM signals can be out of phase with each other.

Figure 11B:
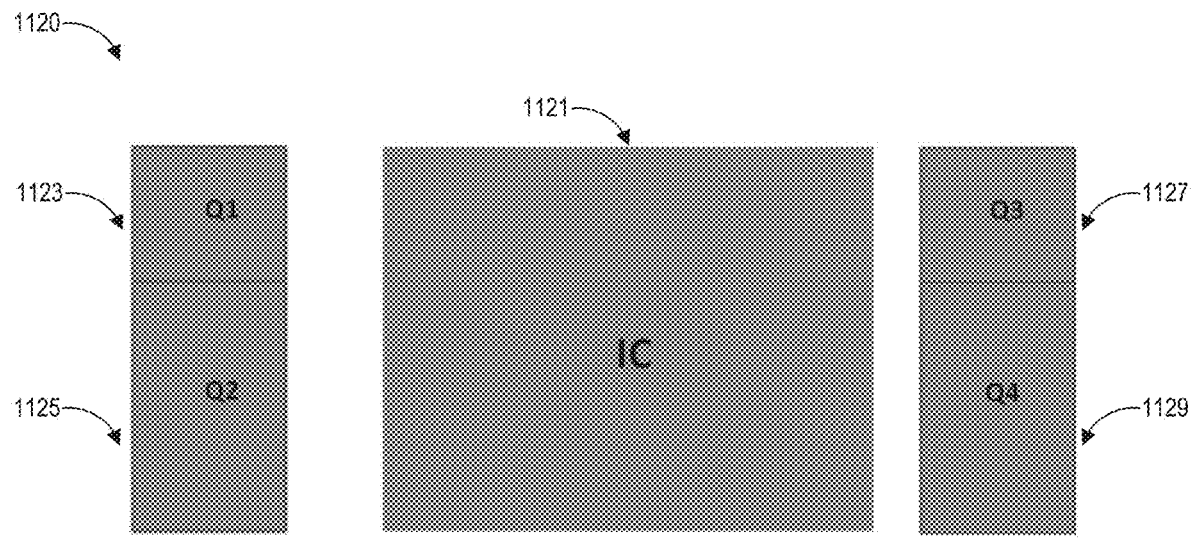
FIG. 11B shows a second example layout design for embedded chips in a dual buck converter.

FIG. 11B shows a second example layout design 1120 for embedded chips in a dual buck converter. The design includes an IC chip 1121, a first power switch 1123 of a first switch pair, a second power switch 1125 of the first switch pair, a third power switch 1127 of a second switch pair, and a fourth power switch 1129 of the second switch pair.

The first power switch 1123 and the second power switch 1125 can be part of a first monolithic switch chip, such as a monolithic eGaN switch chip. The third power switch 1127 and the fourth power switch 1129 can part of a second monolithic switch chip. In some embodiments, the first monolithic switch pair and the second monolithic switch pair can be part of the same monolithic chip. In some embodiments, the first monolithic switch pair and the second monolithic switch pair can be separate monolithic chips. The IC chip 1121 and the separate monolithic chips can be embedded in a PCB. The IC section 1121 can include a PWM controller and a driver. The driver can be configured to drive the first monolithic switch pair out of phase with the second monolithic switch pair. The driver can be configured to drive the first monolithic switch pair and the second monolithic switch pair with the same period and the same frequency. The driver can also be configured to drive the switches in each monolithic switch pair in alternation. In some embodiments, the IC section 1121 includes a first driver configured to drive the first monolithic switch pair and a second driver configured to drive the second monolithic switch pair. The PWM controller can provide first PWM signals to the first driver and second PWM signals to the second drivers, and the first and second PWM signals are out of phase with each other.

Figure 11C:
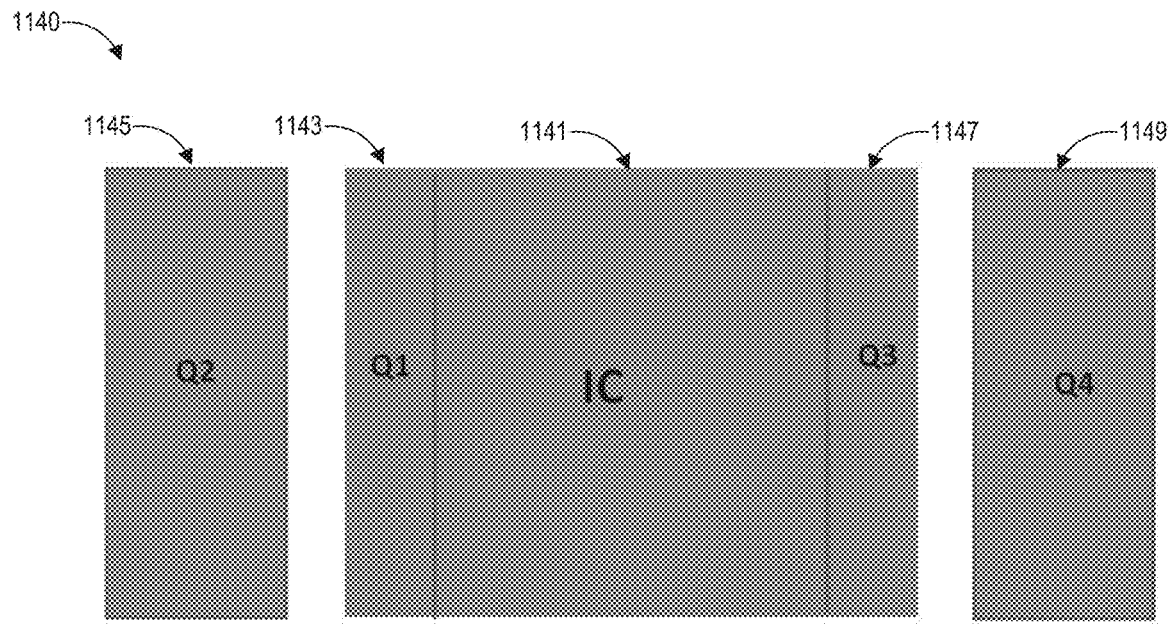
FIG. 11C shows a third example layout design for embedded chips in a dual buck converter.

FIG. 11C shows a third example layout design 1140 for embedded chips in a dual buck converter. The design includes an IC chip section 1141, a first power switch 1143 of a first switch pair, a second power switch 1145 of the first switch pair, a third power switch 1147 of a second switch pair, and a fourth power switch 1149 of the second switch pair.

The IC chip section 1141, the first power switch 1143 and the third power switch 1147 can be part of a first IC chip. The second power switch 1145 and the fourth power switch 1149 can be separate chips, such as separate monolithic eGaN chips, from the first IC chip. In some embodiments, the second power switch 1145 and the fourth power switch 1149 can be part of the same monolithic chip. One, some, or all of the chips can be embedded in the PCB. The IC section 1141 can include a PWM controller and a driver. The driver can be configured to drive the first switch pair out of phase with the second switch pair. The driver can be configured to drive the first switch pair and the second switch pair with the same period and the same frequency. The driver can also be configured to drive the switches in each switch pair in alternation. In some embodiments, the IC section 1141 includes a first driver configured to drive the first switch pair and a second driver configured to drive the second switch pair. The PWM controller can provide first PWM signals to the first driver and second PWM signals to the second drivers, and the first and second PWM signals are out of phase with each other.

Figure 11D:
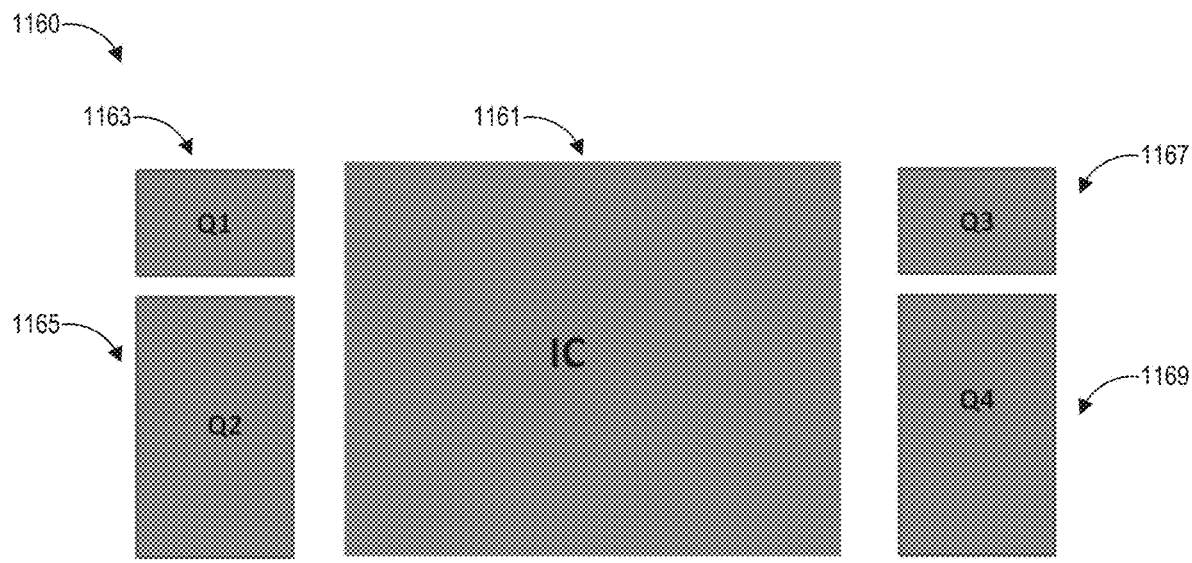
FIG. 11D shows a fourth example layout design for embedded chips in a dual buck converter.

FIG. 11D shows a fourth example layout design 1160 for embedded chips in a dual buck converter. The design includes an IC chip section 1161, a first power switch 1163 of a first switch pair, a second power switch 1165 of the first switch pair, a third power switch 1167 of a second switch pair, and a fourth power switch 1169 of the second switch pair.

The IC chip section 1161, the first power switch 1163, the second power switch 1165, the third power switch 1167, and the fourth power switch 1169 can be parts of separate IC chips. One, some, or all of the separate IC chips can be embedded in a PCB. The IC section 1161 can include a PWM controller and a driver. The driver can be configured to drive the first switch pair out of phase with the second switch pair. The driver can be configured to drive the first switch pair and the second switch pair with the same period and the same frequency. The driver can also be configured to drive the switches in each switch pair in alternation. In some embodiments, the IC section 1161 includes a first driver configured to drive the first switch pair and a second driver configured to drive the second switch pair. The PWM controller can provide first PWM signals to the first driver and second PWM signals to the second drivers, and the first and second PWM signals are out of phase with each other.

Various additional arrangements are possible, such that any combination of components 1161, 1163, 1165, 1167, and 1169 can be combined into any number of IC chips. In some embodiments, a multi inductor DC-DC converter can be created by combining individual packages of individual or multi inductor DC-DC converters.

Additional Example Features of Multi-Inductor Chip Embedded DC-DC Converters

In some chip embedded DC-DC converters, the inductor is the largest physical component. A multi-inductor chip embedded DC-DC converter can instead use multiple, smaller inductors coupled in parallel. Switches can be driven out of phase such that the multiple inductors charge and discharge energy out of phase. In some embodiments, the outputs of the multiple inductors are coupled in parallel such that the output ripple of the multiple inductors is at a higher frequency than the output ripple of any individual inductor. In some embodiments, the outputs of the multiple inductors are coupled in parallel, and the output ripple of the multiple inductors has the same period as the output ripple of the individual inductors.

The output ripple frequency of multiple inductor DC-DC converters can be higher, and the number and/or capacitance of the output capacitor(s) can be reduced, and smaller output capacitor(s) can be used, in some embodiments.

As described above, the multiple inductor system can have a higher effective switching speed as compared with a single inductor system. In some embodiments, this can be done without increasing the switching speed of the switches; instead, multiple switches can operate out of phase with each other. Accordingly, a higher effective switching speed can be reached without pushing individual switches to higher, inefficient switching speeds.

In accordance with Eq. 2, due to higher effective switching speed of the multiple inductors arranged in parallel, the inductance of the multiple inductors can be decreased. Accordingly, the inductors can be arranged in parallel to lower the inductance, and/or smaller inductors with smaller inductances can be used. Because smaller inductors can be used, the overall DC-DC converter size can be reduced, especially if the inductor(s) is (are) the largest component.

In some embodiments, further synergy can result from using smaller inductors: the switching speeds of the switches can increase because the inductance load of the switches is reduced. This can lead to faster efficient switching speeds, further lowering the inductance according to Eq. 2, and so on.

In some embodiments, a multi-inductor chip embedded DC-DC converter can use a smaller output capacitor as compared to the output capacitor in a single inductor DC-DC converter.

Examples of Chip Embedded DC-DC Converter with Feedback

FIG. 14 shows an example chip embedded DC-DC converter 1400 with an external ripple voltage feedback circuit.

The chip embedded DC-DC converter 1400 can include an embedded IC chip 1403 that can include a driver and/or modulator, as discussed herein. The IC chip can be embedded in a PCB 1401. The chip embedded DC-DC converter 1400 also includes a first power switch 1405, a second power switch 1407, and an inductor 1409. The inductor 1409 is schematically represented to show its inductance component 1411 and its internal direct current resistance (DCR) component 1413.

The chip embedded DC-DC converter 1400 receives an input voltage at a voltage input node 1415 and provides an output voltage at an output voltage node 1417. An output capacitor 1421 is coupled to the output node 1417, and the output capacitor is schematically represented to show its capacitive component 1423 and its equivalent series resistance (ESR) 1425. A feedback path 1427 is coupled from the output node to the embedded IC chip 1403.

The chip embedded DC-DC converter 1400 can receive the input voltage and can generate the output voltage as previously described herein. The output voltage can have small fluctuations, or ripples, as the switches turn on and off. The ripple voltage ($V_{ESR}$) can be calculated by multiplying the inductor current $I_L$ by the ESR. The feedback path 1427 senses the ripples and/or DC output voltage. A feedback indication of the ripple and/or DC output voltage is provided to the embedded IC chip 1403. The modulator in the embedded IC chip 1403 can use the feedback to control the switches 1405, 1407 to decrease the output voltage if the output voltage is too high, and to increase the output voltage if the output voltage is too low.

Feedback systems can use current mode control schemes and voltage mode control schemes to ensure DC-DC operational stability over a wide range of duty cycles. In current mode control schemes, a slope compensation scheme can be used and implemented with external components that may add to increased size and cost. Current mode control schemes may use type II compensation for loop stability and may have slower loop responses. In voltage mode control schemes, a voltage error can be amplified, fed back, and compensated for.

In some embodiments, the modulator can use a constant on time frequency modulation scheme, a constant off time frequency modulation scheme, a pulse width modulation scheme, or other scheme. Constant on time and constant off time schemes can provide for stable DC-DC operation with high performance. In some embodiments, it can be desirable for the modulator to detect the ripple voltage to trigger certain control events. For example, in a constant on time scheme or constant off time scheme, the modulator can detect the AC ripple in order to generate an on or off pulse with a constant on or off time respectively, thereby modulating the frequency and affecting the periods of the control signals sent to switches 1405, 1407. For example, in a constant on time scheme, an on pulse of a fixed width can be provided to increase the output voltage in response to detecting a low output voltage in comparison to a reference voltage and/or in response to detecting a sufficient amount of inductor current ripple. Accordingly, for a constant on time scheme, each pulse has the same duration in the on state, and the modulation is achieved by performing more or fewer pulses per time (e.g., the off time between pulses would vary). A constant off time scheme can be similar to the constant on time scheme described herein, except that the off time between pulses is constant, and the modulation can be achieved by width of the on pulses. In another example voltage mode system, a frequency can be fixed, and the duty cycle of the pulse can be modulated. Variations can include leading or trail edge modulation schemes. Any suitable modulation scheme can be used. Accordingly, the ESR 1425 can be designed and/or selected such that a sufficiently large $V_{ESR}$ can be detected by the modulator.

Some embodiments disclosed herein provide solutions to a number of conflicting design challenges. Non-delayed feedback paths can provide fast responses to changes in output voltage. Feedback paths can be used in some modulation/control schemes, such as constant on time or constant off time schemes, to control when the switches 1405, 1407 are turned on or off. To provide a measurably large $V_{ESR}$ signal along the feedback path that is reliably detectable by the modulator, the ESR 1425 of the capacitor 1421 can be designed and/or selected such that a sufficiently large ripple is caused. At the same time, it can be desirable to minimize the ripple voltage. A DC-DC converter can ideally generate a pure DC voltage. In practice, many applications allow small ripples on the output of a DC-DC converter but only within a small margin. Some devices powered by a DC power supply may require a maximum of 3% ripple, 2%, ripple 1% ripple, 0.5% ripple, 0.1% ripple, 0.05% ripple, 10 mV ripple, 5 mV ripple, 3 mV ripple, 1 mV ripple, 0.5 mV ripple, a smaller amount of ripple, or an undetectably low amount of ripple, or any ranges bounded by any of these values, although in some instances values outside these ranges can be used. For example, some point of load devices may specify that a DC power supply provide a 1.00 V DC output with no more than 1% (10 mV) ripple or variation from the 1.00 V value. A very low ESR capacitor can be used to achieve low ripple output. However, if the ripple is too low, then the modulator might not work based on the ripple feedback (e.g., the modulator might not distinguish ripple from noise, might operate erratically, etc.).

The disclosure herein includes some embodiments of DC-DC converters that use a ripple-triggered modulator, low ESR capacitors, and provide a low-ripple DC output.

Example Current and Ripple Graphs

Figure 15:
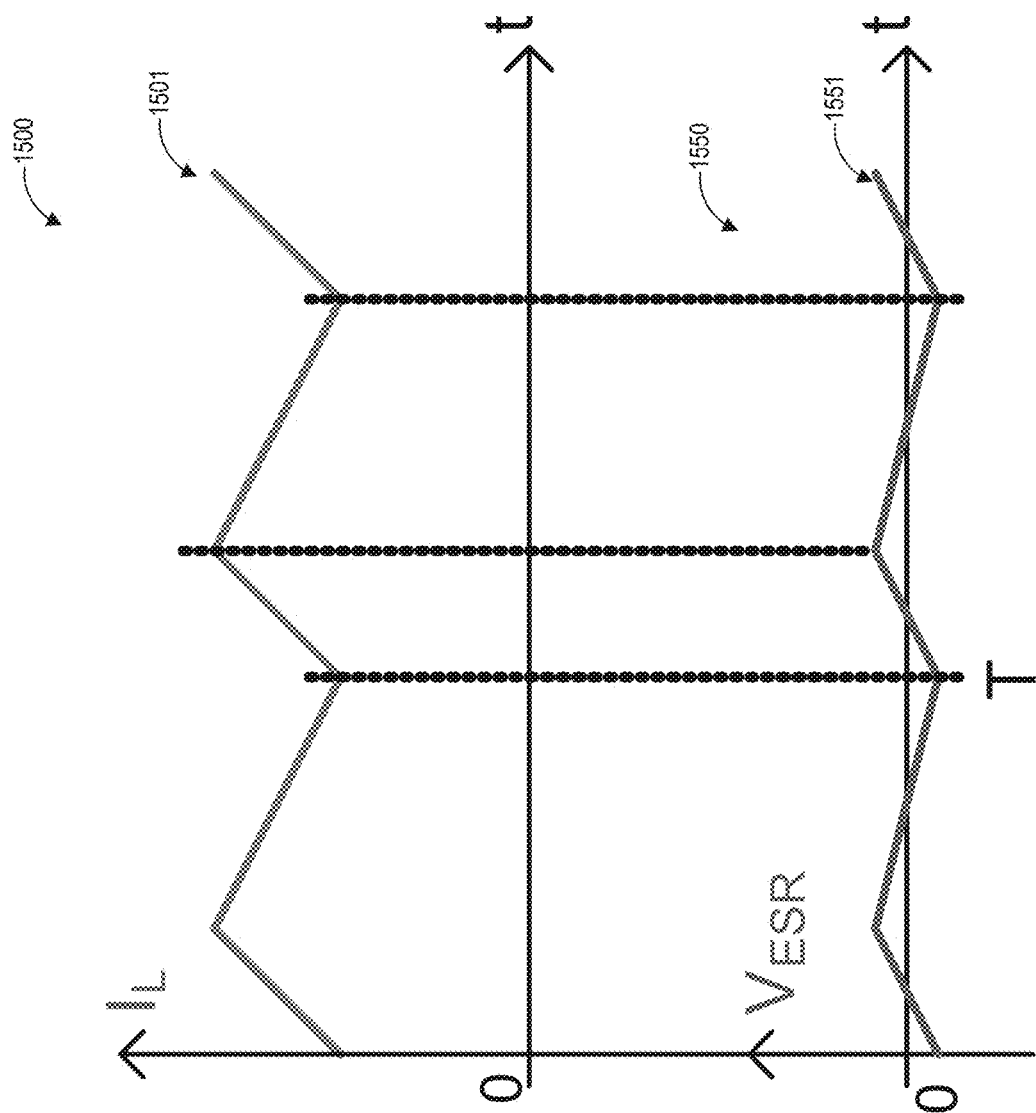
FIG. 15 shows example graphs of inductor current $I_L$ over time and equivalent series resistance voltage $V_{ESR}$ (also referred to as ripple voltage) over time.

FIG. 15 shows example graphs 1500, 1550 of inductor current $I_L$ over time and equivalent series resistance voltage $V_{ESR}$ (also referred to as ripple voltage) over time. The line 1501 indicates current $I_L$ through the inductor 1409 of FIG. 14. The line 1551 indicates the output ripple voltage $V_{ESR}$ at node 1417 of FIG. 14.

The inductor current $I_L$ increases when switch 1405 is turned on and switch 1407 is turned off. $I_L$ increases according to the equation:

$$I_{Lon} = \frac{V_{in} - V_{out}}{L} * T_{on} + I_o \qquad \text{Eq. 3A}$$

where $V_{in}$ is the input voltage, $V_{out}$ is the output voltage, L is the inductance, $T_{on}$ is the amount time that switch 1405 is turned on, and $I_o$ is an initial current.

The inductor current $I_L$ decreases when switch 1405 is turned off and switch 1407 is turned on. $I_L$ decreases according to the equation:

$$I_{Loff} = \frac{-V_{out}}{L} * T_{off} + I_o \qquad \text{Eq. 4A}$$

where $V_{out}$ is the output voltage, L is the inductance, $T_{off}$ is the amount time that switch 1405 is turned off, and $I_o$ is an initial current. Equations 3 and 4 are the applied version of the general equation, V=L(dI/dt), where V is the voltage across an inductor, dI/dt is the rate of change in current with respect to time.

Based on equations 3A and 4A, the rates of change in the current can be determined by time derivatives such that:

$$\frac{d}{dt}I_{Lon} = \frac{V_{in} - V_{out}}{L} \qquad \text{Eq. 3B}$$

$$\frac{d}{dt}I_{Loff} = \frac{-V_{out}}{L} \qquad \text{Eq. 4B}$$

$V_{ESR}$ fluctuates up and down with the inductor current $I_L$. However, $V_{ESR}$ and $I_L$ increase and decrease with different slew rates (e.g., with different slopes). The difference in rates is affected by the ESR of the capacitor 1421. The voltage can be determined by multiplying the inductor current $I_L$ by the ESR according to the equation $V=I*R_{ESR}$. Accordingly, $$\frac{d}{dt}V_{on} = \frac{V_{in} - V_{out}}{L} * R_{ESR} \qquad \text{Eq. 3C}$$

$$\frac{d}{dt}V_{off} = \frac{-V_{out}}{L} * R_{ESR} \qquad \text{Eq. 4C}$$

As shown in the graphs 1500, 1550, as the current $I_L$ increases and decreases, the $V_{ESR}$ also increases and decreases at the same time, but at different slew rates (different slopes). The slew rate of $V_{ESR}$ is proportional to and affected by the ESR according to the equation $V_{ESR}=I_L*ESR$. Accordingly, for low ESR values, the $V_{ESR}$ may have a small amplitude, even if $I_L$ is large. For example, the inductor current $I_L$ is 3.0 A with a 50% ripple so that it fluctuates from 1.5 A to 4.5 A with an amplitude of 3.0 A. If a low ESR is 1 mΩ, then the $V_{ESR}$ may fluctuate between −1.5 mV to 1.5 mV, which can be too small and/or difficult for some modulators to reliably use. Also, the $V_{ESR}$ alternates between positive and negative values while the current remains positive.

Example Low ESR, Low Ripple, Chip Embedded DC-DC Converters

FIG. 16 shows an example chip embedded DC-DC converter with an external ripple voltage feedback circuit 1600. The embodiment of FIG. 16 can include a PCB 1601, driver 1603, first power switch 1605 (such as an eGaN switch), a second power switch 1607 (such as an eGaN switch), an inductor 1609, output capacitor 1621, and output node 1617. FIG. 16 also includes a resistor 1643, capacitor 1645, AC bypass capacitor 1647, a feedback path 1627, a comparator 1629, AND gate 1631, one-shot circuit 1633, inverter 1635, minimum time delay counter 1637, resistor 1639, and resistor 1641.

The output capacitor 1621 can be one or more low ESR capacitors. The low ESR effect can also be achieved by coupling a plurality of capacitors in parallel such that the effective parallel ESR is reduced. For example, each capacitor may have an ESR in the mΩ range (e.g., 1 mΩ, 10 mΩ, 100 mΩ) or lower in the μΩ range (e.g. 10μΩ, 100μΩ), and the arrangement of the capacitors in parallel may reduce the effective parallel ESR even further. As a result of the low ESR, the ripple voltage at node 1617 might be too small to reliably use for feedback, but a low ripple DC output is provided at node 1617. For example, a 1.5 A ripple through the inductor may cause only a 1.5 mV ripple when a 1 mΩ ESR capacitor is used. The one or more output capacitors 1621 can have a total ESR of 1000 mΩ, 100 mΩ, 10 mΩ, 1 mΩ, 100μΩ, any values therebetween, any ranges bounded by any of these values, or a smaller ESR, although in some instances values outside these ranges can be used. In some embodiments, the output voltage of the DC-DC converter can have an AC voltage ripple of 3% or less, 2%, or less, 1% or less, 0.5% or less, 0.1% or less, 0.05% or less, 10 mV or less, 5 mV or less, 3 mV or less, 1 mV or less, 0.5 mV or less, a smaller amount of ripple, a ripple that cannot be reliable detected, an undetectably low amount of ripple, or any ranges bounded by any of these values, although in some instances values outside these ranges can be used. The low ESR and low ripple values discussed herein can relate to other embodiments, as well, such as to the embodiment of FIG. 17.

In order to sense the ripple and provide a feedback voltage, the resistor 1643 can be coupled in series with the capacitor 1645, and the series combination of the resistor 1643 and the capacitor 1645 can be coupled in parallel across the inductor 1609. The capacitor 1645 blocks DC signals. AC signals, such as ripples, can still be sensed. The capacitor 1645 and the resistor 1643 form a voltage divider for AC signals, and the sensed ripple can pass through AC bypass capacitor 1647 to the feedback path 1627. The values of the resistor 1643 and capacitor 1645 can be set such that equation 5 is satisfied:

$$\frac{L}{DCR_L} = Rx * Cx \qquad \text{Eq. 5}$$

where L is the value of the inductance of inductor 1609, $DCR_L$ is the direct current resistance ("DCR") of the inductor 1609, Rx is the resistance of the resistor 1643, and Cx is the capacitance of the capacitor 1645. Accordingly, a circuit can be provided to measurably and reliably sense the inductor current ripple independently of the ESR value.

Resistors 1639 and 1641 can form a voltage divider coupled to the output node 1617. The voltage divider can divide the voltage output at the output node 1617. In some implementations, the ripple at the output node 1617 can be small, difficult to detect, within a noise threshold, or otherwise unreliable for modulation purposes due to the low ESR of output capacitor 1621. Accordingly, the voltage divider can primarily act as a DC voltage divider.

The feedback path 1627 is coupled to the voltage divider to receive a DC voltage and is also coupled to the AC bypass capacitor 1647 to sense the ripple voltage. The feedback path is also coupled to a comparator 1629 and compared to a reference voltage. The reference voltage can be provided by a reference voltage generator (not shown), such as a bandgap generator, crystal, digital to analog converter ("DAC"), battery, etc. In some embodiments, a DAC is used to provide the reference voltage, and a digital signal can be provided to the DAC to set a desired reference voltage.

The comparator 1629 can generate a comparator output signal based on a comparison of the feedback signal and the reference voltage. For an example constant on time modulator, the comparator 1629 may generate a high output signal when the feedback signal falls below the reference voltage.

The output of the comparator 1629 can be provided to a one-shot circuit 1633 that generates a constant on time PWM signal, which can be provided to the driver 1603. The output of the one-shot circuit 1633 can also be provided to an inverter 1635, a minimum off time delay circuit 1637, and an AND gate 1631 to prevent the PWM signal from remaining high.

The configuration of the resistor 1643, capacitor 1645, and AC bypass capacitor 1647 can cause a significant, measurable ripple to be detected and injected to the feedback path 1627 despite the low ESR capacitor 1621 and despite the low output ripple. Accordingly, the detected ripple can be larger than the output ripple. The AC ripple injected to the feedback path 1627 can be expressed by:

$$V_{cx} = \frac{I_L * L}{(R_x * C_x)} \quad \text{Eq. 6}$$

where $V_{cx}$ is the ripple voltage on capacitor 1645, $I_L$ is the inductor peak to peak current ripple, $R_x$ is the resistance of resistor 1643, and $C_x$ is the capacitance of capacitor 1645.

In some embodiments, the PCB 1601 and its internal components can be packaged, and users can provide and/or configure the circuit including the inductor 1609, resistor 1643, capacitor 1645, capacitor 1621, capacitor 1645, AC bypass capacitor 1647, resistor 1639, and resistor 1641. In such embodiments, the values of the inductor 1609, resistor 1643, and/or capacitor may be selected and tuned according to equation 6. For example, if the inductor 1609 is changed for an application (e.g., to have a different inductance and/or DCR), a user can solve Eq. 6 and then select, source, and change the resistor 1643 and/or capacitor 1645 to correspond to the new L and $DCR_L$ values of the inductor 1609.

In some embodiments, some or all components shown in FIG. 16 can be included in a single package. In some embodiments, including some but not all of the resistor 1643, capacitor 1645, and inductor 1609 in a package can limit the ability to tune the circuit according to equation 6. For example, if the resistor 1643 and capacitor 1645 are included in the package but the inductor 1609 is selected by an end user, then the end user can be restricted to using particular inductors with particular L and $DCR_L$ values in order to satisfy equation 6. In such a system and in any improperly tuned system, an improperly selected inductor 1609 can cause system instability and/or malfunction, which may damage components receiving power from the DC-DC converter. In some instances, it can be desirable for the DC-DC converter to be properly tuned and provided as a single packaged device that does not require end user modification. Some embodiments disclosed herein can include the inductor 1609, the resistor 1643, and the capacitor 1645 as an single package.

Example Low ESR, Low Ripple, DC-DC Converters

FIG. 17 shows an example DC-DC converter 1700 (which can be a chip-embedded DC-DC converter, in some embodiments) with an internal ripple voltage feedback circuit. The chip embedded DC-DC converter 1700 includes a package 1701, a driver 1703, a first power switch 1705, a second power switch 1707, and an inductor 1709, which can be similar to other embodiments described herein. The DC-DC converter 1700 can receive an input voltage at a voltage input node 1715 and can provide an output voltage at an output voltage node 1717. An output capacitor 1721 (e.g., a low ESR output capacitor or a plurality of parallel capacitors with a low parallel ESR) can be coupled to the output node 1717. A feedback path 1727 can be coupled from the output node to a comparator 1729. The comparator output can be coupled to an AND gate 1731 and a one-shot circuit 1733 to provide a PWM signal to the driver 1703. A ramp generator 1751 can emulate an inductor ripple current (e.g., emulates the current 1501 in FIG. 15) and outputs a voltage representation of the ripple current (e.g., 1551 in FIG. 15). In some embodiments, the output of the ramp generator 1751 can be combined (e.g., added or subtracted) with a reference voltage at a signal combiner 1753. In some embodiments, the inductor ripple signal output by the ramp generator can be added to the feedback signal instead of being subtracted from the reference voltage. The comparator 1729 can perform a comparison involving the ripple signal output by the ramp generator 1751 and a reference voltage. The result of the comparison can be used in the feedback loop for driving the system (e.g., the switches 1705 and/or 1707).

The inductor 1709 can be included in the chip embedded DC-DC converter package, such as shown in FIG. 1, FIG. 3, FIG. 4A, and FIG. 4B. A low ESR output capacitor 1721 can be coupled to the output node 1717. The at least one output capacitor 1721 can have a low ESR (e.g., similar to the values and ranges discussed herein with regards to the embodiment of FIG. 16). For example, the ESR can be in the mΩ range (e.g., 1 mΩ, 10 mΩ, 100 mΩ) or lower in the μΩ range (e.g. 10μΩ, 100μΩ), and the arrangement of the capacitors in parallel may reduce the effective parallel ESR even further. The output voltage can have a low or no AC ripple (e.g., similar to the values and ranges discussed herein with regards to FIG. 16) such that the DC-DC converter can meet low ripple output specifications as required by some devices. However, the same low AC ripple may be small, difficult to detect, within a noise threshold, nonexistent, or otherwise unreliable for modulation purposes (e.g., due to the low ESR of output capacitor 1721), and it can be difficult to use that AC ripple for modulation purposes. The DC output voltage is provided via feedback path 1727 on the feedback path 1727 (e.g., along with any small (but not reliably measurable) AC ripple or no AC ripple at all).

A ramp generator 1751 emulates the inductor ripple independently of the capacitor 1721 and/or its ESR. An example ramp generator is described below with respect to FIG. 18. Inputs to the ramp generator can include the input voltage, the output voltage, a switch signal, and the inductor value. The output of the ramp generator 1751 can be combined with a reference voltage for comparison to the voltage on the feedback path 1727, or the output of the ramp generator 1751 can be combined with the voltage on the feedback path 1727 for comparison to a reference voltage. The voltage reference can be provided, for example, by a DAC. The DAC can generate a voltage output based on a digital input. Accordingly, the DAC voltage can be adjusted in small increments. For example, a 9 bit DAC may have adjustable output voltages in increments of 5 mV. The DAC can be used to set and/or tune an output voltage for the DC-DC converter. Other examples of voltage references include crystals, bandgap references, batteries, etc., any of which may be unable. The reference voltage combined with the emulated inductor ripple can be provided to an input of the comparator 1729, as shown in FIG. 17.

The ramp generator 1751 can be included in the package. The ramp generator 1751 can be included in a chip embedded IC, along with the driver 1703 and other components. The inductor can also be included within the package. The ramp generator 1751 can be tuned and configured for the particular inductor 1709 that is selected within the package before the package is provided to a user. In contrast to designs allowing user selectable inductors with different properties, a designer who selects the packaged inductor 1709 can know the inductor value and characteristics, allowing the designer to extract and/or determine the slew rate of the inductor 1709 and replicate the slew rate using the ramp generator 1751. In some embodiments, instead of using the actual ripple signal (e.g., at the inductor) in the feedback loop, the system can use the ramp generator to emulate the ripple signal (e.g., that is present at the inductor). The ramp generator 1751 can determine an emulated ripple signal based on the values of the input voltage $V_{in}$, $V_{out}$, the inductance values of the inductor L (which can be a known value when the inductor is integrated into the DC-DC converter package), and a switching signal SW. The switching signal can be indicative of the state of one or both of the switches 1705, 1707 and/or the time that one of both of the switches 1705, 1707 changed states (e.g., the HS and LS signals). Since the ramp generator knows the inductance, the input and output voltages, and the timing of the switches, it is able to determine a simulated ripple signal that emulates the actual ripple signal in the circuit (e.g., the ripple at the inductor). The emulated ripple can be proportional to the ripple in the inductor. The emulated ripple can change with the same slope (e.g., at the same rate) that the ripple in the inductor changes. The emulated ripple in a system with a low ESR capacitor 1721 can emulate a ripple that would be seen at node 1417 of FIG. 14 when a low ESR capacitor 1421 is not used.

The inductor ripple signal can be generated to accurately reflect the ripple through inductor 1709. By using a ramp generator to generate the inductor ripple signal, a minimum capacitor ESR is unnecessary for sensing/detecting the AC ripple. Accordingly, the output voltage can be a cleaner DC signal with a smaller or no AC ripple.

In some embodiments, a comparator compares the output of the DC-DC converter to the combination of the reference signal with the emulated inductor ripple. For example, in a constant on time modulation scheme, the comparator can output a high signal when the output signal on the feedback path 1727 falls below the value of the reference voltage combined with the emulated inductor ripple. The high signal can be provided through an AND gate to a one-shot circuit, which provides a constant on time PWM pulse to the driver 1703, which drives switch 1705 on and switch 1707 off. An inverter 1735 and minimum off time delay circuit 1737 coupled to the AND gate can prevent the one-shot circuit 1733 from triggering too frequently by ensuring that switch 1705 periodically turns off and switch 1707 periodically turns on. Various other implementations can be used to drive the switches based on the output of the comparator 1729.

Although the operation of the circuits in FIG. 16 and FIG. 17 are described with respect to a constant on time modulation scheme, it is understood that the teachings and disclosures herein can apply to any voltage mode modulation scheme, such as a constant off time scheme with the appropriate modifications to the circuitry (e.g., minimum off time delay changed to minimum on time delay, some comparisons and/or signals can be inverted, etc.). Furthermore, the teachings and disclosure herein can further be applied to current mode modulation schemes or voltage modulation schemes.

Figure 18:
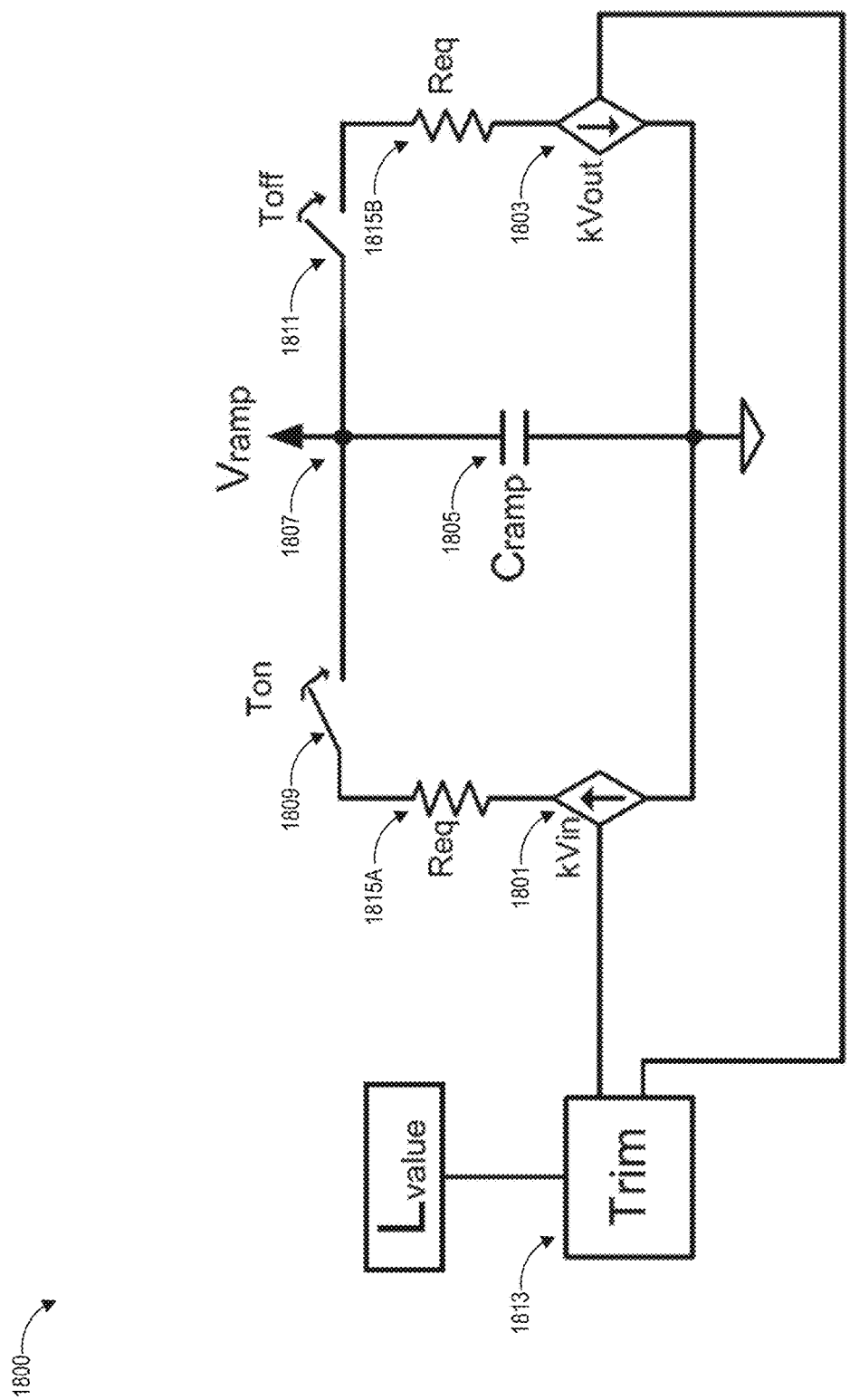
FIG. 18 shows an example circuit level schematic of a ramp generator.

FIG. 18 shows an example circuit level schematic of a ramp generator 1800. The ramp generator 1800 can include a first current source 1801, a second current source 1803, a capacitor 1805, a ramp voltage output node 1807, a first switch 1809, a second switch 1811, a trim controller 1813, and resistors 1815A, 1815B. The trim controller 1813 and/or the current sources 1801, 1803 can be coupled to the I2C and/or PMBUS to receive trim and/or adjustment commands.

The ramp generator can be configured to generate an output according to the following equations:

$$V_{ramp\text{-}ON} = \frac{k}{C_{ramp}}(V_{in} - V_{out}) * t_{on} + V_o \qquad \text{Eq. 7A}$$

$$V_{ramp\text{-}OFF} = \frac{k}{C_{ramp}}(-V_{out}) * t_{off} + V_o \qquad \text{Eq. 8A}$$

where $V_{ramp\text{-}ON}$ and $V_{ramp\text{-}OFF}$ are the respective on and off voltages (output as the inductor ripple output of the ramp generator 1751 in FIG. 17), k can be a constant fixed factor, $V_{in}$ is the input voltage (e.g., the voltage provided at node 1715 in FIG. 17), $V_{out}$ is the output voltage (e.g., the voltage provided at node 1717 in FIG. 17), where k is a number measured in Amps per volts, $C_{ramp}$ is a capacitance of the capacitor 1805, $t_{on}$ is an amount of time that the DC-DC converter is providing power to the inductor (e.g., while switch 1809 is closed and switch 1811 is open), $t_{off}$ is an amount of time that the DC-DC converter is not providing power to the inductor (e.g., while switch 1809 is open and switch 1811 is closed), and $V_o$ is a starting voltage. The ripple voltage slew rates (also known as "slopes," measured in volts per second) are indicated by the coefficients that the time periods ($t_{on}$, $t_{off}$) are multiplied by:

$$\frac{d}{dt}V_{ramp\text{-}ON} = \frac{k}{C_{ramp}}(V_{in} - V_{out}) \qquad \text{Eq. 7B}$$

$$\frac{d}{dt}V_{ramp\text{-}OFF} = \frac{k}{C_{ramp}}(-V_{out}) \qquad \text{Eq. 8B}$$

Eq. 7 and Eq. 8 alone do not reveal how to set the value for k to emulate a voltage related to the inductor ripple, which should depend on inductance of inductor 1709. If the ramp generator is configured to emulate the slew rate in Eq. 3C, then Eq. 7B and Eq. 3C can be set equal to each other, where $C_{ramp}$ is set equal to Cx, and a resistor $R_{eq}$ is selected to replace $R_E$SR such that:

$$\frac{k}{C_{ramp}}(V_{in} - V_{out}) = \frac{V_{in} - V_{out}}{L} * R_{eq} \qquad \text{Eq. 9}$$

$$k = \frac{C_{ramp}}{L} * R_{eq} \qquad \text{Eq. 10}$$

Accordingly, the value for k can be determined, and will be a constant number when the capacitance of capacitor 1805, the resistance of resistors 1815A, 1815B, and the inductance of inductor 1709 are fixed. Furthermore, the relationship between k and inductance is revealed to be an inverse relationship. The constant value k can be determined if the inductance of inductor 1709 is known. Accordingly, the inductance of inductor 1709 can be measured, and the ramp generator can be trimmed and/or configured.

The first current source 1801 can be a voltage controlled current source 1801. The output of the voltage controlled current source 1801 can be controlled, at least in part, by the $V_{in}$ voltage and by k. In some embodiments, the output of the voltage controlled current source can be controlled by the $V_{in}$ voltage multiplied by k. Accordingly, as L increases, k decreases, and current source 1801 can be trimmed to decrease the output current, and as L decreases, the current source 1801 can be trimmed to increase the output current. The current source 1801 is coupled to the first switch 1809 and to ground.

The second current source 1803 can be a voltage controlled current source 1803. The output of the voltage controlled current source 1803 can be controlled, at least in part, by the $V_{out}$ voltage and by k. In some embodiments, the output of the voltage controlled current source can be controlled by the $V_{out}$ voltage multiplied by k. Accordingly, as L increases, k decreases, and the current source 1803 can be trimmed to decrease the output current, and as L decreases, the current source 1803 can be trimmed to increase the output current. The current source 1803 is coupled to the second switch 1811 and to ground.

A trim controller 1813 is coupled to the current sources 1801, 1803. The trim controller 1813 is configured to adjust and/or set the output of the current sources 1801, 1803 based, at least in part, on the inductance of inductor 1709 (including respective or effective parallel inductors in various multi-inductor configurations). In some embodiments, the trim controller 1813 can be configured to adjust and/or set the output of the current sources 1801, 1803 based, at least in part, on the inductance of inductor 1709, the capacitance of capacitor 1805, and/or the resistance of resistors 1815A, 1815B. In some embodiments, the value for $C_{ramp}*R_{eq}$ can be set to a constant value, and the inductance of inductor 1709 is provided to the trim controller 1813.

A first switching signal (e.g., the same signal HS provided to switch 1705 in FIG. 17) can be provided to the first switch 1809. A second signal (e.g., the same signal LS provided to switch 1707 in FIG. 17) can be provided to the second switch 1811. The first and second switches 1809, 1811 can be smaller switches than the power switches 1705, 1707 in FIG. 17.

A capacitor 1805 can have one end coupled between the first switch 1809 and the second switch 1811. Another end of the capacitor 1805 can be coupled to ground.

When the first switch 1809 is closed and the second switch 1811 is open, the first current source 1801 is configured to generate a current controlled by the voltage $k*V_{in}$, charging capacitor 1805 such that a voltage at node 1807 is generated according to Eq. 7A and ramps up as described by Eq. 7B.

When the first switch 1809 is open and the second switch 1811 is closed, the second current source 1803 is configured to generate a current controlled by the voltage $k*V_{out}$, sinking current from capacitor 1805 such that the voltage at node 1807 is decreases according to Eq. 8 A, creating a negative voltage ramp as described by Eq. 8B.

As the current is drained from the capacitor 1805, the voltage across the capacitor decreases. Accordingly, the ramp generator can emulate an emulated inductor ripple and provide a usable voltage signal that is independent of the output capacitor and/or ESR.

The increasing and decreasing voltage output by the ramp generator at node 1807 can therefore emulate, be the same as, and/or be proportional to a ripple through the inductor 1709, even when a low ESR capacitor 1721 is used such that a voltage ripple cannot be reliably measured directly from the low ESR capacitor. By providing the inductor 1709, capacitor 1805, and resistors 1815A, 1815B, the values can be determined, and the DC-DC converter shown in FIG. 17 and FIG. 18 can be configured accordingly.

Unlike solutions that require users to configure external components, the packaged chip embedded DC-DC converter shown in FIG. 18 can include a self-contained, tuned feedback system. Accordingly, users do not need to engineer feedback systems, calculate proportions between inductances, DCR's, resistances, and capacitances. Furthermore, integrating the feedback and/or modulation components into a package and/or one or more IC within a package can save space in comparison to using external feedback components.

Figure 19:
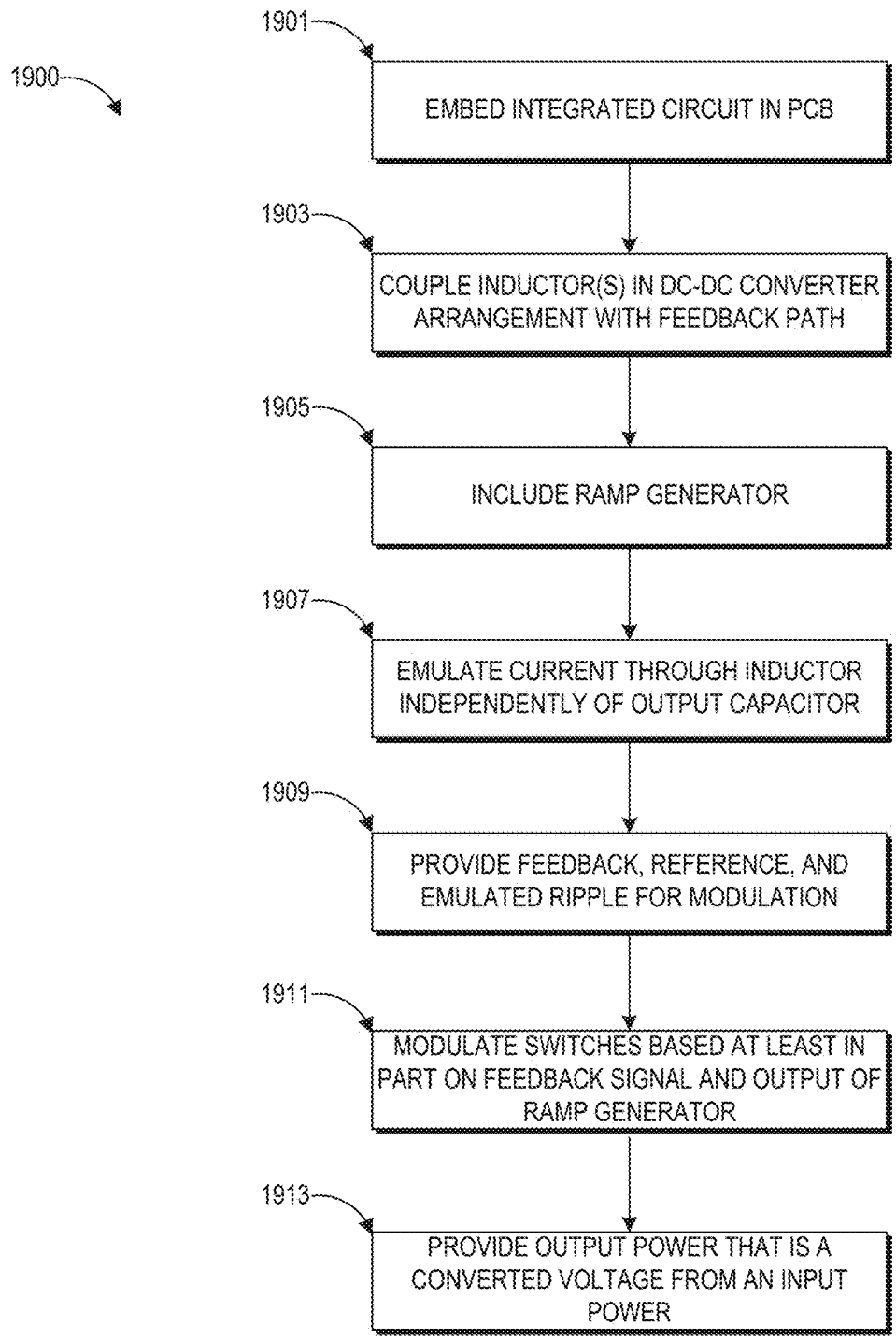
FIG. 19 shows an method for shows an example method of making and using a DC-DC converter.

Example Method of Making and Using Low ESR, Low Ripple, Chip Embedded DC-DC Converters FIG. 19 shows an example method of making and using a low ESR, low ripple, chip embedded DC-DC converter. The DC-DC can be configured to receive power at an input node at a first input voltage and output power at an output node at second output voltage that is different from the first input voltage.

At block 1901, an IC chip can be embedded in a PCB, as discussed herein. The IC chip can include some or all of: a driver, switches, ramp generator, and modulator circuitry, for example, as shown in FIG. 1, FIG. 3, FIG. 14, FIG. 16, and FIG. 17. In some embodiments, a plurality of IC chips can be embedded in the PCB, for example, as shown in FIG. 11B through FIG. 11D.

At block 1903, one or more inductors can be coupled to the IC chip and to a feedback path, for example, as shown in FIG. 1, FIG. 3, FIG. 14, FIG. 16, and FIG. 17. The inductor(s) and feedback path can be coupled to the output node. In some embodiments, a plurality of inductors can be coupled in a multi-inductor arrangement, for example, as described with respect to FIG. 10 through FIG. 13. The inductors can be configured to receive power and be part of an LC circuit arrangement that stores energy. The LC arrangement can include one or more capacitors, which can be low ESR capacitors. A parallel arrangement of capacitors can provide an effective low ESR. The second output voltage can form across the capacitor(s). Block 1903 can include measuring the inductance of the inductor(s).

At block 1905, a ramp generator can be included. The ramp generator can be included as part of the integrated circuit, as part of a different integrated circuit, included in the PCB, or otherwise included in the DC-DC converter package. An example ramp generator is described with respect to FIG. 17 and FIG. 18. The ramp generator can include a first current source, a second current source, and a capacitor coupled between the first and second current sources.

At block 1907, the ramp generator can be configured to emulate a ripple through the inductor. This can include trimming the first or second current sources based at least in part on a value of the inductor. The value of the inductor can be measured in order to determine the value for trimming. The ripple can be generated independently of the output capacitor and/or the ESR of the output capacitor. The first input voltage, second output voltage, inductance of the inductor, and a switching signal can be provided to the ramp generator. The current sources can switch on and off based on the switching signal. The switching signal can be provided to and/or generated from one or more power switches in the DC-DC converter.

At block 1909, a feedback signal, reference signal, and ripple voltage can be provided for signal modulation. The feedback signal can be a DC output signal (e.g., with no or little AC ripple). The AC ripple on the DC output signal can be insufficient to reliably use for modulation, in some instances. The reference signal can be a desired DC output signal that can be generated by a crystal, bandgap reference, DAC, battery, etc. The ripple voltage can be output by the ramp generator. The feedback signal, reference signal, and ripple voltage can be provided to a comparator.

At block 1911, one or more switches can be modulated and driven based at least in part on the feedback signal, the reference signal, and the ripple voltage. The modulation scheme can be, for example, a voltage mode modulation scheme such as a constant on time or constant off time scheme. The feedback signal can be compared to the reference signal. The ripple voltage can also be included in the comparison. The modulator can generate a control signal, such as a pulse, to drive one or more switches, based at least in part on the comparison.

At block 1913, a modulated output signal can be provided by the DC-DC converter.

Additional Details

The principles and advantages described herein can be implemented in various apparatuses. Also, chip embedded DC-DC converters can be used in various apparatuses for improved performance, and chip embedded DC-DC converters that perform at specifications and provided at lower costs can decrease the overall price of those various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, radar systems, and disk driver circuits. Consumer electronic products can include, but are not limited to, wireless devices, a mobile phone (for example, a smart phone), a wearable computing device such as a smart watch or an ear piece, healthcare monitoring devices, vehicular electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. The words "and/or" is also intended to cover all of the following interpretations of the word: any of the items in the list, all of the items in the list, and any combination of the items in the list. The term "based on," as generally used herein, encompasses the following interpretations of the term: solely based on or based at least partly on. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

The teachings of the embodiments provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure.

Other Embodiments

The following list has example embodiments that are within the scope of this disclosure. The example embodiments that are listed should in no way be interpreted as limiting the scope of the disclosure. Various features of the example embodiments that are listed can be removed, added, or combined to form additional embodiments, which are part of this disclosure:

1. A direct current to direct current (DC-DC) power converter, comprising:
a lower printed circuit board (PCB) part having a bottom side and a top side;
an upper printed circuit board (PCB) part having a bottom side and a top side;
embedded circuitry that is between the top side of the lower PCB part and the bottom side of the upper PCB part, the embedded circuitry comprising:
a pulse width modulator; and
at least one switch;
one or more vias extending through the upper PCB part;
an inductor positioned over the top side of the upper PCB part, wherein the one or more vias are electrically coupled to the inductor and to the embedded circuitry.

2. The DC-DC power converter of embodiment 1, wherein the embedded circuitry includes an integrated circuit (IC).

3. The DC-DC power converter of embodiment 2, wherein a footprint of the inductor at least partially overlaps a footprint of the integrated circuit.

4. The DC-DC power converter of any one of embodiments 1 to 3, wherein no wire-bonds electrically interconnect the inductor and the embedded circuitry.

5. The DC-DC power converter of any one of embodiments 1 to 4, wherein the circuitry has a switching rate of at least 1 MHz.

6. The DC-DC power converter of any one of embodiments 1 to 4, wherein the circuitry has a switching rate of at least 3 MHz.

7. The DC-DC power converter of any one of embodiments 1 to 4, wherein the circuitry has a switching rate of at least 5 MHz.

8. The DC-DC power converter of any one of embodiments 1 to 7, wherein the circuitry has a switching rate of up to 7 MHz.

9. The DC-DC power converter of any one of embodiments 1 to 8, wherein the at least one switch comprises an enhanced gallium nitride field effect transistor (eGaN FET).

10. The DC-DC power converter of any one of embodiments 1 to 9, further comprising one or more capacitors disposed over the top side of the upper PCB part.

11. The DC-DC power converter of any one of embodiments 1 to 10, further comprising a core disposed between the top side of the lower PCB part and the bottom side of the upper PCB part, wherein the core has one or more pockets formed therein, and wherein the embedded circuitry is disposed in the one or more pockets.

12. The DC-DC power converter of any one of embodiments 1 to 11, wherein the DC-DC power converter has a footprint that is smaller than 25 mm².

13. The DC-DC power converter of any one of embodiments 1 to 11, wherein the DC-DC power converter has a footprint that is smaller than 10 mm².

14. The DC-DC power converter of any one of embodiments 1 to 11, wherein the DC-DC power converter has a footprint that is smaller than 5 mm².

15. The DC-DC power converter of any one of any one of embodiments 1 to 14, wherein the DC-DC power converter has a footprint that is as small as 2 mm².

16. The DC-DC power converter of any one of embodiments 1 to 15, wherein the DC-DC power converter has a footprint area that is between 0.5 and 10 mm² per amperage of current.

17. A direct current to direct current (DC-DC) power converter package comprising:
an integrated circuit (IC) chip embedded in at least one printed circuit board (PCB), the IC chip comprising a driver;
an inductor positioned outside of the chip embedded package and coupled to a surface of the chip embedded package; and
a via electrically coupling the inductor to the IC chip;
wherein a footprint of the inductor overlaps, at least partially, with a footprint of the IC chip.

18. The DC-DC power converter of embodiment 17, wherein a transistor is embedded in the at least one PCB, and wherein the inductor is electrically coupled to the transistor.

19. The DC-DC power converter of any one of embodiments 17 to 18, wherein the IC chip comprises:
a pulse width modulator (PWM) controller coupled to the driver; and
a switching transistor coupled to an output of the driver.

20. The DC-DC power converter of any one of embodiments 17 to 19, further comprising a switch comprising enhanced gallium nitride (eGaN).

21. The DC-DC power converter of any one of embodiments 17 to 20, wherein the switch is configured to switch at 4 MHz or faster.

22. The DC-DC power converter of any one of embodiments 17 to 20, wherein the switch is configured to switch at 5 MHz or faster.

23. The DC-DC power converter of any one of embodiments 17 to 19, further comprising a switch comprising at least one of silicon or gallium arsenide.

24. A direct current to direct current (DC-DC) power converter in a single package comprising:
an enhanced gallium nitride (eGaN) component embedded, at least partially, inside of a mounting substrate;
an inductor mounted outside of the mounting substrate; and
a via coupling the inductor to the eGaN component;
wherein a footprint of the inductor overlaps, at least partially, with a footprint of the eGaN component.

25. The DC-DC power converter of embodiment 24, wherein the mounting substrate is a multi-layer PCB.

26. The DC-DC power converter of any one of embodiments 24 to 25, wherein the eGaN component is a switch comprising eGaN, the DC-DC power converter further comprising a driver circuit configured to drive the switch.

27. The DC-DC power converter of any one of embodiments 24 to 26, wherein the driver and the switch are part of an IC chip.

28. The DC-DC power converter of any one of embodiments 24 to 27, wherein the IC chip further comprises a pulse width modulator (PWM) controller.

29. A direct current to direct current (DC-DC) power converter utilizing a chip embedded package, the DC-DC converter comprising:
an enhanced gallium nitride (eGaN) switch inside of a printed circuit board (PCB);
a pulse width modulator (PWM) controller;
a driver embedded inside of the PCB, wherein the PWM controller and the driver are configured to drive the eGaN switch at a frequency of 1 MHz or higher;
an inductor positioned outside of the chip embedded package and coupled to a surface of the PCB; and
a via electrically coupling the inductor to the eGaN switch.

30. The DC-DC power converter of embodiment 29, wherein the driver is configured to drive the eGaN switch at a frequency of 5 MHz or higher.

31. A direct current to direct current (DC-DC) power converter comprising:
 a printed circuit board; and
 an integrated circuit inside of the printed circuit board, the integrated circuit comprising a driver.

32. The DC-DC power converter of embodiment 31, further comprising an inductor electrically coupled to the integrated circuit by one or more vias that extend through the printed circuit board.

33. The DC-DC power converter of embodiment 32, wherein the inductor has a footprint that at least partially overlaps a footprint of the integrated circuit.

34. A direct current to direct current (DC-DC) power converter comprising:
 an integrated circuit comprising a driver; and
 an inductor vertically stacked above the integrated circuit such that a footprint of the inductor overlaps, at least partially, with a footprint of the integrated circuit, wherein the inductor is electrically coupled to the integrated circuit.

35. The DC-DC converter of embodiment 34, further comprising a printed circuit board (PCB) having a first side and a second side that is opposite the first side, wherein the integrated circuit is mounted on the first side of the PCB, and wherein the inductor is mounted on the second side of the PCB.

36. The DC-DC converter of embodiment 35, wherein the inductor is electrically coupled to the integrated circuit by one or more vias that extend through the printed circuit board.

37. A direct current to direct current (DC-DC) buck converter comprising:
 one or more switches;
 a driver configured to drive the one or more switches; and
 an inductor electrically coupled to the switches;
 wherein the footprint of the DC-DC buck converter is less than 65 mm$^2$;
 wherein the DC-DC buck converter is configured to receive at least 20 amps of current; and
 wherein the DC-DC buck converter is configured to output at least 20 amps of current.

38. A direct current to direct current (DC-DC) power converter comprising:
 one or more switches;
 a driver configured to drive the one or more switches at a frequency, the frequency being between 1 and 5 MHz inclusive; and
 an inductor electrically coupled to the one or more switches;
 wherein the footprint of the DC-DC converter is less than or equal to 10 mm$^2$;
 wherein the DC-DC converter is configured to receive at least 5 amps of current;
 wherein the DC-DC converter is configured to output at least 5 amps of current.

39. A direct current to direct current (DC-DC) power converter comprising:
 a first switch coupled to a first inductor;
 a second switch coupled to a second inductor; and
 an integrated circuit chip embedded in a printed circuit board;
 wherein the first switch and the second switch are coupled to a modulator; and
 wherein the first inductor and the second inductor are coupled to a voltage output node.

40. The direct current to direct current (DC-DC) power converter of embodiment 39, wherein the modulator is included in the integrated circuit chip.

41. The direct current to direct current (DC-DC) power converter of any one of embodiments 39 to 40, wherein the modulator is configured to cause the first switch and the second switch to operate output of phase with a synchronous period.

42. The direct current to direct current (DC-DC) power converter of any one of embodiments 39 to 41, wherein an output signal at the output node is a superposition of a first signal through the first inductor and a second signal through the second inductor.

43. A direct current to direct current (DC-DC) power converter comprising:
 an integrated circuit chip embedded in a printed circuit board, the integrated circuit chip comprising a driver;
 a first switch coupled to the driver;
 an inductor coupled to the first switch; and
 a feedback path from an output node to a modulator circuit.

44. The direct current to direct current (DC-DC) power converter of embodiment 43, wherein the modulator circuit is a voltage mode modulator circuit.

45. The direct current to direct current (DC-DC) power converter of any one of embodiments 43 to 44, wherein the modulator circuit is a constant on time or constant off time modulator circuit.

46. The direct current to direct current (DC-DC) power converter of any one of embodiments 43 to 45, wherein the modulator circuit is included in the integrated circuit chip.

47. The direct current to direct current (DC-DC) power converter of any one of embodiments 43 to 46, wherein the modulator circuit and the inductor are included in a package with the integrated circuit chip.

48. A direct current to direct current (DC-DC) power converter comprising:
 an integrated circuit chip embedded in a printed circuit board, the integrated circuit chip comprising a driver;
 a first switch coupled to the driver;
 an inductor coupled to the first switch;
 a feedback path from an output node to a modulator circuit; and
 a ramp generator.

49. The direct current to direct current (DC-DC) power converter of embodiment 48, wherein the feedback path and an output from the ramp generator are coupled to a comparator.

50. The direct current to direct current (DC-DC) power converter of embodiment 49, further comprising a reference voltage source coupled to the comparator.

51. The direct current to direct current (DC-DC) power converter of any one of embodiments 48 to 50, wherein the ramp generator is configured to emulate a ripple current through the inductor.

52. The direct current to direct current (DC-DC) power converter of any one of embodiments 48 to 51, wherein the ramp generator comprises:
 a first current source;
 a second current source; and
 a capacitor.

53. The direct current to direct current (DC-DC) power converter of embodiment 52, wherein the first current source and the second current source are configured to be trimmed based, at least in part, on an inductance of the inductor.

54. The direct current to direct current (DC-DC) power converter of any one of embodiments 48 to 53, wherein the ramp generator and the inductor are included in the same DC-DC power converter package.

55. The direct current to direct current (DC-DC) power converter of any one of embodiments 48 to 54, wherein the ramp generator is configured to generate an output signal that is unaffected by an output capacitor coupled to the inductor.

56. The direct current to direct current (DC-DC) power converter of any one of embodiments 48 to 55, wherein the ramp generator is configured to generate an output signal that is independent from the equivalent series resistance (ESR) of an output capacitor coupled to the inductor.

57. The direct current to direct current (DC-DC) power converter of any one of embodiments 48 to 56, further comprising an output capacitor having a sufficiently low ESR such that a ripple voltage across the output capacitor is too small to reliably provide to a modulation circuit.

58. A ramp generator comprising:
 a first current source coupled to a supply voltage;
 a second current source coupled to ground; and
 a capacitor coupled between the first current source and the second current source.

59. The ramp generator of embodiment 58, wherein the ramp generator is configured to emulate a ripple current through an inductor in a DC-DC converter.

60. The ramp generator of any one of embodiments 58 to 59, wherein the output of the first current source is based, at least in part, on an input voltage to a DC-DC converter.

61. The ramp generator of any one of embodiments 58 to 60, wherein the output of the first current source is based, at least in part, on an inductance of an inductor in a DC-DC converter.

62. The ramp generator of any one of embodiments 58 to 61, wherein the output of the second current source is based, at least in part, on an inductance of an inductor in a DC-DC converter.

63. The ramp generator of any one of embodiments 58 to 62, wherein the output of the second current source is based, at least in part, on an inductance of an inductor in a DC-DC converter.

64. The ramp generator of any one of embodiments 58 to 63, wherein the first current source is configured to be trimmed based, at least in part, on an inductance of an inductor in a DC-DC converter.

65. The ramp generator of any one of embodiments 58 to 64, wherein the second current source is configured to be trimmed based, at least in part, on an inductance of an inductor in a DC-DC converter.

66. A method for making a chip embedded direct current to direct current converter comprising:
 embedding an integrated circuit chip in a printed circuit board;
 coupling a first inductor to the printed circuit board; and
 coupling a second inductor to the printed circuit board, the first inductor and the second inductor both coupled to an output node.

67. A method for converting first direct current voltage to a second direct current voltage comprising:
 driving a first switch coupled to a first inductor;
 driving a second switch coupled to a second inductor, wherein the first switch and the second switch are coupled to an output node; and
 modulating the driving of the first switch and the second switch out of phase;
 wherein at least one of a driver or a modulator is included in a chip embedded in a printed circuit board.

68. A method for making a chip embedded direct current to direct current converter comprising:
 embedding an integrated circuit chip in a printed circuit board;
 coupling an inductor between the integrated circuit chip and an output node; and
 providing a feedback path from the output node to a modulator circuit, wherein the modulator circuit includes a ramp generator.

69. The method of embodiment 68, wherein the modulator circuit is included in the printed circuit board.

70. The method of any one of embodiments 68 to 69, wherein the modulator circuit is a constant on time or constant off time modulator circuit.

71. The method of any one of embodiments 68 to 70, wherein the ramp generator is included in the integrated circuit.

72. The method of any one of embodiments 68 to 71, further comprising:
 trimming the ramp generator based at least in part on the property of the inductor.

73. The method of any one of embodiments 68 to 72, wherein the ramp generator is the ramp generator of any one of embodiments 58 to 65.

74. A method for using a direct current to direct current converter comprising:
 receiving input power at an input node;
 providing power through a switch to an inductor;
 storing energy in an output capacitor such that an output voltage forms across the output capacitor;
 providing output power at the output voltage to an output node;
 providing the output voltage to a modulator circuit;
 generating a ripple voltage that is independent of an output capacitor;
 providing the ripple voltage to the modulator circuit;
 modulating the switch based at least in part on an output of the modulator circuit.

75. The method of embodiment 74, further comprising comparing at least two of: the ripple voltage, a reference voltage, and the output voltage.

76. The method of any one of embodiments 74 to 75, further comprising trimming a current source based at least in part on an inductance of the inductor.

77. The method of any one of embodiments 74 to 76, wherein the ripple voltage is generated by a ramp generator configured to emulate a current through the inductor.

78. A direct current to direct current (DC-DC) power converter package comprising:
 an integrated circuit (IC) chip embedded in at least one printed circuit board (PCB), the IC chip comprising a driver;
 an inductor positioned outside of the chip embedded package and coupled to a surface of the chip embedded package; and
 an overcurrent protection circuit configured to detect when a current provided to the inductor exceeds a limit.

79. The direct current to direct current (DC-DC) power converter package of embodiment 78, wherein:
 the overcurrent protection circuit comprises a current source configured to be adjusted or trimmed based at least in part on an Inter-Integrated Circuit or Power Management Bus command;
 a saturation inductance of the inductor exceeds the limit and exceeds the limit by less than 50%;

the limit exceeds a maximum specified DC current specification plus maximum alternating current ripple specification by less than 50%.

80. A direct current to direct current (DC-DC) power converter package comprising:
an integrated circuit (IC) chip embedded in at least one printed circuit board (PCB), the IC chip comprising a driver;
an inductor positioned outside of the chip embedded package and coupled to a surface of the chip embedded package; and
an Inter-Integrated Circuit or Power Management Bus.

81. A direct current to direct current (DC-DC) power converter package of embodiment 80, wherein:
the Inter-Integrated Circuit or Power Management Bus is coupled to at least one current source and configured to provide a protocol command to adjust or trim the current source.

82. A direct current to direct current (DC-DC) power converter package of any one of embodiments 80 to 81, wherein:
the Inter-Integrated Circuit or Power Management Bus is coupled to at least one current source and configured to provide a protocol command to set or adjust a reference value provided to a comparator.

83. A direct current to direct current (DC-DC) power converter package of any one of embodiments 80 to 82, wherein the Inter-Integrated Circuit or Power Management Bus is configured to communicate protocols comprising instructions to perform at least one of:
turn on or off the DC-DC power converter package, change a low power or sleep mode of the DC-DC power converter package, read out information about current settings of the DC-DC power converter package, read out diagnostic and/or technical information about the DC-DC power converter package, set or change an output voltage provided by the DC-DC power converter package.

84. A direct current to direct current (DC-DC) power converter package of any one of embodiments 80 to 83, wherein a Power Management Protocol is implemented as an interconnect layer on top of an Inter-Integrated Circuit implementation.

Example Isolated Topology

Figure 20:
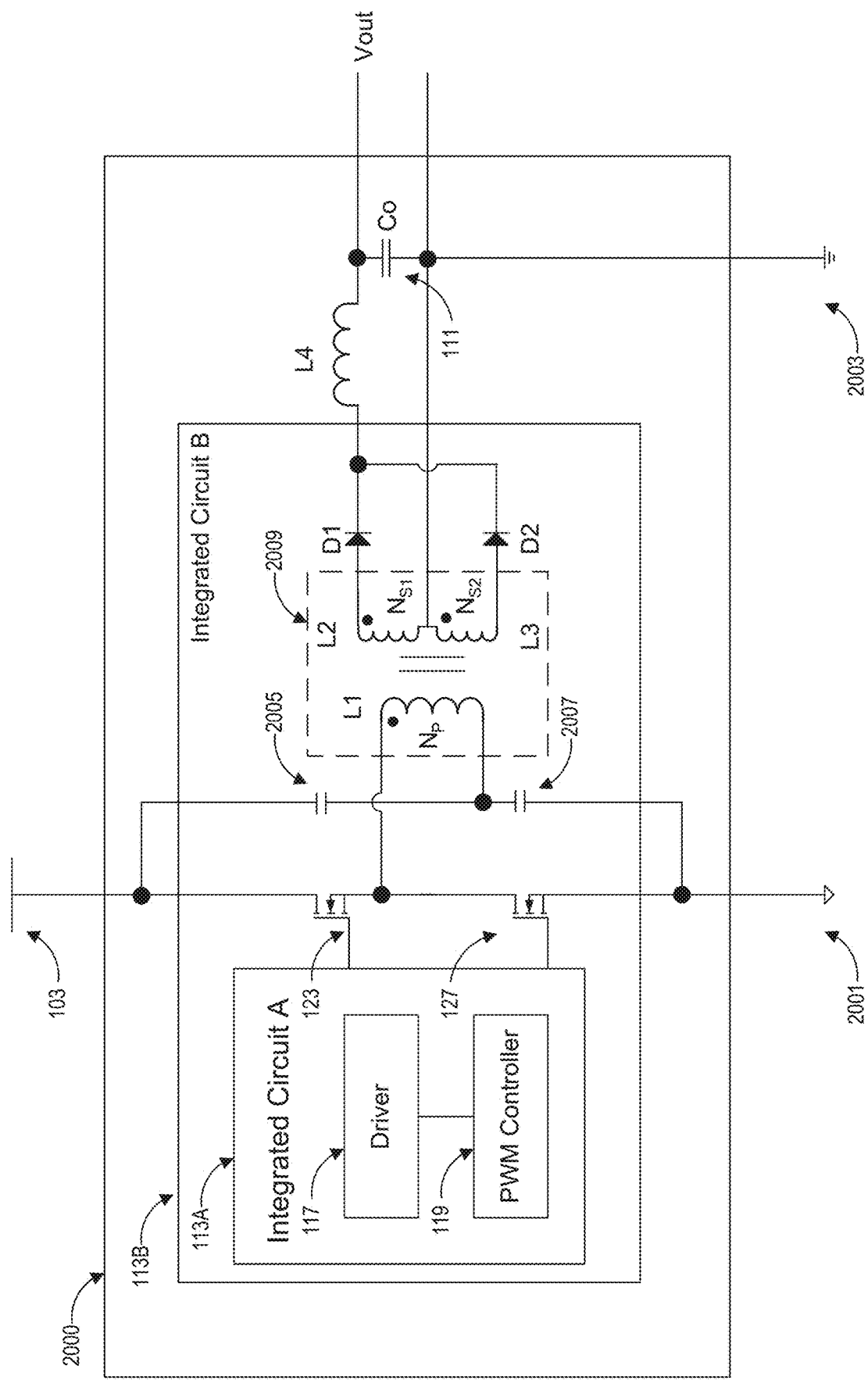
FIG. 20 shows an example circuit level schematic of a chip embedded DC-DC converter package with an isolated topology.

FIG. 20 shows an example circuit level schematic of a chip embedded DC-DC converter package 2000 with an isolated topology. The schematic shows a power a power source 103, an AC ground 2003, a DC ground 2001, an output capacitor 111, an integrated circuit (IC) chip 113A, an alternative IC 113B, a driver 117, a pulse width modulator (PWM) controller 119, a first switch (e.g., a first enhanced gallium nitride (eGaN) switch) 123, a second switch (e.g., a second eGaN switch) 127, capacitors 2005 and 2007, diodes D1 and D2, and inductor L4. The schematic also shows an isolation circuit 2009 including a first inductor L1, a second inductor L2, and a third inductor L3. The switches 123, 127 can also be referred to as power switches, switching FETs, and/or switching transistors. In some cases an input capacitor 105 (not shown in FIG. 20) can be used, similar to FIG. 1.

The circuit in FIG. 20 can operate similarly to the circuit shown in FIG. 1, or any of the other embodiments disclosed herein. A difference between the circuit in FIG. 20 and the circuit in FIG. 1 is that the configuration in FIG. 20 is an isolated topology that includes an isolation circuit 2009 (e.g., in an isolated half bridge configuration). The voltage output port 109 can be electrically isolated from the power source 103 such that there is no direct, electrically conductive pathway therebetween. Instead, the inductors L, L2, and L3 can be electromagnetically coupled such that a current through inductor L1 (e.g., a changing current) can generate and impose a magnetic field on inductors L2 and L3, thereby causing a current to flow through inductor L4 (e.g., a changing current). The current through inductor L4 can cause a charge to collect on the plates of capacitor 111 such that a voltage forms across the capacitor 111. Diodes D1 and D2 can be used to direct the current flow in one direction. In some embodiments, the diodes D1 and D2 can be replaced with switches (e.g., MOSFETs), which can result in greater efficiency, or with other electronic devices.

Although the isolation topology in FIG. 20 includes magnetically coupled inductors L1, L2, and L3, having the number of turns $N_P$, $N_{S1}$, and $N_{S2}$, respectively, in the isolation circuit 2009, other embodiments can include other configurations and other types of isolation circuit topologies, such a flyback, forward converter, two transistor forward, LLC resonant converter, push-pull, full bridge, hybrid, PWM-resonant converter, or other design. Other layouts disclosed herein, such as the layouts shown in FIG. 12, FIG. 13A, and FIG. 13B, can also be modified to use isolated topologies. In some embodiments, two in inductors can be used for the isolation circuit 2009. Although two examples of alternative integrated circuits 113A and 113B are shown, other variations can include any number of integrated circuits that include any combination of the elements shown in integrated circuit 113B.

Example DC-DC Converters with Wireless Communication Systems

Figure 21A:
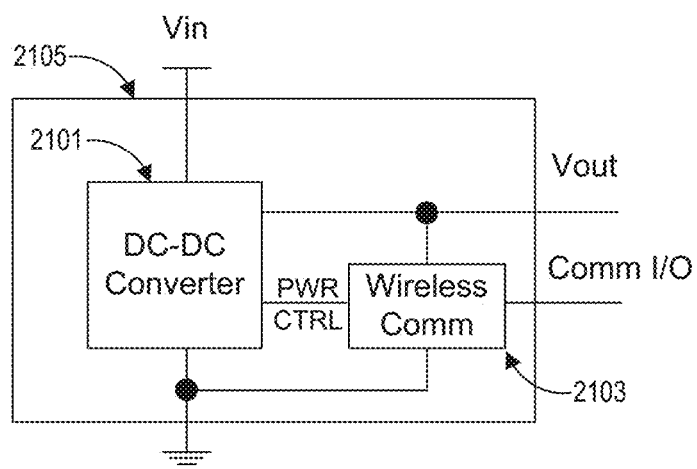
FIG. 21A shows an example DC-DC converter with a wireless communication system in a package.

FIG. 21A shows an example DC-DC converter 2101 with a wireless communication system 2103 in a package 2105. The DC-DC converter 2101 can be any DC-DC converter described herein. The DC-DC converter 2101 can be configured to receive an input voltage Vin and provide an output voltage Vout.

Figure 22:
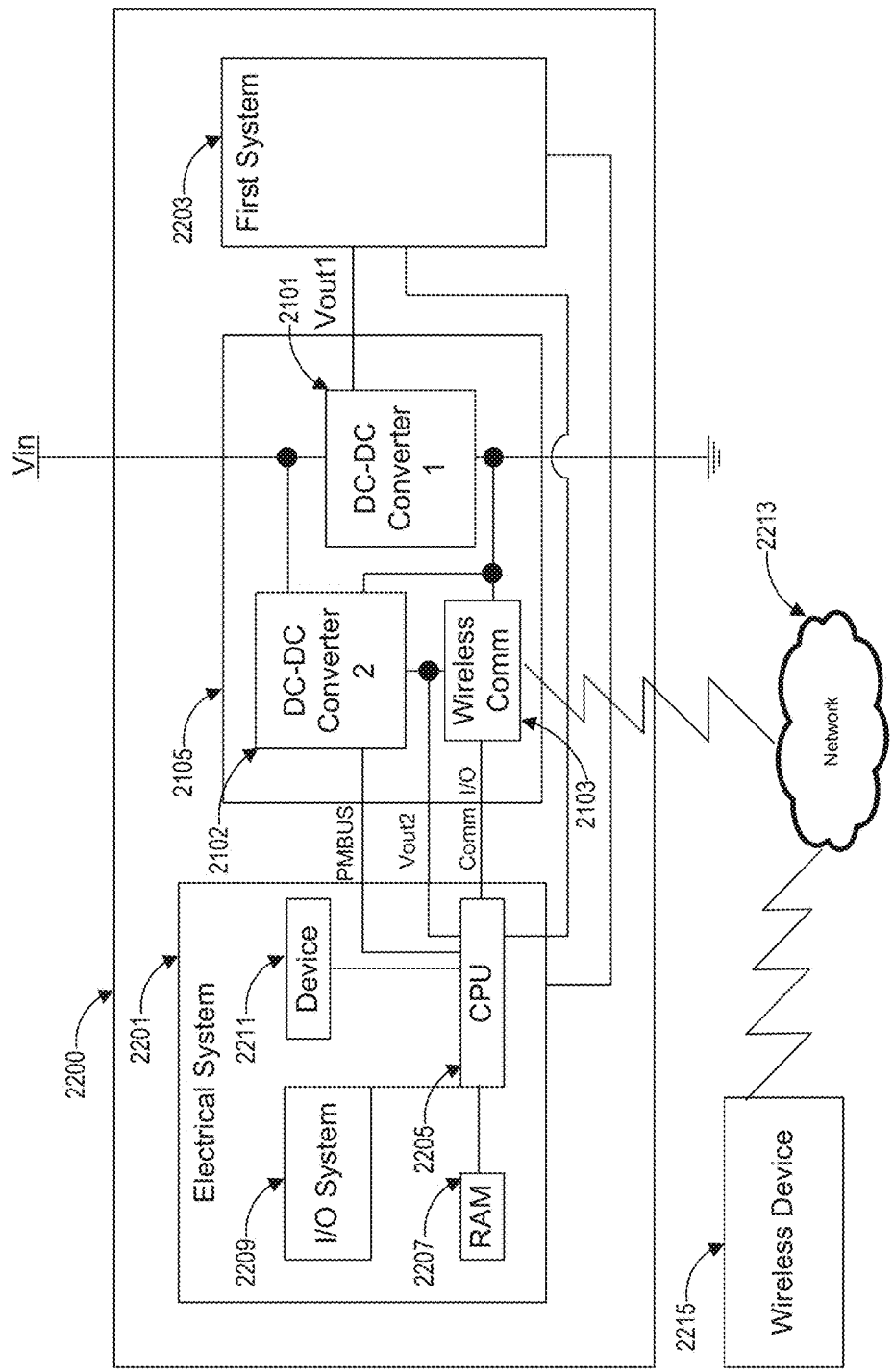
FIG. 22 shows an example Internet of Things (IoT) device.

A wireless communication system 2103 can be included in a same package that the DC-DC converter 2101 is included in, or in a separate package in some cases. The wireless communication system 2103 can be, for example, a Wi-Fi system, a Bluetooth system, a radio frequency system, etc. The wireless communication system can include (not shown) an antenna, oscillator, driver, controller, firmware, processor, buffer, digital to analog converter, etc. The wireless communication system can also include a wired communication input/output interface (shown as the Comm I/O) that can connect to other devices such as a CPU (for example, as shown in FIG. 22) so that the CPU can send and receive wireless signals through the wireless communication system 2103.

The wireless communication system 2103 can also or alternatively include a communication path (e.g., shown as the PWR Control line) with the DC-DC converter 2101 to control power parameters of the DC-DC converter. In some embodiments, the wireless communication system 2103 can couple to the DC-DC converter over a PMBUS. Accordingly, the DC-DC converter 2101 can respond to wireless instructions received through the wireless communication system 2103 (e.g., via a Wi-Fi, Bluetooth, broadband, or other type of wireless signal), such as to turn on, turn off, to enter a sleep mode, to reset, to clear faults, to change or set an output voltage, to control or limit an output current, to enter a different mode of operation, etc. The DC-DC converter 2101 can also wireless report or broadcast information regarding the health of the DC-DC converter, such as telemetry, an input voltage, an output voltage, an input current, an output current, a temperature, etc.

The wireless communication system 2103 can be included in a same package 2105 as the DC-DC converter 2101, or in a separate package, in some cases. The wireless communication system 2130 can be powered by the DC-DC converter 2101 and receive the output voltage Vout generated by the DC-DC converter 2101. For example, the DC-DC converter can be configured to receive a 120 volt DC input and provide a 10 volt DC output more suitable for some electronic devices, and the wireless communication system can be configured to use the 10 volt DC output from the DC-DC converter. In some embodiments, by including both the wireless communication system 2103 and the DC-DC converter 2101 in the same package 2105, the overall area occupied by these components can be reduced.

Figure 21B:
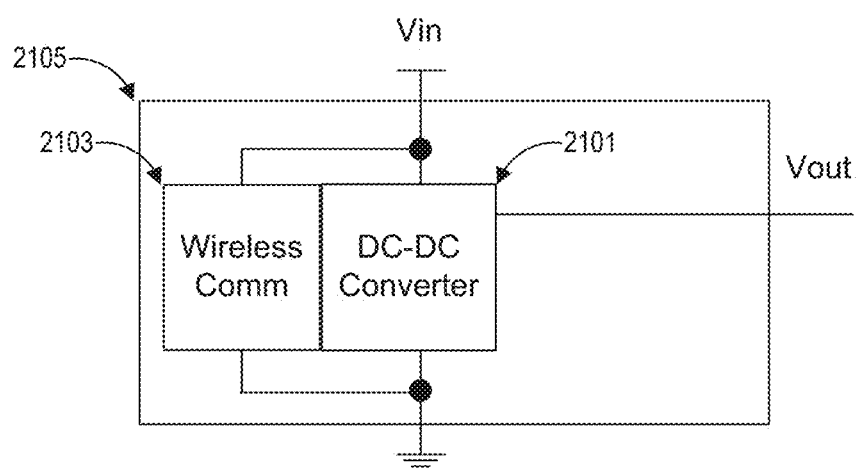
FIG. 21B shows an example DC-DC converter with a wireless communication system in a package.

FIG. 21B shows an example DC-DC converter 2101 with a wireless communication system 2103 in a package 2105. The DC-DC converter can be configured to receive an input voltage Vin and provide an output voltage Vout. The wireless communication system can also be powered by the input voltage Vin.

The wireless communication system can be powered by the input voltage Vin. For example, the DC-DC converter 2101 can be configured to receive a 10 volt input and provide a 25 volt output. The wireless communication system 2103 can also be powered through the 10 volt input. The wireless communication system 2103 can interact with the DC-DC converter 2101 and/or other devices as described with respect to FIG. 21A (PWR CTRL and Comm I/O lines are not re-shown in FIG. 21B).

Figure 21C:
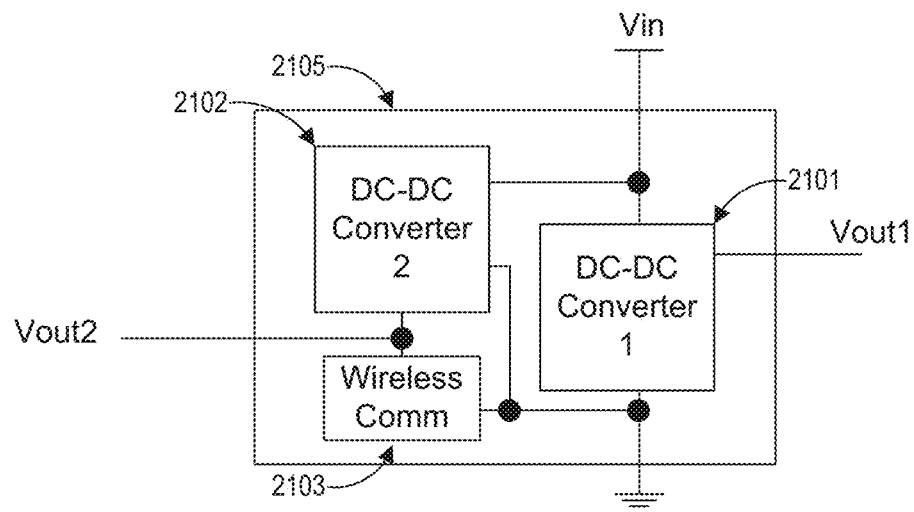
FIG. 21C shows an example package including a wireless communication system and two DC-DC converters.

FIG. 21C shows an example package 2105 including a wireless communication system 2103 and two DC-DC converters 2101, 2102. A first DC-DC converter 2101 can be configured to receive an input voltage Vin and provide a first output voltage Vout1. A second DC-DC converter 2012 can be configured to receive the input voltage Vin and provide a second output voltage Vout2. The first and second output voltages can be different. A wireless communication module 2103 is configured to be powered by the second DC-DC converter 2102.

For example, the first DC-DC converter 2101 can be configured to receive a 60 volt input and provide a 120 volt output. The second DC-DC converter 2102 can be configured to receive the 60 volt input and provide a 5 volt output. The wireless communication system 2103 can be powered by the 5 volt output from the second DC-DC converter 2102. The wireless communication system 2103 can interact with both of the DC-DC converters 2101, 2102 and/or other devices as described with respect to FIG. 21A (PWR CTRL and Comm I/O lines are not re-shown in FIG. 21C).

Figure 21D:
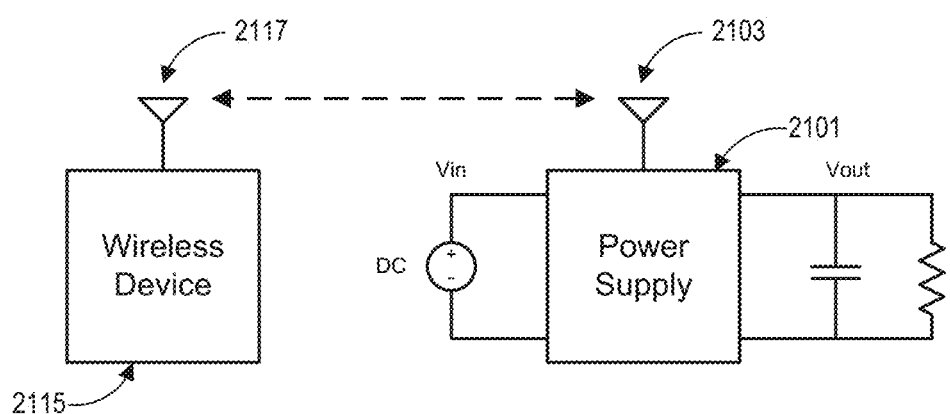
FIG. 21D shows and example wireless enabled power supply configured to communicate with an external wireless device.

FIG. 21D shows an example embodiment of a power supply 2101 with an integrated wireless communication system 2103. The power supply 2101 can be a DC-DC converter, an AC-DC converter, a linear mode power supply, or a switch mode power supply, or any other suitable type of power supply. The power supply 2101 can use isolated topology or non-isolated topology, and can use high or low voltages. The power supply 2101 can use any combination of suitable features disclosed herein. In the embodiments illustrated in FIG. 21D, the power supply 2101 can be a DC-DC converter configured to receive an input voltage (Vin) (e.g., from a battery) and to output a different output voltage Vout. In some embodiments, the power supply 2101 can be an AC to DC converter, which can receive an AC signal (Vin) and output a DC signal (Vout). An output capacitor can be used, as discussed herein. The power supply 2101 can supply power to one or more loads on a device (e.g., shown in FIG. 21D as a resistor). The device can be an electrical appliance (e.g., home electronics) such as a smart TV, an oven, a toaster, a coffee machine, etc., or the device can be industrial equipment, an internet of things (IoT) device, etc.

A wireless device 2115 can be in communication with the power supply 2103. A wireless communication system 2117 of the wireless device 2115 can be similar to the wireless communication system 2103 of the power supply 2101. In some embodiments, the wireless device 2115 can include a power supply 2101 (e.g., a DC-DC converter or an AC-DC converter) having a wireless communication system (e.g., integrated therewith). The wireless device 2115 can be a smartphone, tablet computer, a wireless router or access point in communication with a remote device, etc. The power supply 2101 can be part of a local network to enable one or more wireless devices 2115 to communication with the power supply 2101. The wireless device 2115 can send or receive information or commands to or from the power supply 2101 (e.g., via a Wi-Fi, Bluetooth, broadband, or other type of wireless signal). The wireless device 2115 can command the power supply to turn on or off, to enter a sleep mode (e.g., to reduce standby power consumption), clear faults, reset the power supply (e.g., in the event of a fault condition), control voltage or current levels, change modes of operation, etc. The power supply 2103 can communication information to the wireless device 2115, such as fault conditions, mode of operation, voltage and/or current settings (e.g., limits), information relating to the health of the power supply 2101 (e.g., temperature). The wireless device 2115 can send commands through the wireless communication system 2013 of the power supply 2101 to control the device associated with the power supply, such as a command to the device to turn on, turn off, change a setting, perform an action, etc. For example, a coffee maker can receive a command from the wireless device 2115 to start making coffee via a wireless communication system 2103 that can be integrated with or coupled to the power supply 2101, such as when a wireless device 2115 determines that a user is going home. The device associated with the power supply (e.g., a coffee maker) can send information about itself (e.g., settings, current mode of operation, previously performed actions, that coffee is ready, system status, errors, etc.) to the wireless device 2115 via the wireless communication system 2103 integrated with the power supply 2101. Accordingly, the device associated with the power supply (e.g., a coffee maker) can use the wireless communication system 2103 that is included in or integrated with the power supply 2101 without having a second, separate wireless communication system.

Figure 21E:
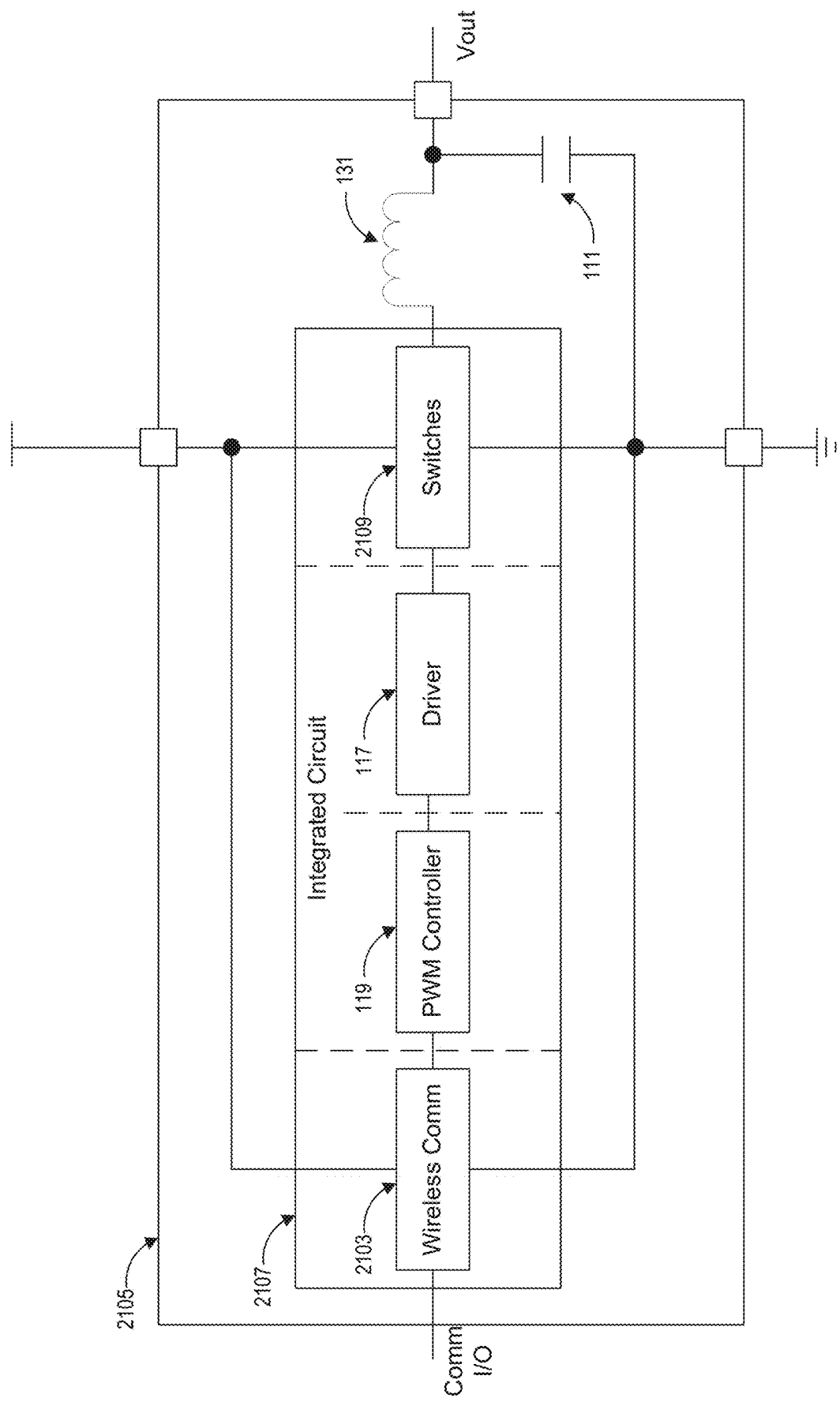
FIG. 21E shows an example DC-DC converter with a wireless communication system in a package.

FIG. 21E shows an example DC-DC converter with a wireless communication system 2103 (which can, in some embodiments, be incorporated into a package 2105). The DC-DC converter can be configured to receive an input voltage $V_{in}$ and provide an output voltage Vout. The DC-DC converter can include a PWM controller 119, driver 117, switches 2109, an inductor 131, and a capacitor 111. Some portions of the DC-DC converter already shown in other figures or discussed in other embodiments (such as the feedback system, multiple inductors, etc.) can be present but not shown in FIG. 21E for clarity.

Figure 24A:
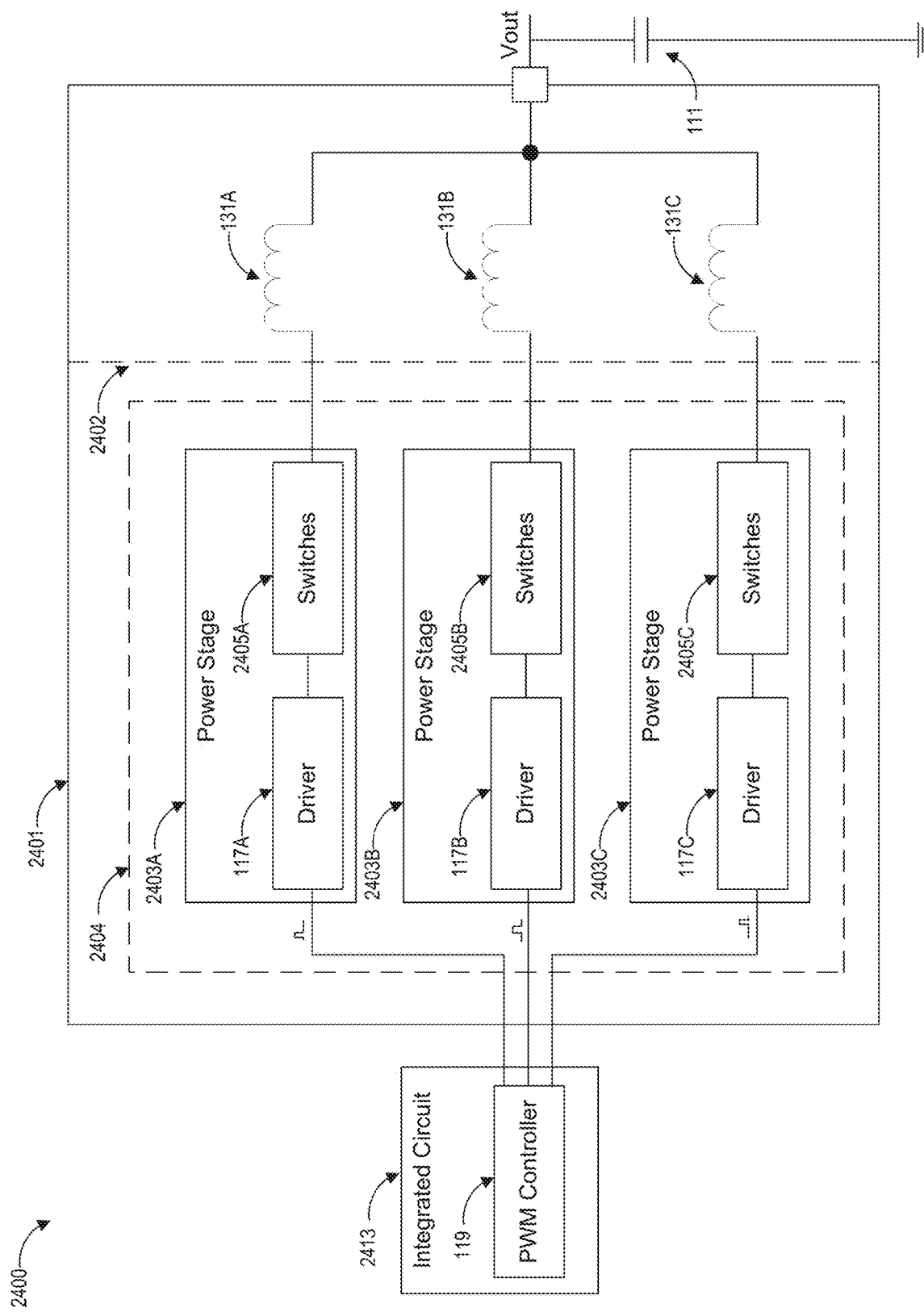
FIG. 24A shows a DC-DC converter with multiple power stages.

One or more system components can be included in an integrated circuit 2107 (e.g., which can be an eGaN IC). The integrated circuit can include any combination of the wireless communication system 2103, PWM controller 119, driver 117, and switches 2109. As indicated by the dotted lines, the integrated circuit can be divided into one or more separate integrated circuits that can include any combination of the wireless communication system 2103, PWM controller 119, driver 117, and switches 2109. In some embodiments, there can be multiple integrated circuit chips, including separate IC chips for each the wireless communication system 2103, PWM controller 119, driver 117, and switches 2109. In some embodiments, the integrated circuit can be an eGaN IC. Some embodiments can use a monolithic eGaN IC that includes all or multiple ones of the wireless communication system 2103, PWM controller 119, driver 117, and switches 2109. Some embodiments can also use a separate eGaN ICs for each of the wireless communication system 2103, PWM controller 119, driver 117, and switches 2109, or any combinations thereof. In some embodiments, the PWM controller 119 can be omitted from the package 2105. A separate PWM controller 119 can be used to drive several DC-DC converter power stages, as discussed herein (e.g., as shown in FIG. 24A).

The wireless communication system 2103 can communicate with the PWM controller to adjust, for example, the PWM signals provided to the driver to set an output voltage and/or change current limits. In some embodiments, the wireless communication system can be configured to receive signals from ammeters, voltmeters, thermometers, other sensors, and/or status report registers (not shown) configured to report information about various parts of the circuit.

Example IoT Device

FIG. 22 shows an example Internet of Things (IoT) device 2200. The IoT device 2200 can include a package 2105 including a wireless communication system 2103 and two DC-DC converters 2101, 2102 as shown in and described with respect to FIG. 21C. Various other configurations (e.g., similar to FIG. 21A, 21B, or 21D) can be used, such as having a single DC-DC converter, or having a different type of power supply (e.g., an AC-DC converter). The IoT device can also include a first system 2203. The IoT device can also include an electrical system 2201 that can include, for example, a CPU 2205, RAM 2207, an I/O system 2209, and other electrical devices 2211. The IoT device 2200 can communicate over a network 2213 to a wireless device 2215 such as a smartphone.

In some embodiments, components in the electrical system 2201 and components in the first system 2203 can use different voltages. Accordingly, the first and second DC-DC converters 2201, 2202 can provide different voltages to different devices.

The electrical system 2201 can be configured to receive the Vout2 voltage provided by the second DC-DC converter. The Vout2 voltage can be, for example, a voltage appropriate for some electrical devices in the electrical system and the wireless communication module. The first system 2203 can include different components configured to receive a different voltage Vout1.

For example, in one embodiment, the IoT device 2200 is a programmable lighting system. The first system 2203 can include one or more light bulbs configured to receive 60 V. The electrical system 2201 can be configured to turn the light bulbs on and off. A user can program an on/off schedule for the lights and/or issue commands to turn the lights on/off through the wireless communication system 2103. The received commands can be transmitted from the wireless communication system 2013 to the CPU 2205. The CPU 2205 can process the commands and turn the lights in the first system 2203 on and off according to the command. The user can wirelessly connect to the IoT device from another computer or smartphone, etc., and can connect to the wireless communication system 2103 directly or through a network such as the internet.

In another example of an IoT device, the first system 2203 can be, for example, a mechanical system that receives a higher voltage and more power than the electrical system in order to perform mechanical work, such as a motor. In other examples of IoT devices, the first system 2203 can be any system, whether electrical, mechanical, chemical, thermal, etc. that receives a different voltage than one of the components in the electrical system 2201. Other examples of IoT devices can include internet connected climate control systems, doors, computers, cameras, dispensers, cars, appliances, etc.

The wireless communication system 2103 can send and receive wireless signals to a wireless device 2215. In some embodiments, the wireless signals can be sent via a network 2213, such as the internet or a wireless local area network. The wireless device 2215 can be, for example, a smartphone, a computer, a desktop, another IoT device, etc. The wireless device 2215 can send/receive communications to/from the CPU 2205 as wireless signals by way of the wireless communication system 2103. In some embodiments, the wireless device can send/receive wireless communications to/from either of the DC-DC converters by way of the wireless communication system 2103. Communications from the wireless device 2215 can be transmitted between the wireless communication system 2103 by way of a power control line (for example, like the PWR Control line shown in FIG. 21A) such as a PMBUS between the wireless communication system 2103 and either or both of the DC-DC converters 2101, 2102.

Although FIG. 22 shows an example of an IoT device including a package 2105 including a DC-DC converter and wireless communication system from FIG. 21C, other IoT devices can include any packaged IoT device and wireless communication system, for example, as shown in FIG. 21A to FIG. 21E. Additionally, IoT devices can include any number of other DC-DC converters, with or without a wireless communication system in a package, to provide additional voltages or currents to any number of electrical systems.

Multiple DC-DC Converters with Adjustable Output

Figure 23A:
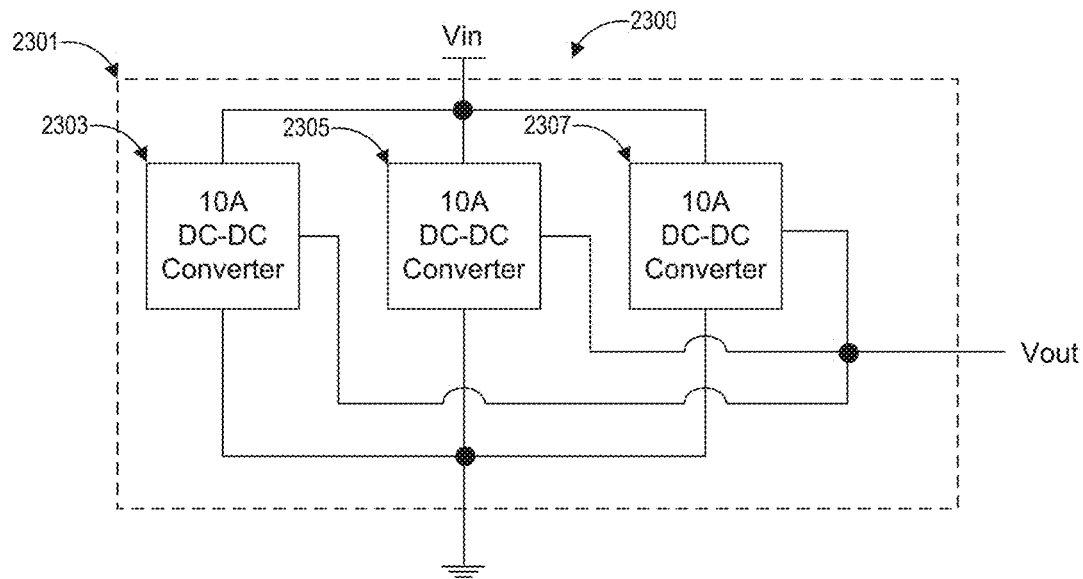
FIG. 23A shows an example DC-DC converter system including multiple DC-DC converters.

FIG. 23A shows an example DC-DC converter system 2300 including multiple DC-DC converters 2303, 2305, 2307. In some embodiments, the DC-DC converters 2303, 2305, 2307 can be included in a package 2301. In some embodiments, the DC-DC converters 2303, 2305, 2307 can be separate packages. A user can combine any number of DC-DC converter packages to produce various different amounts of current. In various embodiments, one or more components of the various DC-DC converters 2303, 2305, 2307, such as PWM controllers, drivers, and/or switches, can be combined and included in one or more integrated circuits. In some embodiments, each of the DC-DC converters 2303, 2305, 2307 have their own separate IC's with PWM controllers, drivers, and/or switches that are separate from components of the other DC-DC converters. In some embodiments, the DC-DC converters 2303, 2305, 2307 can be interconnected to facilitate current sharing between the DC-DC converters 2303, 2305, 2307. For example, a feedback system can use output from one of the DC-DC converters 2303, 2305, 2307 to control one or more others of the DC-DC converters 2303, 2305, 2307. For example, if the DC-DC converter 2303 is becoming overloaded, a feedback system can cause the other DC-DC converters 2305, 2307 to take more of the load to better balance the current between the DC-DC converters 2303, 2305, 2307.

The DC-DC converter system can be configured to receive an input voltage Vin and generate an output voltage Vout. Each of the DC-DC converters can be configured to generate the output voltage. Each of the DC-DC converters 2303, 2305, and 2307 can also be coupled in parallel between the system input and the system output. As a result of the parallel configuration, the total current supplied by the DC-DC converter system 2300 can be the sum of the individual currents supplied by the DC-DC converters 2303, 2305, 2307. The example in FIG. 23A shows a DC-DC converter system 2300 where 3 DC-DC converters 2303, 2305, 2307 are configured to provide 10 amps of current, and the total output current provided by the DC-DC converter system 2300 is 30 amps. In some embodiments, six DC-DC converters providing 20 amps can be combined to provide 120 amps, or any other suitable combination of power converters can be used. In some embodiments, currents from a plurality of DC-DC converters can combine to exceed 200 amps. Any number of DC-DC converters can be combined in parallel to provide various different amounts of current (e.g., 2, 3, 4, 5, 7, 10, 15, 20, 25, or more DC-DC converters). In some embodiments, DC-DC converters configured to output different amounts of current can be combined. For example, 1 DC-DC converter configured to output 20 amps can be combined with 1 DC-DC converter configured to output 10 amps and 3 DC-DC converters configured to output 2 amps, which can provide a current of 36 amps. The various embodiments of DC-DC converts disclosed herein can be used as modular components to be combined to form a wide variety of voltages and/or currents using only a small number of DC-DC converter types. For example, DC-DC converters configured to output 50 amps, 20 amps, 10 amps, 5 amps, 2 amps, and 1 amp can be used in various different combination to provide systems that can output current amounts from 1 amp to 100 amps using 6 or fewer DC-DC converters.

Figure 23B:
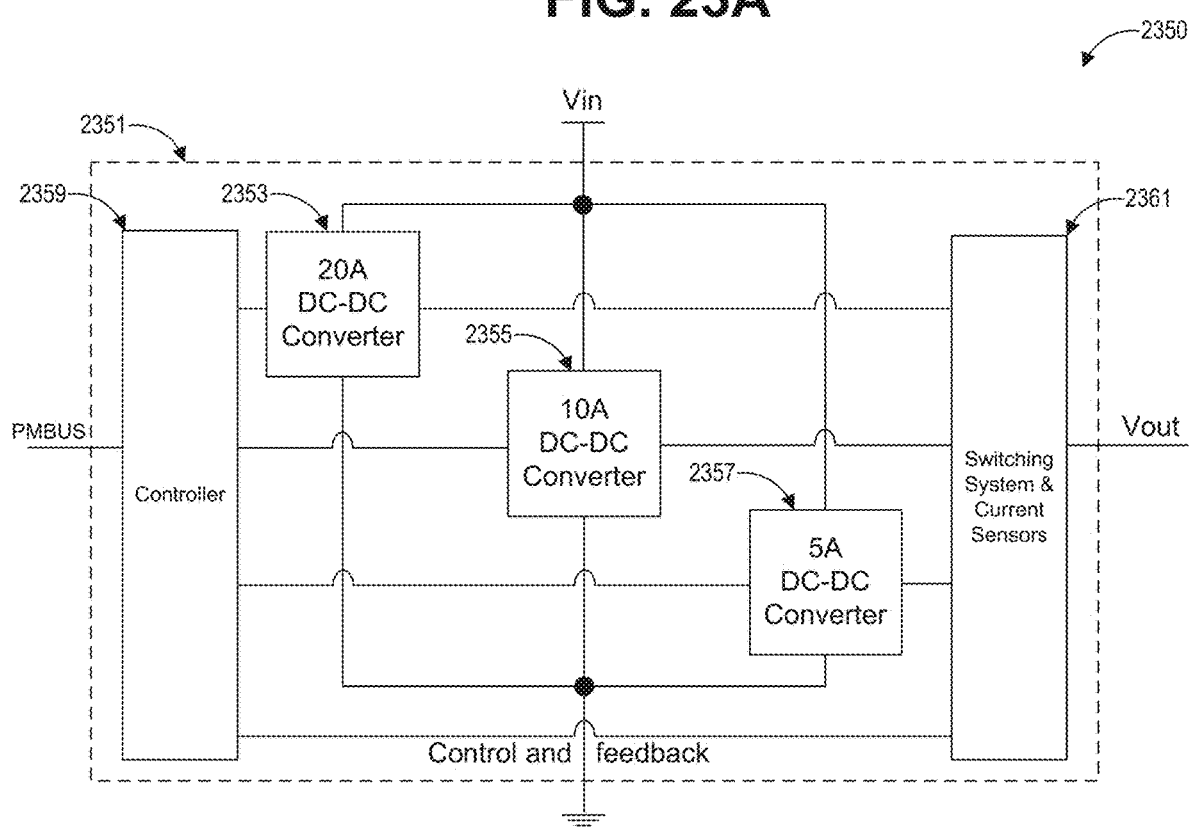
FIG. 23B shows an example DC-DC converter system including multiple DC-DC converters.

FIG. 23B shows an example DC-DC converter system 2350 including multiple DC-DC converters 2353, 2355, 2357. The DC-DC converters 2353, 2355, 2357 can optionally be included in a package 2351. The system 2350 (e.g., the package 2351) can also include a controller 2209 and a switching system (e.g., with current sensors) 2361. In some embodiments, the various components in the system 2350 can be in separate packages.

The DC-DC converter system 2350 can be configured to receive an input voltage $V_{in}$ and generate an output voltage Vout. Each of the DC-DC converters can be configured to generate the output voltage. Each of the DC-DC converters 2303, 2305, and 2307 can be coupled in parallel between the system input and the system output. As a result of the parallel configuration, the total current supplied by the DC-DC converter system 2200 can be the sum of the individual currents supplied by the DC-DC converters 2303, 2305, 2307.

A controller 2359 can be configured to receive commands from a communication line (e.g., PMBUS), and in response to the command, configure arrangements and combinations of the DC-DC converters 2353, 2355, 2357. The controller 2359 can cause different combinations of the DC-DC converters 2353, 2355, 2357 to contribute to the output. For example, the controller 2359 can configure all three DC-DC converters to provide a maximum current such that a total of 35 amps are provided to the output. In response to receiving a command to provide 15 amps, the controller 2359 can then configure each of the three DC-DC converters 2353, 2355, 2357 to provide a combination of currents that add to 15 amps (such as 5+5+5, 0+10+5, or a proportionally balanced 60/7+30/7+15/7).

The switching system can be controlled by the controller 2359 to, for example, open a connection in a parallel path between any of the DC-DC converters 2353, 2355, 2357 and the output. For example, to provide 15 amps, the switching system can decouple the 20 amp DC-DC converter 2353 from the output while keeping the 10 amp DC-DC converter 2355 and the 5 amp DC-DC converter 2357 coupled to the output. In some embodiments, functionality between the controller 2359 and the switching system 2361 can be combined into one control/switching system. The system 2350 (e.g., the switching system 2361) can include current sensors to detect a current output from each of the DC-DC converters 2353, 2355, 2357. In some embodiments, the current sensors can be included in each of the DC-DC converters, and outputs from the current sensors can be provided as feedback to the controller 2359. In some embodiments, the current sensors can be included in each of the DC-DC converters, and a feedback and control system (such as OCP) can be included with each DC-DC converter 2353, 2355, 2357 as shown in FIG. 1. Any number of DC-DC converters can be combined, as discussed in connection with FIG. 23A.

In some embodiments, there can be feedback at the DC-DC converter system 2350 level, wherein the outputs of each DC-DC converter 2353, 2355, 2357 is sensed and provided to the controller 2359. The controller can (e.g., based on the outputs of the DC-DC converters 2353, 2355, 2357) perform current balancing. Current balancing can include increasing or decreasing a current output of each DC-DC converter 2353, 2355, and/or 2357. The current balancing can include, for example, detecting that a first DC-DC converter is at, reaching, or exceeding a threshold limit (e.g., a current output limit, an inductor saturation limit, a voltage limit, a temperature limit), reducing the current provided by the first DC-DC converter, and, in some cases, increasing a current provided by a second DC-DC converter to compensate for the reduced current provided by the first DC-DC converter. Current balancing can include, for example, increasing and/or decreasing the output current of one or more of the DC-DC converters 2353, 2355, and/or 2357 in response to variations in a current drawn by a load. For example, a motor in steady state can draw less current than a motor that is spinning up, and current balancing can be performed to provide more or less current to the motor.

In some embodiments, the feedback at the DC-DC converter system 2350 level can be used to detect a temperature and/or inductor saturation of one of the DC-DC converters included in the system. In response to a first DC-DC converter reaching a threshold temperature and/or having a threshold inductor saturation, the controller can reduce the current provided by the DC-DC converter and, in some cases, compensate by increasing the current provided by a second DC-DC converter.

Some embodiments can include multiple DC-DC converters with different amperage capacities. An example DC-DC converters system 2350 can include three 10 amp DC-DC converters, and a controller can be configured to provide a variable current output up to 30 amps. As another example, a DC-DC converters system 2350 can include four 1 amp DC-DC converters, a 5 amp DC-DC converter, a 10 amp DC-DC converter, and a 20 amp DC-DC converter. As another example, a DC-DC converters system 2350 can include a 5 amp DC-DC converter, a 10 amp DC-DC converter, and a plurality of 20 amp DC-DC converters. As another example, a DC-DC converters system 2350 can include a plurality of DC-DC converters having a total current capacity of at least 50 amps, 100 amps, 150 amps, 200 amps, or more. High amperage DC-DC converter systems can be designed, based at least in part, on the efficiency, improved size, switching speed, improved heat dispersion, and topologies disclosed herein.

In some embodiments, the configurations and layouts shown in FIG. 23A and FIG. 23B can be arranged in a device without the packages 2301 and 2351. For example, each DC-DC converter 2303, 2305, and 2307 can be an individual package.

Multiple Power Stage Configuration

FIG. 24A shows a DC-DC converter 2400 with multiple power stages 2403A-2403C. A PWM controller can be used to provide pulse width modulated signals to a plurality of power stages, which can each have a driver and one or more switches. Two or more DC-DC converter power stages can share a single PWM controller. The topology shown in FIG. 24 can be used, for example, in some implementations of the technology and principles discussed herein, such as shown and described with respect to FIG. 23A and FIG. 23B. Some portions of the DC-DC converter 2400 already shown in other figures (such as the feedback system) can be present but not shown in FIG. 24A. The DC-DC converter 2400 can include an output capacitor 111, a package 2401, an integrated circuit (IC) chip 2413, drivers 117A-117C, a pulse width modulator (PWM) controller 119, switches (e.g., eGaN switches) 2405A-2405C, and inductors 131A-131C.

In some embodiments, an IC 2413 can include the PWM controller 119, although the PWM controller 119 need not be part of an IC 2413 in other embodiments. The PWM controller 119 can be separate from or external to the package 2401 and provide PWM signals that are out of phase to each of the drivers 117A-117C in the different power stages 2403A-2403C. For example, for three power stages, the PWM signals can be 120 degrees out of phase with each other. In some embodiments, the PWM controller 119 can be separate from or external to a PCB in the package 2401 but still included in the package 2401. In some embodiments the PWM controller 119 can be part of the package 2401.

The package 2401 can include a plurality of power stages 2403A-2403C. Each power stage 2403A-2403C can have an integrated circuit that is chip-embedded in a PCB of the package. As an alternative embodiment, a plurality of power stages such as 2403A-2403C can be included in one integrated circuit as shown by the dotted line 2404.

Each power stage 2403A-2403C can include a driver 117A-117C and switches 2405A-2405C as respectively shown. Each power stage 2403A-2403C can be coupled to a respective inductor 131A-131C. The power stages 2403A-2403C can be configured in parallel. The current capacity of DC-DC converter 2400 can be the sum of the current capacity in each parallel branch of power stages 2403A-2403C and inductors 131A-131C.

FIG. 24B shows an example layout of inductors 131A-131C in DC-DC converter 2400. The PWM controller 119 is not shown in FIG. 24B, for simplicity. The three inductors 131A-131C can each have respective footprint 2423A-2423C, which can be included within a footprint of package 2401. The footprints of the inductors can overlap with a footprint any of the integrated circuit chip 2404 and/or the power stages 2403A-3403C. FIG. 24B is not exactly to scale, but nonetheless shows how inductor footprints can be laid out and occupy a majority and/or substantial portion of a package 2401 footprint. In some embodiments, the inductors can be coupled to the package 2401 without being physically inside a package encapsulation. For example, an inductor can be coupled to and/or protrude from a top surface of a package. For example, the package 2401 shown in FIG. 24A can end at the dotted line 2402.

Example Side Cross Sectional View

Figure 25:
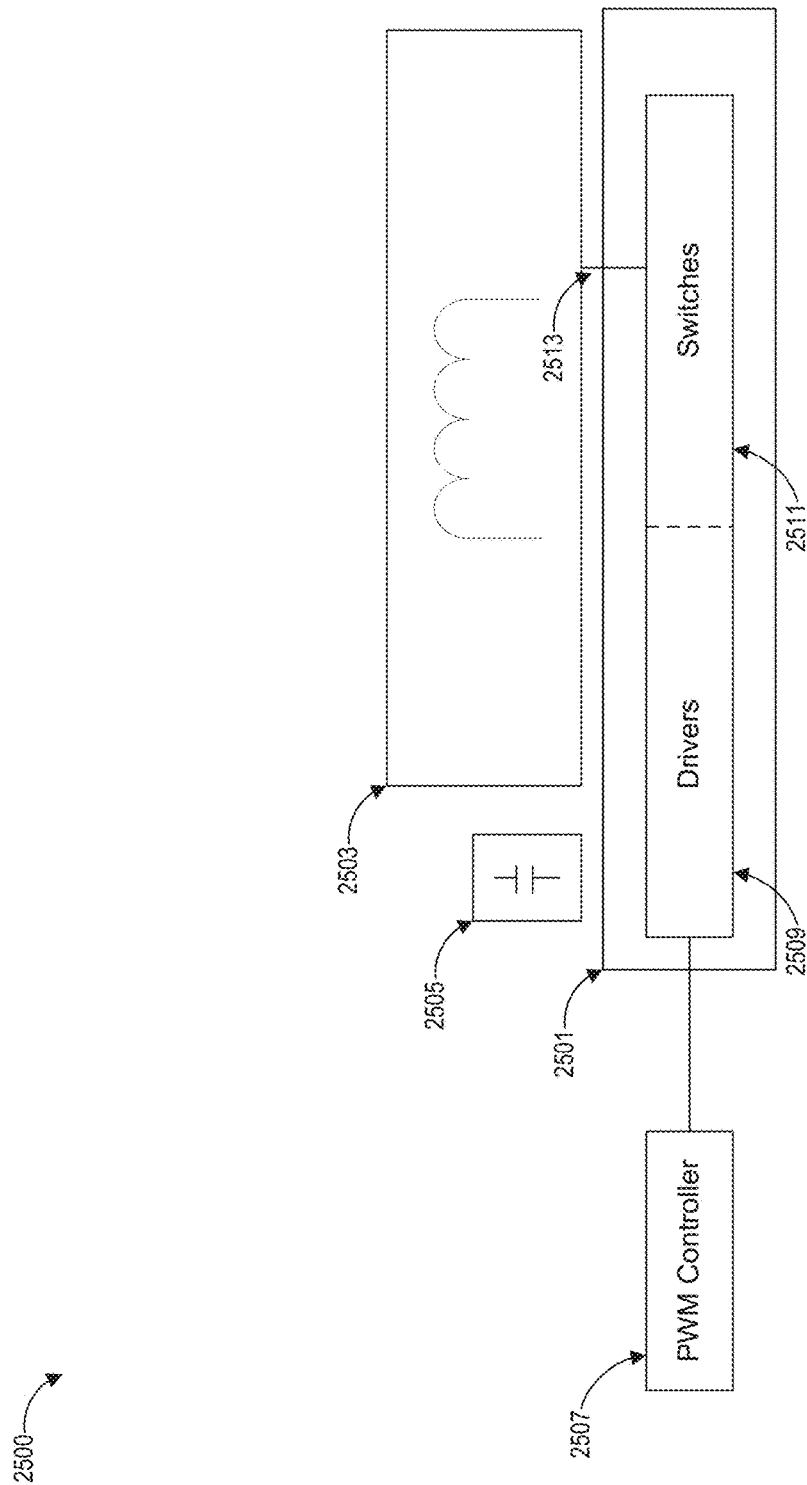
FIG. 25 shows an example side view of a DC-DC converter.

FIG. 25 shows an example side view of a DC-DC converter 2500. The DC-DC converter includes a PCB 2501, an inductor 2503, a capacitor 2505, a chip-embedded PWM controller 2507, a chip-embedded driver 2509, chip-embedded switches 2511, and a via 2513.

The inductor 2503 and capacitor 2505 can be external to the PCB 2501. The inductor can be coupled to the switches 2511 by way of a via 2513.

The PWM controller 2507 can be in a first integrated circuit (shown) or a first chip-embedded integrated circuit (not shown). In some embodiments, the PWM controller 2507 can be outside of the package 2501. The first integrated circuit can be based on any semiconductor material, such as silicon, and can be an eGaN IC.

The driver 2509 can be in a second chip-embedded integrated circuit. The second integrated circuit can be based on any semiconductor material, such as silicon, and can be an eGaN IC.

The switches 2511 can be in a chip-embedded integrated circuit such as the second chip-embedded integrated circuit or a third chip-embedded integrated circuit. The integrated circuit can be based on any semiconductor material, such as silicon, and can be an eGaN IC.

In some embodiments, the second integrated circuit can be a monolithic IC that includes both the driver 2509 and the switches 2511. In some embodiments, the driver 2509 and the switches can be in separate IC's. In some embodiments, the PWM controller 2507, driver 2509, and switches 2511 can be in a monolithic IC (e.g., an eGaN IC). In some embodiments, the PWM controller 2507 can drive multiple sets of divers 2509 and switches 2511, as discussed herein.

Preventing Inductor Saturation

For inductors of the same physical size, an inductor designed to have a higher saturation limit can also have an increased direct current resistance (DCR). An inductor can also be designed to have a higher saturation limit without increasing the DCR, but the inductor's physical size will increase. For example, a first inductor rated for a 10 A limit and a 15 A saturation limit can have a DCR of 4 milliohms. A second inductor (that is the same physical size as the first inductor) can also have a 10 A current rating and only a 3 milliohm DCR, but the second inductor will have a lower saturation limit of 13 A. It can be desirable to use an inductor (such as inductor 131 of FIG. 1) with both a smaller physical size and a lower DCR to improve efficiency without trading off one property (DCR or size) for the other, and to do so without violating design principles by risking inductor saturation. A saturated inductor can provide lower inductance and also act as an unintended short circuit between the input and output ports. Accordingly, to prevent inductor saturation, in some cases a larger inductor having a larger inductance and larger saturation limit can be used despite the increased DCR to ensure that the inductor does not saturate. For example, an inductor can be rated for 10 A, but the inductor can experience a 30% AC ripple such that the peak current is 11.5 A, and be exposed to temperature variations that affected the saturation limit. Accordingly, to prevent inductor saturation under a variety of operable conditions, the 10 A inductor can be designed with a 15 A or 20 A saturation limit to provide a saturation buffer or margin of error. In some designs, a buffer is designed for a worst-case scenario, such as across a wide temperature range, such that an inductor is selected to have a saturation rating of twice the current output rating of the DC-DC converter. However, such designs can increase at least the physical size and/or DCR of the inductor.

In some embodiments, an inductor having a lower DCR can be used to improve efficiency without incurring the effects of inductor saturation. For example, a DC-DC converter rated for 10 A of output current can use an inductor rated for 11 A, 10.5 A, 10.25 A, 10.1 A, etc. In some cases an inductor can have a current rating and a saturation rating, which can be higher than its current rating. The DC-DC converter can have an inductor having a saturation limit that is 0%, 5%, 10%, 20%, 30%, 40%, 50%, 75%, or 100% higher than the current rating of the inductor or of the DC-DC converter, or any values therebetween, or any ranges bounded by any combination of these values, although values outside these ranges can be used in some implementations.

The DC-DC converter can include an overcurrent protection system. As shown in FIG. 1, a first input of a comparator 139 can be coupled to a current source 137, which can be used as a reference for setting an overcurrent limit. An I²C and/or PMBUS (described with respect to FIG. 2) can be used to trim and/or adjust the output current of current source 137. Accordingly, an overcurrent limit can be set and/or adjusted. The output of the comparator 139 can be provided to fault logic and overcurrent protection (OCP) circuitry 141.

The comparator 139 can detect when the inductor 131 is nearing or at the saturation limit. The current source 137 can act to provide the reference current for comparison. The current source 137 can be trimmed and/or controlled (e.g., via a PMBUS or other control communication line) to adjust the reference current. Accordingly, the threshold reference value can be adjusted for different inductors 131 and across different temperatures (which can be in response to a signal from a thermometer, not shown). In response to an overcurrent event (e.g., as detected by the comparator 139), the fault logic 141 can activate overcurrent protection circuitry. This can, for example, cause the PWM controller and/or driver to (or to directly) open switches 123 and close switch 127, or otherwise prevent excess voltage or current from reaching the output. When the overcurrent protection is no longer detected (with hysteresis in some embodiments), the switches 123 and 127 can resume normal operation.

In some example embodiments, buffer room of less than 50%, 25%, 15%, 10%, 5%, 2.5%, or 1% can be set, or any values therebetween, or any ranges bounded by any combination of these values, although buffer amounts outside these ranges can be used in some implementations. The low buffer room can be used even across a wide range of temperature conditions. For example, a 10 A rated DC-DC converter can use an inductor with a 10.5 A saturation limit (e.g., buffer of 5%) and operate under temperature conditions ranging from −40° C. to +125° C. Other example minimum to maximum temperature ranges can include 0° C. to 100° C., 10° C. to 90° C., 25° C. to 75° C., and the like. Other example temperature ranges include at least 50° C. of variation, at least 75° C. of variation, at least 100° C. of variation, at least 125° C. of variation, at least 150° C. of variation, at least 165° C. of variation, and at least 175° C. of variation.

The overcurrent detection and protection functions can be performed under a variety of conditions. For example, the overcurrent detection and protection can be calibrated for each inductor included in the DC-DC converter. I²C communications over the PMBUS (or any other suitable control communication protocol or physical layer) can be used to adjust or calibrate the reference current 137 for the inductor. In some embodiments, a lookup table or other memory structure can store a temperature profile for the inductor 131 and trim the current source 137 to provide the appropriate reference current to the comparator 139.

AC-DC and Other Types of Power Converters

Figure 26A:
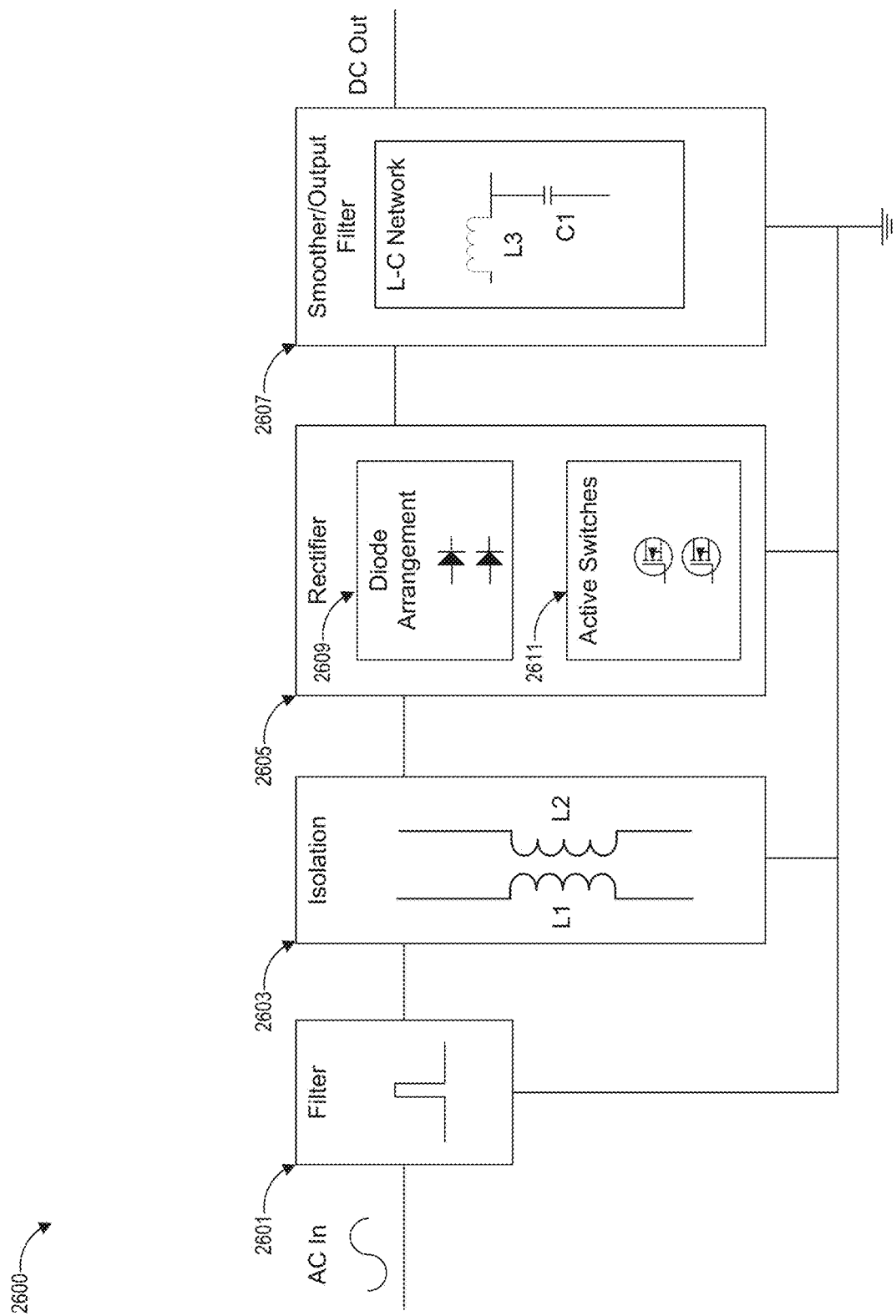
FIG. 26A shows an example block diagram of an AC to DC converter.

The teachings and principles disclosed herein can be applied to any type of power converters, not just DC to DC converters. DC to AC converters, AC to DC converters, and AC to AC converters can also use the teachings and principles disclosed herein. For example, FIG. 26A shows an example block diagram 2600 of an AC to DC converter. The AC to DC converter 2600 is configured to receive an AC input voltage and provide a DC output voltage. The AC to DC converter 2600 can include a filter 2601, an isolation circuit 2603, a rectifier circuit 2605, and/or a smoother and/or output filter 2607.

The filter 2601 can be, for example, a bandpass filter configured to pass voltage signals within frequency range (e.g., 50-60 Hz). The filter can include one or more switches, inductors, and/or capacitors. In some embodiments, the filter 2601 can be omitted.

An isolation circuit 2603 can be configured to electrically isolate the AC input port from the DC output port such that there is no direct, electrically conductive pathway therebetween. In some embodiments, the isolation circuit can be arranged in a different place, such as toward the output, after the AC signal has been converted to a DC signal. By way of example, the inductors L1 and L2 can be electromagnetically coupled such that a current (e.g., a changing current (AC)) through inductor L1 can generate and impose a magnetic field on inductor L2, thereby inducing a current (e.g., a changing current (AC)) through inductor L2. The inductors L1 and L2 can provide a transformer to step down a higher AC voltage to a lower AC voltage. In some embodiments, the transformer (e.g., the isolation circuit 2603) can be omitted, such as if the input AC voltage does not need to be reduced.

A rectifier 2605 can include an arrangement of diodes 2609 and/or active switches 2611. Various types of rectifier topologies include half bridge rectifiers, full bridge rectifiers, single phase rectifiers, multi-phase rectifiers, active rectifiers, etc. can be used. Active rectifiers can include one or more active switches 2611. In some embodiments, a diode bridge can be used to convert the AC signal into a pulsed DC signal. The switches 2611 can be actively controlled. In some embodiments, a PWM controller can be included and provide PWM signals to control the switches 2611.

A smoother and/or output filter 2607 can include an LC network. The LC network can include an inductor L3 and capacitor C1. In some embodiments, the inductor L3 can be omitted. The smoother and/or output filter 2607 can include a reservoir capacitor, which can smooth the pulsed DC signal into a smoother DC signal.

The technology described herein can be applied to the various components of the AC-DC converter in FIG. 26A. For example, any combination of circuit elements, such as the active switches 2611, any control system (e.g., a PWM controller) for the active switches 2611, and diodes 2609 can be included in a chip embedded integrated circuit and coupled to inductors L1, L2, and/or L3 by way of a via. Any functional stage of the AC-DC converter such as the filter 2601, isolation circuit 2603, rectifier 2605, and smoother & output filter 2607 can be included in one chip-embedded integrated circuit or any number of chip-embedded integrated circuits. Any of the inductors (such as L1, L2, and L3) or capacitors (such as C1, or the reservoir capacitor) can be stacked above (e.g., at least partially or completely overlapping) the embedded circuitry (e.g., the integrated circuit) and can be coupled to the integrated circuit by way of one or more vias. The physical layout can include the techniques discussed with respect to FIG. 3. Any of the feedback and control techniques disclosed herein can also be applied.

Figure 26B:
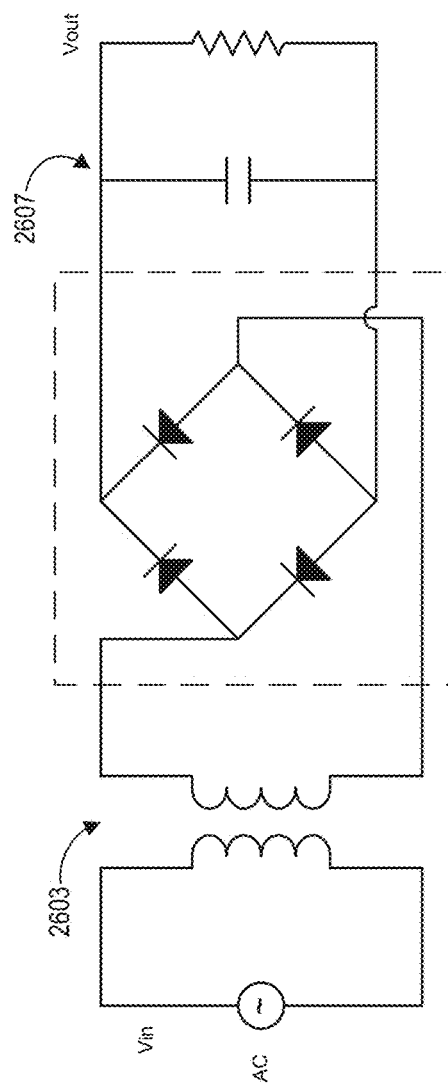
FIG. 26B shows an example AC to DC converter.

FIG. 26B shows an example embodiment of an AC to DC converter. The AC-DC converter can receive an input AC signal (e.g., Vin). Optionally, voltage modification circuit can, such as a transformer 2603, can change the voltage level of the input AC signal. For example the transformer 2603 can be configured to step down the input AC voltage to a reduced AC voltage. The transformer 2603 can include two inductors, as discussed herein. The transformer 2603 can be omitted, in some embodiments. The AC-DC converter can include a rectifier circuit 2605, which can be configured to convert the AC signal into a pulsed DC signal. In the embodiment illustrated in FIG. 26B, a full bridge rectifier circuit (e.g., having four diodes) can be used. Various types of rectifier circuits can be used, such as a diode bridge, a half-wave rectifier, a full-wave rectifier, a half bridge rectifier, etc. In some embodiments, the rectifier circuit can include one or more diodes. The AC-DC converter can include a smoothing circuit 2607. In some embodiments, the smoothing circuit 2607 can include a capacitor (as can be seen in FIG. 26B), which can be used as a reservoir capacitor. In some embodiments, the smoothing circuit can include an inductor, or an LC circuit that includes both an inductor and a capacitor. The smoothing circuit 2607 can smooth the pulsed DC signal to produce a more steady DC voltage (Vout). The output DV voltage (Vout) can be used to supply current to one or more loads on a device (e.g., shown here as a resistor).

Figure 26C:
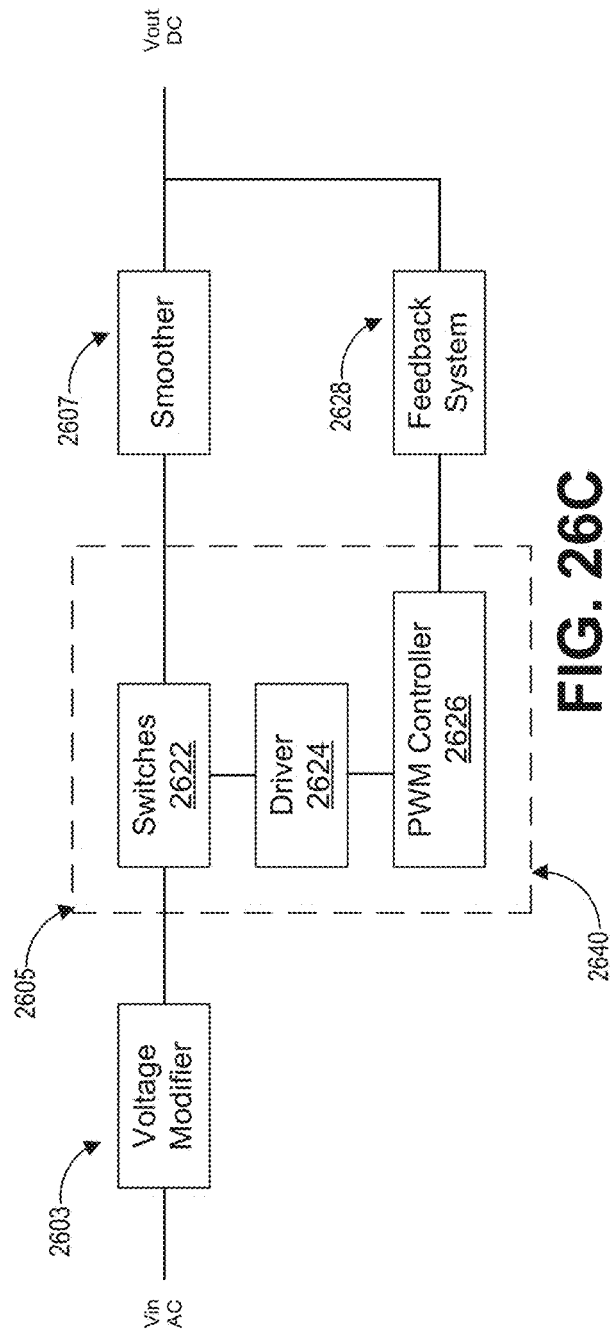
FIG. 26C shows an example AC to DC converter.

FIG. 26C shows an example embodiment of an AC-DC converter. The optional voltage modifier 2603 can include a transformer (e.g., having two inductors), as discussed herein. In some embodiments, the rectifier circuit 2605 can include one or more switches 2622, which can be driven to allow and block current to rectify the AC signal (e.g., to produce a pulsed DC signal). The switches 2622 can be MOSFET switches. The switches 2622 can be eGaN switches. The switches 2622 can be synchronized with the AC signal. In some embodiments, a PWM controller 2626 and/or a driver 2624 can be used to drive the switches 2622. A feedback system 2628 can be used, similar to the other embodiments disclosed herein. In some embodiments, a combination of diodes and switches can be used for the rectifier circuitry in the AC-DC converter. The smoothing circuit 2607 can be configured to smoother the voltage, as discussed herein and can include a capacitor and/or and inductor.

In some embodiments, the rectifier circuitry 2605 can be embedded in a PCB, as described herein. The rectifier circuitry 2605 can be in one or more integrated circuits (ICs). For example, chip embedded circuitry 2640 (e.g., one or more ICs) can include any combination of the PWM controller 2626, the driver 2624, and the one or more switches 2622. In some embodiments, some or all of the feedback system 2628 can be part of the embedded circuitry 2640 (e.g., on the one or more ICs). In some embodiments, the PWM controller 2626 can be omitted. In some cases, an external PWM controller can be used for multiple AC-DC converters, similar to the discussion herein. The embedded circuitry 2640 can include one or more diodes, which can be configured to rectify the AC signal into a pulsed DC signal. One or more inductors and/or capacitors (e.g., forming part of the transformer 2603 and/or the smoothing circuitry) can be disposed outside the PCB, and can be electrically coupled to the embedded circuitry by one or more vias. The one or more inductors and/or capacitors can overlap at least partially or completely a footprint of the embedded circuitry. For example, an AC-DC converter can be similar to FIG. 3, wherein component 315 is embedded circuitry (e.g., an IC) 2640.

The power converters disclosed herein, including DC to AC converters, AC to DC converters, AC to AC converters, and the examples in FIG. 26A, FIG. 26B, and FIG. 26C can be chip embedded, in whole or in part, based on the principles and disclosures provided with reference to DC-DC converters.

Additional Embodiments

To aid in understating, some embodiments are described with reference to example values, such as voltage values, sizes, frequencies, currents, positions, etc. However, the disclosure is not intended to be limited to the values disclosed herein. For example, the voltages ranges associated with DC-DC converters can include any voltage range. Various embodiments can use any range of input voltages and any range of output voltages, including converting between positive and negative voltages, such as a +12V to −5V DC-DC converter. Various embodiments can similarly use any current value, including very high current values exceeding 200 amps. Various embodiments can have arrangements of components that are in different positions and/or orientations. For example, any of the integrated circuits disclosed herein can be face up or face down. Although some examples disclose certain communication systems such as I2C and/or PMBUS, communication systems or other protocols and/or physical layer designs can be used. Other embodiments can use, for example, Serial Bus ID (SVID), Adaptive Voltage Scaling Bus (AVSbus), and the like. The controllers disclosed herein can be implemented in a variety of ways, such as with digital implementations, analog implementations, and hybrid implementations. Some DC-DC converter packages or PCBs can include a capacitor and/or capacitor thereto. Some DC-DC converter packages or PCBs can be without a capacitor and/or capacitor coupled thereto; the inductor and/or capacitor can be later added to the package or PCB. Some embodiments can be AC coupled. The pair 1215 of inductors 1211, 1215 in FIGS. 13A and 13B can be inductors that share a single core. Although some example systems were described with respect to example feedback control schemes, the power converters disclosed herein can use any feedback control scheme. The power converters can use current mode control schemes based on average current, peak mode, valley mode, emulated current, etc.; voltage mode control schemes based on leading/rising edge, driving edge, dual edge, etc; constant on time; constant off time; etc. Feedback systems can include hysteresis.

The power converters can be used to power various devices, such as IoT devices discussed with respect to FIG. 22. The CPU 2205 shown in FIG. 22, and any other controllers, processors, etc. discussed herein, can be a hardware processor, or multiple hardware processors, which can be coupled with buses for processing information. The CPU, processor, controller, etc. can be, for example, one or more general purpose microprocessors.

The CPU, processor, controller, etc. can be coupled to main memory, such as a random access memory (RAM) 2207, cache and/or other dynamic storage devices, coupled to buses for storing information and instructions to be executed by processor 2205. RAM also can be used for storing temporary variables or other intermediate information during execution of instructions to be executed by the CPU 2205. Such instructions, when stored in storage media accessible to processor 2205, render a computer system into a special-purpose machine that is customized to perform the operations specified in the instructions. Any suitable type of computer-readable memory can be used.

The electrical system 2201, or others disclosed herein, can include devices 2211 such as a display (e.g., a cathode ray tube (CRT) or LCD display or touch screen) for displaying information to a user. Other examples of devices 2211 include input devices, including alphanumeric and other keys, for communicating information and command selections to processor 2205. Another type of device 2211 is a cursor control device, such as a mouse, a trackball, or cursor direction keys for communicating direction information and command selections to processor 2205 and for controlling cursor movement on a display. This input device typically has two degrees of freedom in two axes, a first axis (for example, x) and a second axis (for example, y), that allows the device to specify positions in a plane. In some embodiments, the same direction information and command selections as cursor control can be implemented via receiving touches on a touch screen without a cursor.

The electrical system 2201, or others disclosed herein, can include a user interface module to implement a GUI that can be stored in a mass storage device as executable software codes that are executed by the computing device(s). This and other modules can include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, Lua, C or C++. A software module can be compiled and linked into an executable program, installed in a dynamic link library, or can be written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other tangible medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

The electrical system 2201, or other systems described herein, can implement the techniques described herein using customized hard-wired logic, one or more ASICs or FPGAs, firmware and/or program logic which in combination with the computer system causes or programs (e.g., of electrical system 2201) to be a special-purpose machine. According to one embodiment, the techniques herein are performed by electrical system 2201 in response to processor(s) 2205 executing one or more sequences of one or more instructions included in main memory 2207. Such instructions can be read into main memory 2207 from another storage medium, such as storage device. Execution of the sequences of instructions included in main memory 2207 causes processor(s) 2205 to perform the process operations or implement the features described herein. In alternative embodiments, hard-wired circuitry can be used in place of or in combination with software instructions.

Non-transitory computer readable media can be used. Any media that store data and/or instructions that cause a machine to operate in a specific fashion can be used. Such non-transitory media can comprise non-volatile media and/or volatile media. Volatile media includes dynamic memory, such as main memory 2207. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media can be distinct from but can be used in conjunction with transmission media. Transmission media can participate in transferring information between non-transitory media. For example, transmission media can include coaxial cables, copper wire and fiber optics, including the wires that comprise buses. Transmission media can also take the form of acoustic or light waves, such as those generated during radio-wave and infra-red data communications.

The wireless communication system 2103 can provide a two-way data communication coupling to a network 2213. For example, wireless communication system 2103 can send and receive electrical, electromagnetic or optical signals that carry digital data streams representing various types of information. Alternatively, in some cases a wireless communication system 2103 can provide one-way communication (e.g., receiving or transmitting information).

Network 2213 typically provides data communication through one or more networks to other data devices. For example, network 2213 can provide a connection through local network to a host computer or to data equipment operated by an Internet Service Provider. The ISP in turn provides data communication services through the world wide packet data communication network now commonly referred to as the "Internet".

What is claimed is:

1. A power converter comprising:
a printed circuit board (PCB) comprising:
   a bottom side; and
   a top side;
embedded circuitry that is chip-embedded into the PCB between the top side of the PCB and the bottom side of the PCB, the embedded circuitry comprising:
   a driver configured to generate one or more driver signals; and
   one or more switches configured to be driven by the one or more driver signals;
one or more vias extending through the top side of the PCB;
a first inductor positioned over the top side of the PCB, wherein the one or more vias are electrically coupled to the first inductor and to the embedded circuitry, and a footprint of the first inductor at least partially overlaps a footprint of the embedded circuitry;
a second inductor; and
a third inductor;
wherein the first inductor, the second inductor, and the third inductor are arranged in parallel and are driven out of phase from each other.

2. The power converter of claim 1, wherein the power converter is configured with an isolated topology configured to isolate a direct electrical connection between an input and an output of the power converter.

3. The power converter of claim 2, wherein the isolation topology includes at least one of: a flyback topology, forward converter topology, two transistor forward, LLC resonant converter, push-pull topology, full bridge, hybrid, PWM-resonant converter, and half bridge topology.

4. The power converter of claim 2, comprising a transformer that includes a first transformer inductor and a second transformer inductor configured such that a first changing current through the first transformer inductor induces a second changing current in the second transformer inductor.

5. The power converter of claim 1, further comprising a wireless communication system in a same package as the embedded circuitry.

6. The power converter of claim 5, wherein an output of the power converter is configured to be adjusted in response to a wireless signal received by the wireless communication system.

7. The power converter of claim 5, wherein the embedded circuitry comprises the wireless communication system.

8. The power converter of claim 1, further comprising a communication interface configured to receive a control signal for adjusting an output of the power converter.

9. The power converter of claim 8, wherein the communication interface includes a Power Management Bus (PM-BUS).

10. The power converter of claim 8, wherein the communication interface is configured to implement an inter-integrated circuit ($I^2C$) protocol.

11. The power converter of claim 1, wherein the embedded circuitry comprises a pulse width modulator (PWM) controller configured to generate one or more PWM signals, wherein the PWM controller is coupled to the driver, and wherein the driver is configured to generate the one or more driver signals based at least in part on the PWM signals.

12. A power supply system comprising:
the power converter of claim 1; and
an additional power converter coupled in parallel with the power converter.

13. The power supply system of claim 12, further comprising a control system configured to adjust an output of the power converter and an output of the additional power converter for current balancing.

14. The power converter of claim 1, wherein the first inductor has a current rating and the first inductor has a saturation rating, and wherein the saturation rating is no more than 50% higher than the current rating.

15. The power converter of claim 1, wherein the first inductor has a current rating and the first inductor has a saturation rating, and wherein the saturation rating is no more than 20% higher than the current rating.

16. The power converter of claim 15, further comprising an overcurrent protection circuit configured to prevent a current through the first inductor from exceeding the saturation rating.

17. The power converter of claim 1, further comprising an overcurrent protection circuit configured to cause at least one of the one or more switches to open in response to detecting an overcurrent condition.

18. The power converter of claim 1, wherein the power converter is a direct current to direct current (DC-DC) power converter.

19. The power converter of claim 1, wherein the power converter is an alternating current to direct current (AC-DC) power converter.

20. The power converter of claim 1, further comprising a fourth inductor that is arranged in parallel with the first inductor, the second inductor, and the third inductor.

21. The power converter of claim 1, further comprising:
a capacitor;
wherein the one or more switches in the embedded circuitry comprises:
   a first switch coupled through the capacitor to the first inductor by way of the capacitor; and
   a second switch coupled to the first inductor; and
wherein the capacitor is coupled in series between the first switch and the second switch as an AC coupling capacitor.

22. An alternating current to direct current (AC-DC) power converter comprising:
a printed circuit board (PCB) comprising:
   a lower printed circuit board (PCB) part having a bottom side and a top side; and
   an upper printed circuit board (PCB) part having a bottom side and a top side;
an input port configured to receive an input voltage;
an output port configured to provide an output voltage that is different than the input voltage;
a transformer that includes a first inductor and a second inductor configured such that a first changing current through the first inductor induces a second changing current in the second inductor;
embedded circuitry that is chip-embedded into one or more layers of the PCB between the top side of the lower PCB part and the bottom side of the upper PCB part, the embedded circuitry coupled to the input port and configured to change the input voltage, wherein the embedded circuitry comprises rectifier circuitry configured to change an alternating current (AC) input voltage into a pulsed DC voltage;
one or more vias extending through the upper PCB part; and
an inductor or capacitor positioned over the top side of the upper PCB part, wherein the one or more vias are electrically coupled to the inductor or capacitor and to the embedded circuitry, and wherein a footprint of the inductor or capacitor at least partially overlaps a footprint of the embedded circuitry.

23. The power converter of claim 22, wherein the inductor is positioned over the top side of the upper PCB part, wherein the one or more vias are electrically coupled to the inductor and to the embedded circuitry, wherein a footprint of the inductor at least partially overlaps a footprint of the embedded circuitry, and wherein the embedded circuitry comprises:

a driver configured to generate one or more driver signals; and one or more switches configured to be driven by the one or more driver signals.

24. The power converter of claim 22, further comprising smoothing circuitry configured to smooth the pulsed DC voltage to a more stable DC voltage, wherein the smoothing circuitry comprises the inductor or capacitor positioned over the top side of the upper PCB part.

25. The power converter of claim 22, wherein the rectifier circuitry comprises one or more switches.

26. The power converter of claim 22, wherein the rectifier circuitry comprises a diode bridge.

27. A power converter comprising:
an input port configured to receive an input voltage;
an output port configured to provide an output voltage that is different from the input voltage;
a printed circuit board (PCB);
an integrated circuit that is chip-embedded inside of the PCB, the integrated circuit including:
  a first plurality of switches that are configured to generate a first signal;
  a second plurality of switches that are configured to generate a second signal;
  a third plurality of switches that are configured to generate a third signal;
a driver configured to drive the first plurality of switches, the second plurality of switches, and the third plurality of switches such that the first signal, the second signal, and the third signal are out of phase from each other;
a first inductor that is positioned inside of the PCB, coupled to the output port, and configured to receive the first signal from the first plurality of switches;
a second inductor coupled to the output port and configured to receive the second signal from the second plurality of switches; and
a third inductor coupled to the output port and configured to receive the third signal from the third plurality of switches.

* * * * *